(12) United States Patent
Yokogawa et al.

(10) Patent No.: US 6,903,383 B2
(45) Date of Patent: Jun. 7, 2005

(54) SEMICONDUCTOR DEVICE HAVING A HIGH BREAKDOWN VOLTAGE FOR USE IN COMMUNICATION SYSTEMS

(75) Inventors: Toshiya Yokogawa, Nara (JP); Asamira Suzuki, Moriguchi (JP); Masahiro Deguchi, Hirakata (JP); Shigeo Yoshii, Hirakata (JP); Hiroyuki Furuya, Kadoma (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/343,097

(22) PCT Filed: Nov. 21, 2001

(86) PCT No.: PCT/JP01/10192
§ 371 (c)(1),
(2), (4) Date: Jan. 29, 2003

(87) PCT Pub. No.: WO02/43156
PCT Pub. Date: May 30, 2002

(65) Prior Publication Data
US 2003/0141518 A1 Jul. 31, 2003

(51) Int. Cl.$^7$ ............... H01L 31/0328; H01L 31/0336; H01L 31/072; H01L 31/109
(52) U.S. Cl. ....................... 257/192; 257/194
(58) Field of Search ............... 257/192, 194, 257/20, 24

(56) References Cited

U.S. PATENT DOCUMENTS

| | | |
|---|---|---|
| 4,780,748 A | 10/1988 | Cunningham et al. |
| 4,882,609 A | 11/1989 | Schubert et al. |
| 5,488,237 A | 1/1996 | Kuwata |

FOREIGN PATENT DOCUMENTS

| | | |
|---|---|---|
| EP | 0 555 886 A2 | 8/1993 |
| EP | 0 780 906 A2 | 6/1997 |
| EP | 0841704 A | 5/1998 |
| JP | 61-174775 | 8/1986 |
| JP | 62-035678 | 2/1987 |
| JP | 63-1046 | 1/1988 |
| JP | 5-13446 | 1/1993 |
| JP | 5-226374 | 9/1993 |
| JP | 2000-6210 | 1/2000 |
| JP | 2000-58964 | 2/2000 |
| JP | 2000-269481 | 9/2000 |
| WO | WO00/59162 | 5/2000 |

OTHER PUBLICATIONS

Xu D. et al., "Design and Fabrication of Double Modulation Doped Inalas/Ingaas/Inas Heterojunction FET's for High–Speed and Millimeter–Wave Applications", IEEE Transations on Electron Devices, IEEE Inc. New York, US, vol. 45, No. 1, 1998, pp. 21–30, XP000787870.

(Continued)

Primary Examiner—Mary Wilczewski
Assistant Examiner—Monica Lewis

(57) ABSTRACT

A HEMT has an InAlAs layer (202), an InGaAs layer (203), a multiple δ-doped InAlAs layer (204) composed of n-type doped layers (204*a*) and undoped layers (204*b*) which are alternately stacked, an InP layer (205), a Schottky gate electrode (210), a source electrode (209*a*), and a drain electrode (209*b*) on an InP substrate (201). When a current flows in a region (channel region) of the InGaAs layer (203) adjacent the interface between the InGaAs layer (203) and the multiple δ-doped InAlAs layer (204), a breakdown voltage in the OFF state can be increased, while resistance to the movement of carriers passing through the multiple δ-doped InAlAs layer (204) as a carrier supplying layer is reduced.

15 Claims, 28 Drawing Sheets

OTHER PUBLICATIONS

Shieh H.M. et al., "Improved GAAS/IN0.25GA0.75AS/ GAAS Pseudomorphic Heterostructure by Growing Double &–Doping GAAS Layers on both Sides of the Channel", Solid State Electronics, Elsevier Science Publishers, Barking, GB, vol. 36, No. 9, Sep. 1, 1993, pp. 1235–1237, XP000384258.

Ming–Jer Kao et al., "Improved Selectively–Doped GAAS/ INGAAS Double–Quantum–Well Pseudomorphic HFET'S Utilizing a Buried P–Layer on the Buffer", Japanese Journal of Applied Physics, Tokyo, JP, vol. 32, No. 10B, Oct. 15, 1993, pp. L1503–1505, XP000483951.

Walker, John L. B., ed. "High–Power GaAs FET Amplifiers" (1993).

Daisuke Ueda et al., "Radio–Frequency and Optical Semiconductor Devices Exploring New Age of Data Communication", IEICE, p. 124, Dec. 1, 1999.

F. Berizzi, et al., "HOS Based Algorithm for Autofocusing of Spotlight SAR Images", Electronics Letters, vol. 33, No. 7, Mar. 27, 1997.

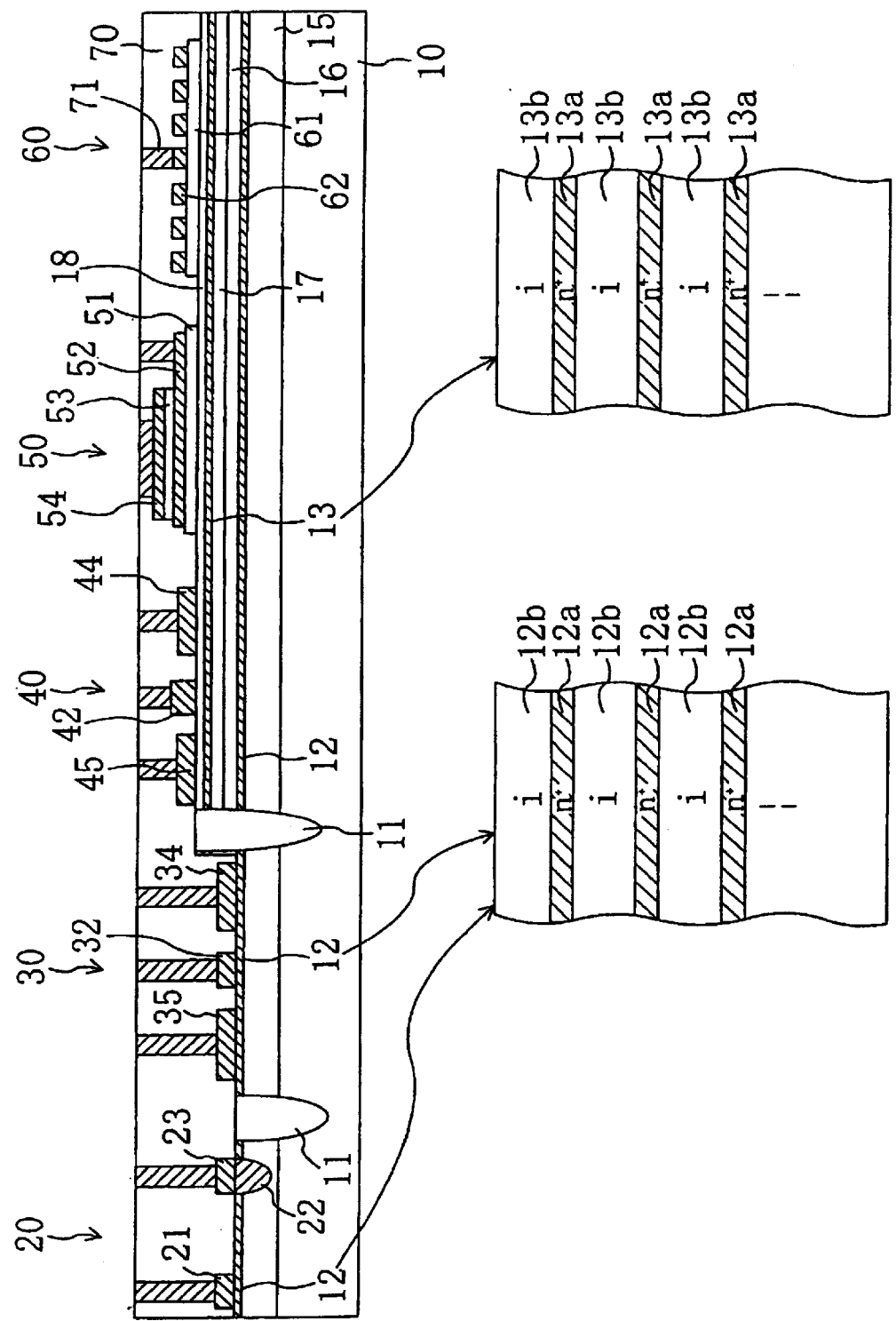

FIG. 12A1    FIG. 12A2    FIG. 12A3
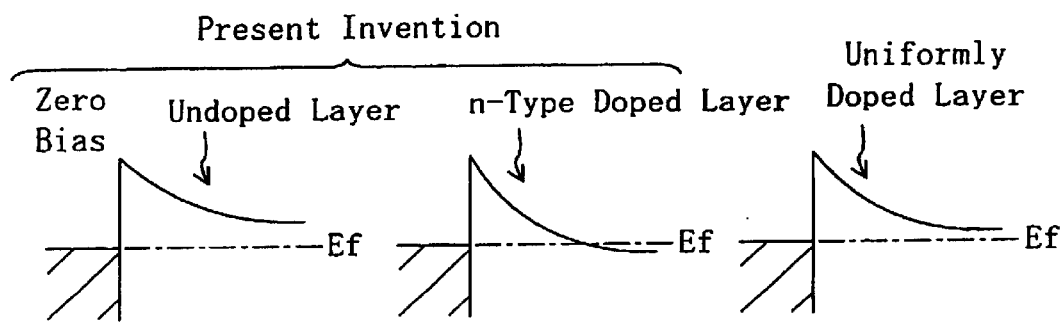
FIG. 12B1    FIG. 12B2    FIG. 12B3
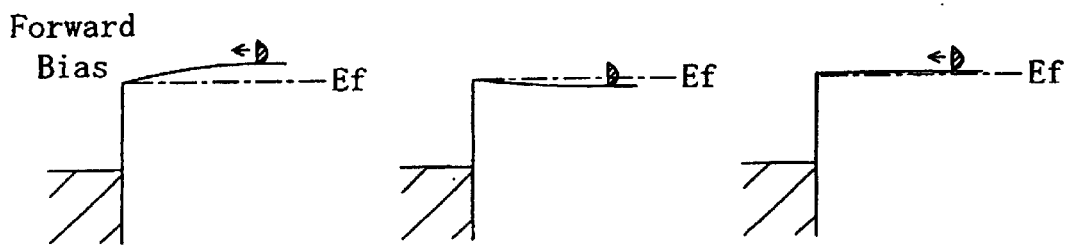
FIG. 12C1    FIG. 12C2    FIG. 12C3
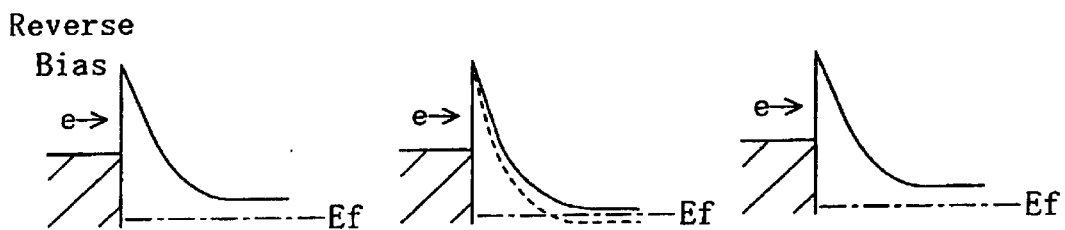

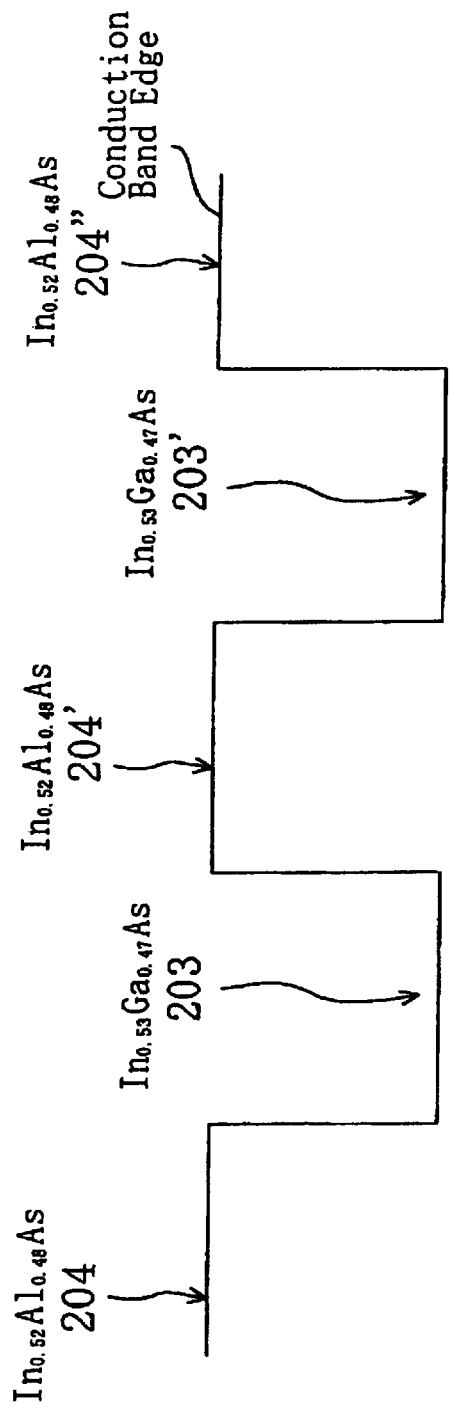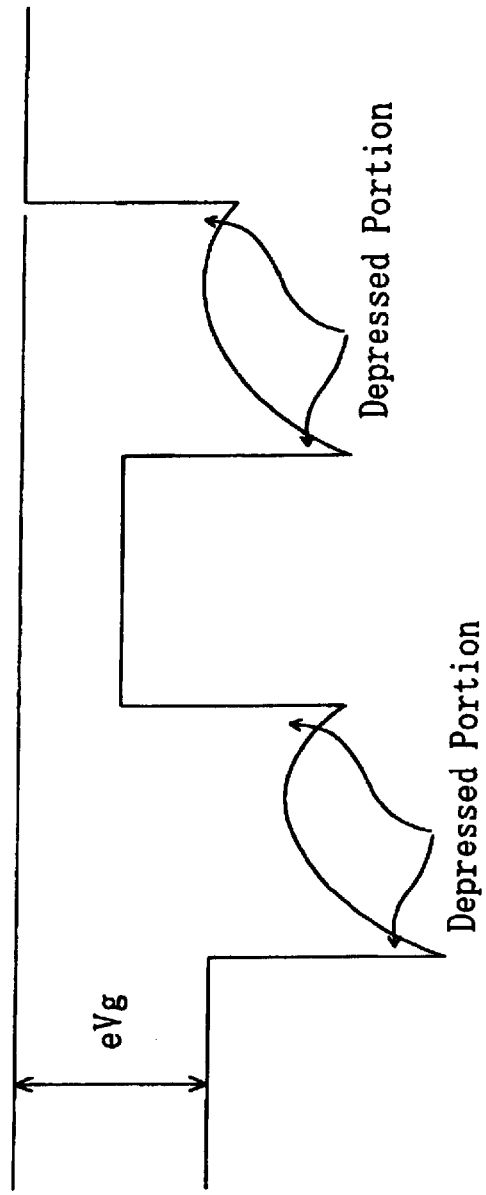
FIG. 20A
FIG. 20B

PRIOR ART

SEMICONDUCTOR DEVICE HAVING A HIGH BREAKDOWN VOLTAGE FOR USE IN COMMUNICATION SYSTEMS

TECHNICAL FIELD

The present invention relates to a semiconductor device functioning as a semiconductor power device having a high breakdown voltage to be used to handle an RF signal and to equipment for a communication system using the semiconductor device.

BACKGROUND ART

In recent years, new semiconductor materials (including so-called semi-insulating materials) for implementing semiconductor devices which have special functions and are particularly excellent in specific characteristics such as an RF characteristic, a light-emitting characteristic, and a breakdown voltage characteristic have been under vigorous development. Of the semiconductor materials, e.g., a semiconductor containing an indium phosphide (InP) as a main component thereof is expected to be applied to a next-generation RF device, high-temperature operating device, and the like because the electron mobility and the saturation velocity of electrons are higher than those of silicon (Si) which is a typical semiconductor material.

In general, a power device is a generic name for a device which converts or controls high power and is termed a power diode, a power transistor, or the like. Exemplary applications of the power device include a terminal in a communication system and a transistor disposed at a base station. Examples of the transistor include a HEMT (High Electron Mobility Transistor) and a bipolar transistor. The applications of the power device is expected to be widened in the future.

A typical modular structure used for such applications is obtained by connecting a plurality of semiconductor chips each having a power device embedded therein with wires in accordance with a use or an object and placing the connected semiconductor chips in a single package. For example, a desired circuit is constructed with semiconductor chips and wires by forming the wires on a substrate such that a circuit suitable for the use is constructed and mounting the individual semiconductor chips on the substrate. A description will be given herein below to a transmitting/receiving circuit at a radio base station which uses a Schottky diode and a MESFET.

FIG. 27 is a block circuit diagram showing an internal structure of a conventional base station (base station in a mobile communication system) disclosed in a document (Daisuke Ueda et al., "Radio-Frequency and Optical Semiconductor Devices Exploring New Age of Data Communication, IEICE, Dec. 1, 1999, p.124). As shown in the drawing, the circuit comprises an antenna main body, a switch, a received-signal amplifier, an amplified-signal transmitter, a radio transmitter/receiver, a baseband signal processor, an interface unit, an exchange controller, a controller, and a power supply portion. The received-signal amplifier is composed of two filters and two low-noise amplifiers (LNA) disposed in series. A mixer for mixing an output from a local amplifier with an output from an RF emitter to generate an RF signal is disposed at the radio transmitter/receiver. A power dividing/synthesizing circuit having a driver amplifier, a filter, a middle amplifier, and a main amplifier disposed therein is disposed at the amplified-signal transmitter. There are further provided a baseband signal processor for processing an audio signal, an interface unit, and an exchange controller connected to a network.

At the conventional base station, the main amplifier is so configured as to perform impedance matching by disposing an input matching circuit and a field-effect transistor (MESFET or HEMT) formed by using a GaAs substrate, while disposing a capacitor, an inductor, and a resistor element on each of the input side and output side.

A MOSFET formed on a silicon substrate, a diode, a capacitor, a resistor element, and the like are disposed in the controller, the baseband signal processor, the interface unit, and the exchange controller. Such parts as a capacitor and an inductor which occupy a particularly large area are formed as independent chips.

FIG. 28 schematically shows a structure of a conventional HEMT using an indium phosphide (InP) substrate. As shown in the drawing, an undoped InAlAs layer 502 with a thickness of about 200 nm, an undoped InGaAs layer 503 with a thickness of about 15 nm, an n-InAlAs layer 504 doped with silicon (Si) to serve as a carrier supplying layer with a thickness of about 10 nm, an InP layer 505 serving as an etching stopping layer with a thickness of about 5 nm, an n-InAlAs layer 506 doped with silicon (Si) and having a thickness of about 3 nm, an n$^+$-InAlAs layer 507 doped with silicon (Si) as an n-type impurity at a high concentration and having a thickness of about 200 nm, and an n$^+$-InGaAs layer 508 doped with silicon (Si) as an n-type impurity at a high concentration and having a thickness of about 15 nm are stacked successively on a semi-insulating InP substrate 501 doped with iron (Fe) at a high concentration and having a thickness of about 100 $\mu$m. There are further provided ohmic source/drain electrodes 509a and 509b each composed of a TiAu film and provided in mutually spaced relation on the n$^+$-InGaAs layer 508, a Schottky gate electrode 510 composed of WSi and penetrating respective parts of the n-InAlAs layer 506, the n$^+$-InAlAs layer 507, and the n$^+$-InGaAs layer 508 to be in contact with the InP layer 505, and an insulating layer 511 composed of a SiO$_2$/SiN$_x$ film for providing a dielectric isolation between the Schottky electrode 510 and the ohmic source/drain electrodes 509a and 509b.

In the transistor, if a voltage is applied between the source and drain electrodes 509a and 509b, a current flows between the source and the drain. If a voltage is applied between the Schottky gate electrode 510 and the ohmic source electrode such that the Schottky gate electrode 510 has a higher voltage (reverse voltage), the source/drain current is modulated in accordance with the voltage applied to the Schottky gate electrode 510 so that a switching operation is performed.

Subject Matters to be Solved

However, the conventional semiconductor device and the equipment for a communication system using the conventional semiconductor device have the following problems.

The breakdown voltage of the conventional transistor when pinch-off occurred between the source and the drain is greatly dependent on a doping concentration in the n-InAlAs layer 50 functioning as the carrier supplying layer. To increase the breakdown voltage in the pinch-off state, the doping concentration in the n-InAlAs layer 504 should be reduced to a low value. When the doping concentration is reduced, however, the resistance of the n-InAlAs layer 504 increases so that the ON-state resistance when the transistor is turned ON is increased. As a result, power consumption is increased. Due to such a trade-off, it has been difficult to implement a transistor which is high in breakdown voltage and low in resistance. Such a problem is also encountered if the transistor is a bipolar transistor.

At the conventional base station, signal amplifying elements which are the most important parts of the transmitting/receiving circuit are generally formed by using the GaAs substrate. However, the power is low because of the trade-off between a high breakdown voltage and a low resistance that has not been overcome so that a large number of elements are required and it is difficult to scale down the device. To maintain the base station, therefore, a cooling device having a high cooling ability and high running cost are necessary. In the case of applying the transmitting/receiving circuit to a terminal, there is a limit to the scaling down of the circuit.

In addition, power amplifiers which are the most important parts of the transmitting/receiving circuit and the like are provided by disposing a large number of signal amplifying elements at a portion at which a particularly high power should be amplified. As the frequency of the RF signal is higher, however, reflected waves from the MESFETs exert multiple effects so that it is difficult to achieve impedance matching. This causes the disadvantage of increased labor required by trimming for impedance adjustment.

DISCLOSURE OF THE INVENTION

It is therefore an object of the present invention to provide a semiconductor device which simultaneously achieves a high breakdown voltage and a low resistance as described above, particularly a semiconductor device excellent in RF characteristic and equipment for a communication system using the semiconductor device.

A semiconductor device according to the present invention comprises: at least one first active region disposed on a substrate and composed of a first semiconductor; and at least one second active region disposed in contact with the first active region and composed of a second semiconductor having a band gap different from a band gap of the first semiconductor such that a band discontinuity occurs between the first and second active regions, the second active region being composed of: at least one first semiconductor layer which allows passage of carriers therethrough; and at least one second semiconductor layer containing an impurity for carriers at a concentration higher than in the first semiconductor layer and smaller in film thickness than the first semiconductor layer such that carriers spread out to the first semiconductor layer under a quantum effect, the first and second semiconductor layers being disposed in contact with each other.

In the arrangement, the carriers in the second semiconductor layer of the second active region spread out extensively to the first semiconductor layer so that the carriers are distributed in the entire second active region. Since the impurity concentration is low in the first semiconductor layer during the operation of the semiconductor device, scattering by impurity ions in the first semiconductor layer is reduced.

If a HEMT is used as the semiconductor device, therefore, a low resistance is achieved in the second active region so that the carriers flow at a high speed. This provides a large current of carriers passing through the first active region. Moreover, the whole second active region is depleted in the OFF state irrespective of the mean impurity concentration in the second active region which is relatively high so that the carriers no more exist in the second active region. Consequently, the breakdown voltage is defined by the first semiconductor layer which is low in impurity concentration so that a high breakdown voltage is obtained in the entire second active region. Since the trade-off between a high breakdown voltage and a low resistance is eased in the second active region, the power represented by the product of the voltage and current of the semiconductor device can be increased by using the effect. Even if the operating voltage is reduced, a sufficient driving power is obtainable so that the semiconductor device is used also as a low-power-consumption device.

The first semiconductor layer includes a plurality of first semiconductor layers and the second semiconductor layer includes a plurality of second semiconductor layers, the first semiconductor layers and the second semiconductor layers being arranged in stacked relation. The arrangement provides a higher breakdown voltage and a lower resistance more positively.

The substrate is composed of InP and each of the first and second active regions is composed of any one material selected from the group consisting of InP, InGaAs, InAlAs, GaN, InGaP, and InGaSb. The arrangement provides a semiconductor device suited for handling an RF signal on the millimeter-wave level.

The first and second semiconductor layers in the second active region are preferably composed of a common material.

The second semiconductor is composed of a material having a band gap larger than a band gap of a material composing the first semiconductor, a portion of the first active region adjacent an interface between the first and second active regions serves as a channel layer, and the second active region functions as a carrier supplying layer, whereby a high-performance HEMT using a heterobarrier formed between the first and second active regions is obtained.

The second active region includes two second active regions provided above and below the first active region. The arrangement provides a double-channel HEMT suitable for a power device.

The first active region includes a plurality of first active regions and the second active region includes a plurality of second active regions, the first active regions and the second active being arranged in stacked relation. The arrangement provides a multi-channel HEMT more suitable for a power device.

Equipment for a communication system according to the present invention is equipment for a communication system handling an RF signal, the equipment being disposed in the communication system and having an active element formed by using a semiconductor, the active element comprising: at least one first active region disposed on a substrate and composed of a first semiconductor; and at least one second active region disposed in contact with the first active region and composed of a second semiconductor having a band gap different from a band gap of the first semiconductor such that a band discontinuity occurs between the first and second active regions, the second active region being composed of: at least one first semiconductor layer which allows passage of carriers therethrough; and at least one second semiconductor layer containing an impurity for carriers at a concentration higher than in the first semiconductor layer and smaller in film thickness than the first semiconductor layer such that carriers spread out to the first semiconductor layer under a quantum effect, the first and second semiconductor layers being disposed in contact to each other.

The arrangement provides the equipment for a communication system smaller in size by using the active element capable of increasing an amount of current by increasing a breakdown voltage and reducing a resistance, while taking advantage of the various characteristics of a heterojunction semiconductor device, and reduces placement cost, running cost, and the like for facilities.

The active element is disposed at a transmitter. The arrangement allows full use of the active element capable of providing a high power as described above at the portion of the communication system which requires the highest power.

The active element may be disposed at a receiver.

The active element is disposed at a mobile data terminal. The arrangement allows full use of the active element small in size and suited for reducing power consumption.

The active element is disposed at a base station. The arrangement allows the active element to be used as an RF device and as a power device.

The equipment for a communication system is a transmitting/receiving module constructed attachably to and removably from an object under control. The arrangement allows control of the object by using new software without changing the content of the object under control.

BRIEF DESCRIPTION OF THE DRAWINGS

FIG. 7 is a cross-sectional view of a semiconductor device obtained by integrating a Schottky diode, a HEMT, a MESFET, a capacitor, and an inductor in an InP substrate in the embodiment;

FIG. 12A1 to FIG. 12C3 are energy band diagrams each showing changes in the configuration of a conduction band edge caused by changes in bias in the Schottky diode according to the present embodiment and in a conventional Schottky diode;

FIG. 20A and FIG. 20B are energy band diagrams schematically showing the respective states of a band during no application of a bias to a heterojunction portion in the HEMT of the second example and during the application thereof;

BEST MODES FOR CARRYING OUT THE INVENTION

Basic Structure of Communication System

Figure 1:
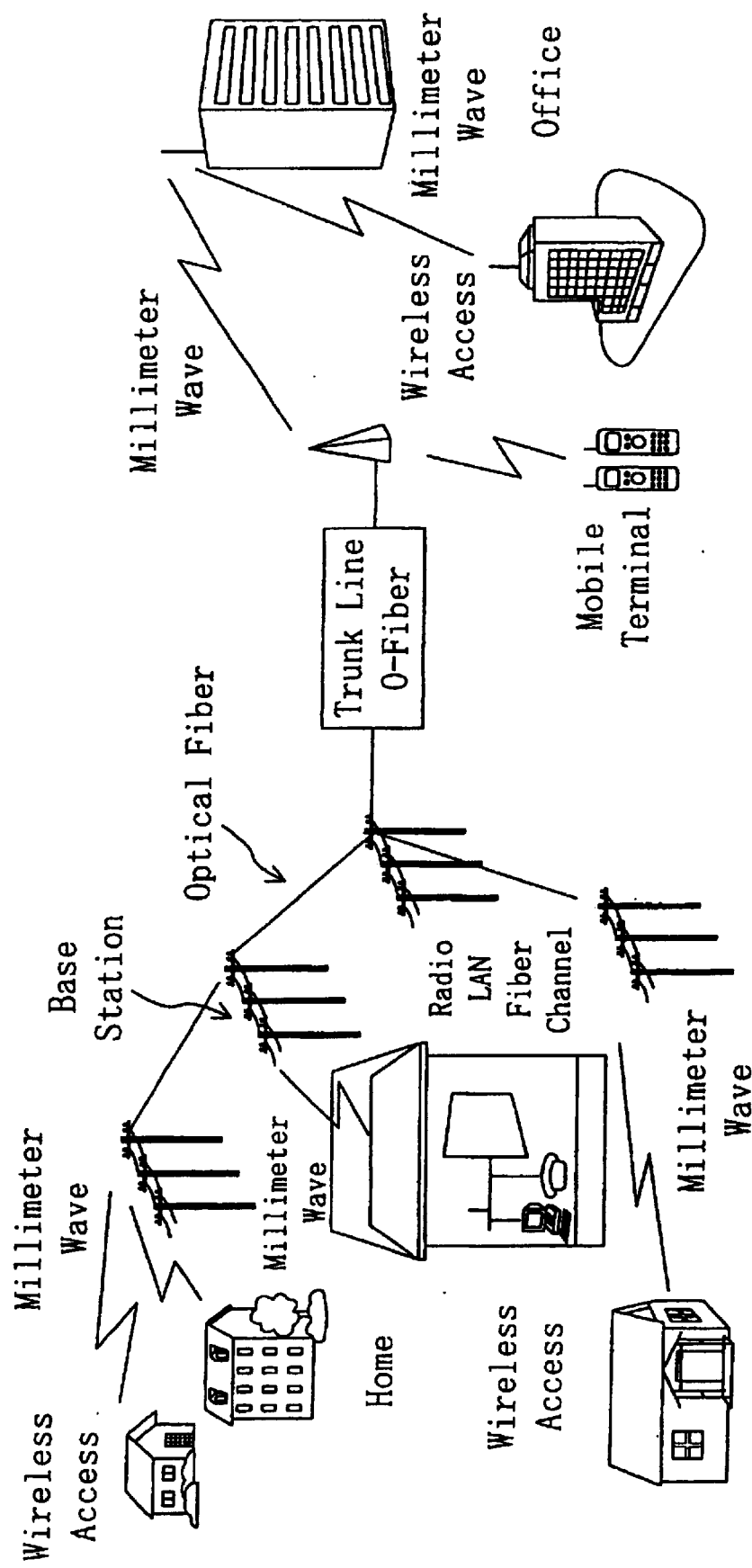
FIG. 1 is a perspective view illustrating an example of the overall concept of a communication system using a millimeter wave according to an embodiment of the present invention.

FIG. 1 is a perspective view showing an example of the overall concept of a communication system (network system) using a millimeter wave according to an embodiment of the present invention. As shown in the drawing, a base station is provided on a tip of each of a large number of optical fibers branched from a trunk optical fiber line (Trunk Line O-Fiber). There is also formed a radio communication network for conducting communication from each of the base stations to each of homes (or offices) by using a millimeter wave. At a radio-wave terminal (mobile station) at each of homes or offices, there can be performed the reception of various media supplied from the base station to equipment at the home or office, Internet communication, communication between mobile stations, and the like. Since a millimeter wave has a wavelength close to that of light, it is susceptible to interference from an object. Accordingly, data is transmitted and received to and from the base station by optical communication via an optical fiber network, a conversion is made between an optical signal and an electric signal at the base station, and a wireless access using the millimeter wave is enabled between each of homes or offices and the base station. At part of the system, a wireless access is enabled via an antenna between the base station connected directly to the trunk optical fiber line and a mobile data terminal or a terminal at an office.

Figure 2:
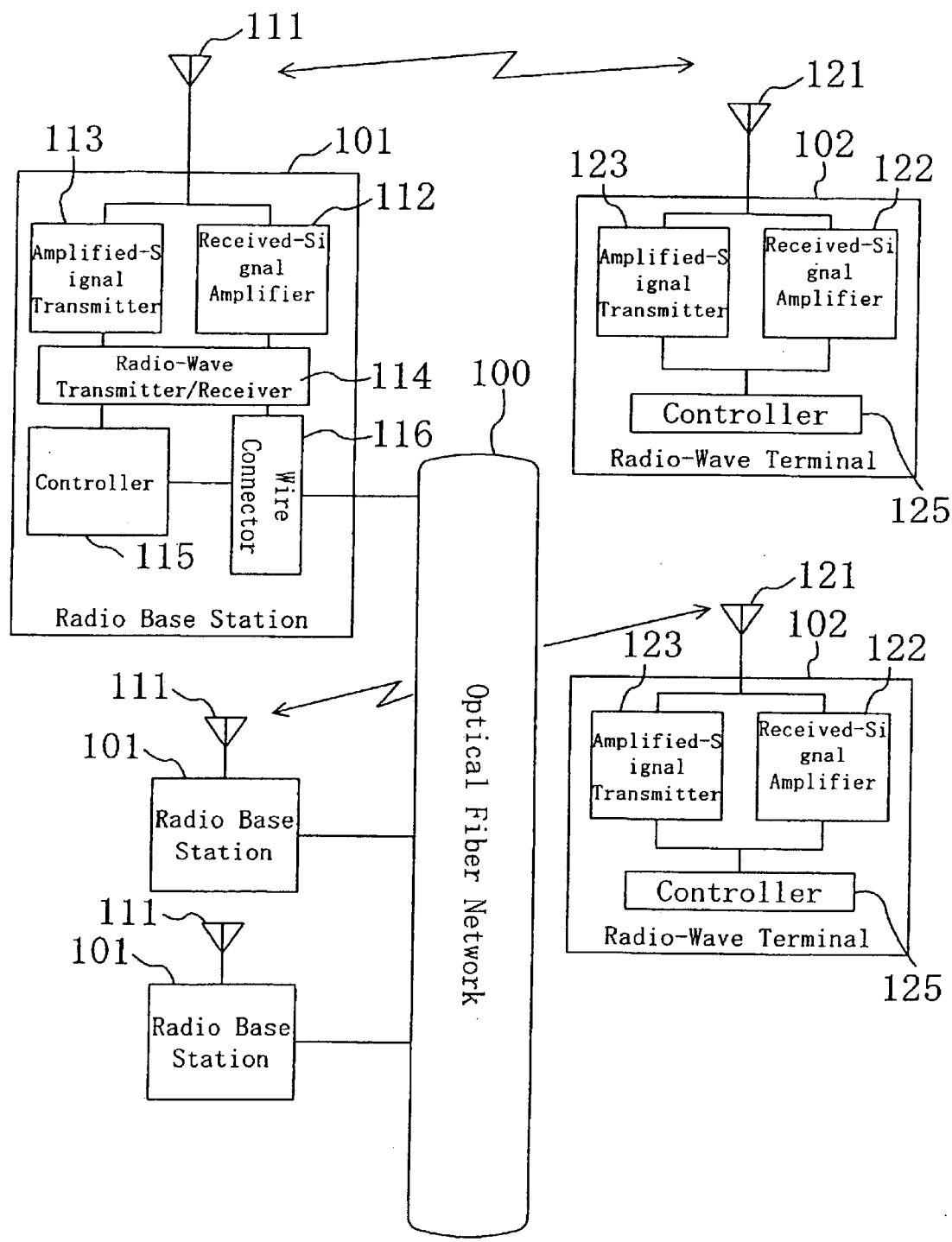
FIG. 2 is a block diagram schematically showing a structure of a communication system in the embodiment.

FIG. 2 is a block diagram schematically showing a structure of the communication system between the base station and the radio-wave terminal at each of homes or offices shown in FIG. 1. As shown in FIG. 2, the communication system of the embodiment comprises: a large number of base stations 101 connected to each other via an optical fiber network 100; and radio-wave terminals 102 for communicating with each other via the individual base stations 101. Each of the base stations 101 comprises: an antenna device 111 for receiving and transmitting a radio wave; a received-signal amplifier 112 having the function of amplifying a radio signal received at the antenna device 111 and the like; an amplified-signal transmitter 113 for sending an amplified RF signal to the antenna device 111; a radio receiver/transmitter 114 connected to the received-signal amplifier 112 and to the amplified-signal transmitter 113; a controller 115 for controlling the operation of each of the devices; and a wire connector 116 for connecting signals between the base station 101 and the optical fiber network 100. Each of the radio-wave terminals 102 comprises: a switch 121 for receiving and transmitting a radio wave; a received-signal amplifier 122 having the function of amplifying a radio signal received at the switch 121 and the like; an amplified-signal transmitter 123 for sending an amplified RF signal to the switch 121; and a controller 125 for controlling the operation of each of the devices.

Figure 3:
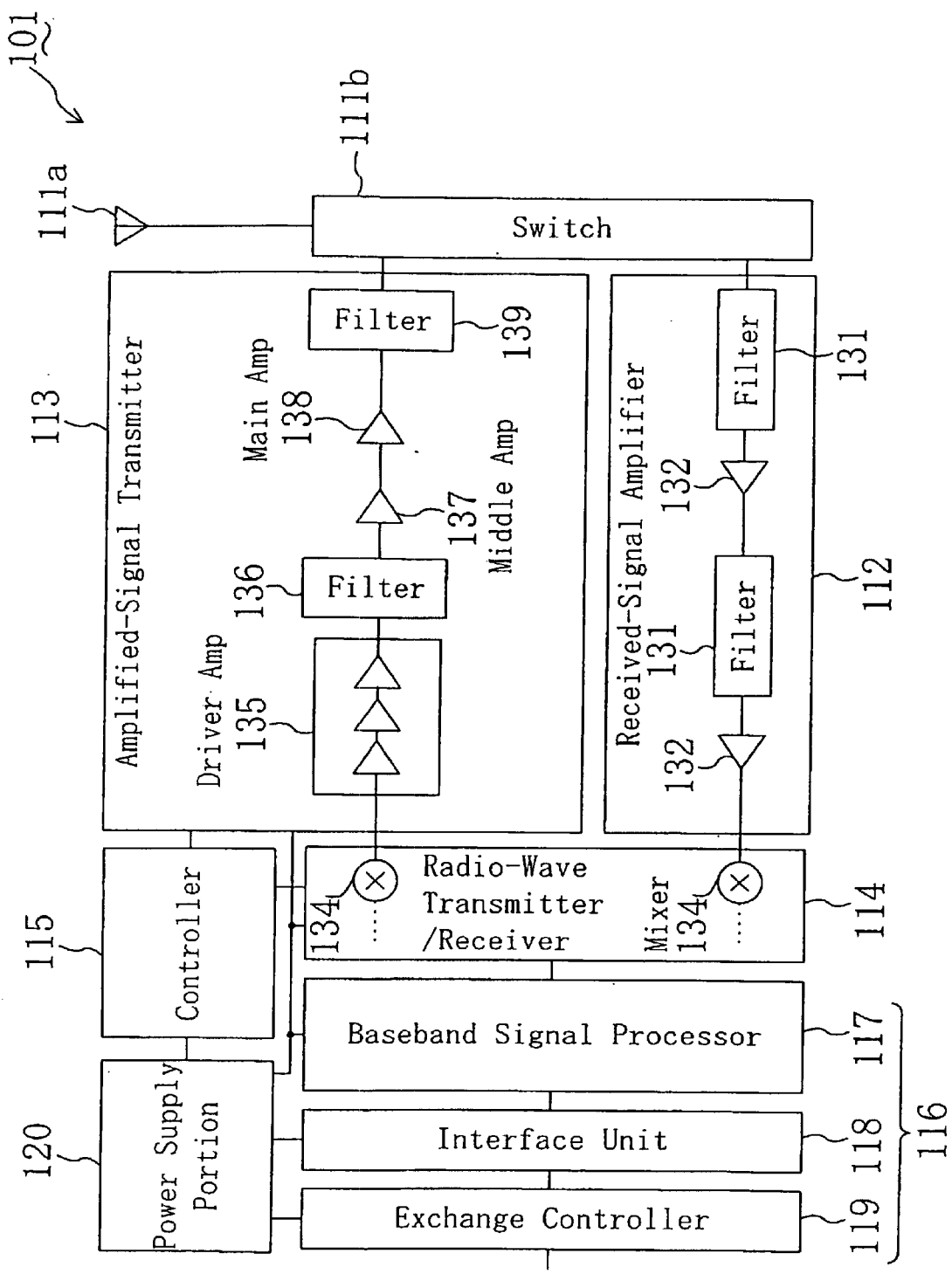
FIG. 3 is a block circuit diagram showing in detail an internal structure of a base station in a communication system in the embodiment.

FIG. 3 is a block circuit diagram showing in detail an internal structure of the base station 101. As shown in the drawing, the antenna device 111 is composed of: an antenna main body 111a; and a switch 111b for switching the antenna main body 111a between transmission and reception. The received-signal amplifier 112 is composed of two filters 131 and two low-noise amplifiers (LNA) 132 disposed in series. A mixer 134 for mixing an output from a local amplifier with an output from an RF transmitter to generate an RF signal is disposed in the radio transmitter/receiver 114. A driver amplifier 135, a filter 136, a middle amplifier 137, and a main amplifier 138 are disposed in the amplified-signal transmitter 113. The wire connector 116 is composed of a baseband signal processor 117 for processing an audio signal, an interface unit 118, and an exchange controller 119 connected to the optical fiber network 100. The interface unit 118 is provided with a signal converter for making a conversion between an optical signal and an electric signal, though it is not depicted.

Figure 4:
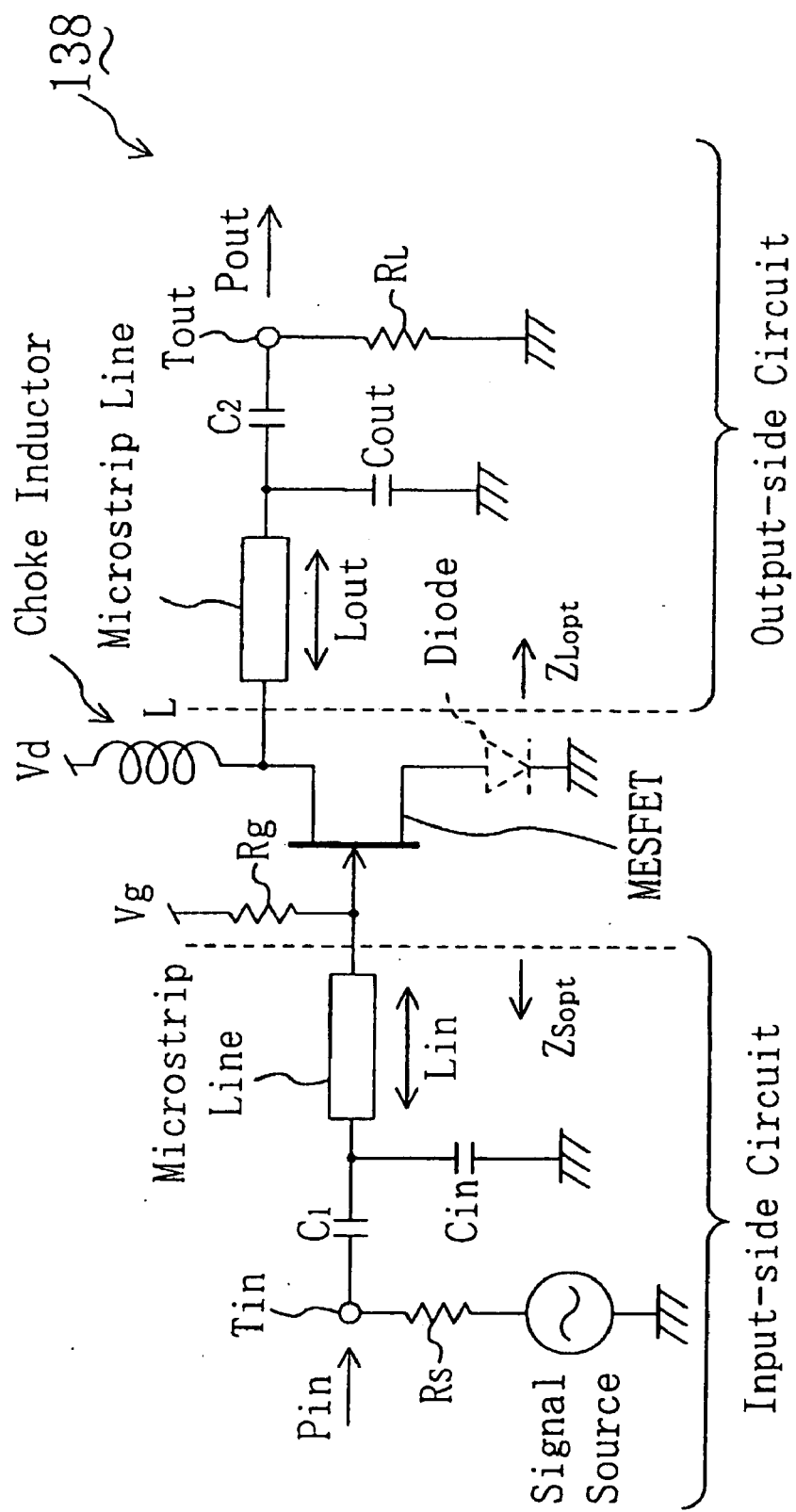
FIG. 4 is an electric circuit diagram showing an exemplary structure of a main amplifier disposed in an amplified-signal transmitter or a received-signal amplifier shown in FIG. 2.

FIG. 4 is an electric circuit diagram showing an exemplary structure of the main amplifier 138 disposed in the amplified-signal transmitter 113 shown in FIG. 3. As shown in FIG. 3, the main amplifier 138 is composed of a HEMT disposed therein and having a gate for receiving an input signal Pin and a drain for outputting an output signal Pout. A gate bias Vg is applied to the gate of the HEMT via a resistor Rg and a power supply voltage Vd is applied to the drain of the HEMT via a choke inductor, while the source of the HEMT is connected to the ground. An input-side circuit is provided with an input terminal Tin for supplying the input signal Pin to the HEMT via an input-side circuit, a signal supply for supplying electric power to the input terminal Tin via a signal supply resistor $R_S$, and capacitors C1 and Cin and a microstrip line each composing an input-side impedance matching circuit. An output-side circuit is provided with an output terminal Tout for sending an output signal to the outside via the output-side circuit, capacitors C2 and Cout and a microstrip line each composing an output-side impedance matching circuit, and a load resistor $R_L$ interposed between the output terminal Tout and the ground. If a bipolar transistor is used in place of the HEMT, a diode indicated by the broken line may be disposed between the emitter of the bipolar transistor and the ground.

A power amplifier used for mobile communication is required of such characteristics as high efficiency and low distortion. In a typical RF power device, the relationship between efficiency and distortion is a trade-off. In the power amplifier it is important to increase efficiency, while achieving low distortion. As shown in the drawing, the capacitance value of the capacitor Cin connected in parallel to the microstrip line and the length Lin of the microstrip line are adjusted in the input-side impedance matching circuit such that a reflection coefficient when the MESFET is viewed from the input terminal Pin is minimized. Each of the capacitors C1 and C2 is for blocking a current, which forms a sufficiently low impedance in an RF region. The resistor Rg for supplying the gate bias has been set to a value higher than a gate input impedance such that RF power does not leak. The inductance of the choke inductor L for supplying a drain bias, the capacitances of the capacitors C1 and C2, and the resistance of the resistor Rg do not affect an impedance in the RF region.

Figure 5:
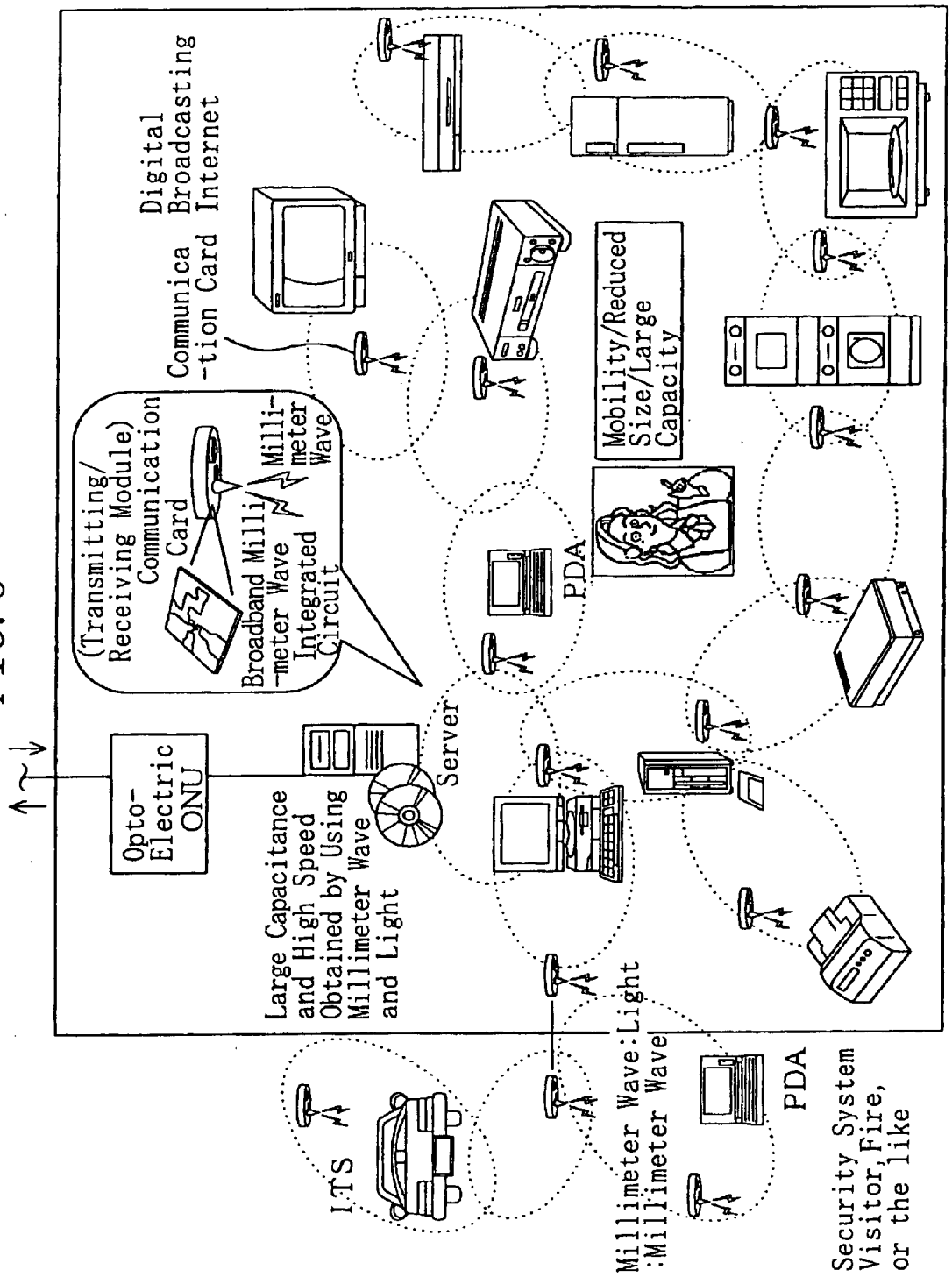
FIG. 5 schematically shows an example of an in-home broadband radio communication system.

FIG. 5 schematically shows an example of an in-home broadband radio communication system. The system comprises: an ONU (Optical Network Unit) in which an optoelectric converter for converting, to an electric signal, an optical signal transmitted from an optical fiber line and converting, to an optical signal, an electric signal transmitted from a home to the optical fiber line, a demultiplexer, and the like are disposed; and a server connected to the ONU. In the in-home broadband communication system, there are provided home electrical appliances such as a personal computer, a printer, an in-home mobile data terminal (PDA), a TV set, a CD player, a refrigerator, an air conditioner, and a microwave oven which are connected to the server by radio communications. A communication card which is a transmitting/receiving module having a broadband millimeter-wave integrated circuit (millimeter-wave LSI), a CPU, and a memory is constructed attachably to and removably from each of the server, the home electrical appliances, and the like. The broadband millimeter-wave integrated circuit (millimeter-wave LSI) has a large number of devices (such as a transistor, a diode, a capacitor, and an inductor) for processing a broadband millimeter-wave signal mounted thereon and an additional antenna for reception and transmission provided therein. Instead of being formed as the communication card, the transmitting/receiving module may also be incorporated previously in each of the appliances. If the communication card is used, it is constructed such that a user selectively controls a home electrical appliance by using the communication card or the like or by using a button, a switch, or the like provided additionally on the home electrical appliance.

Figure 6:
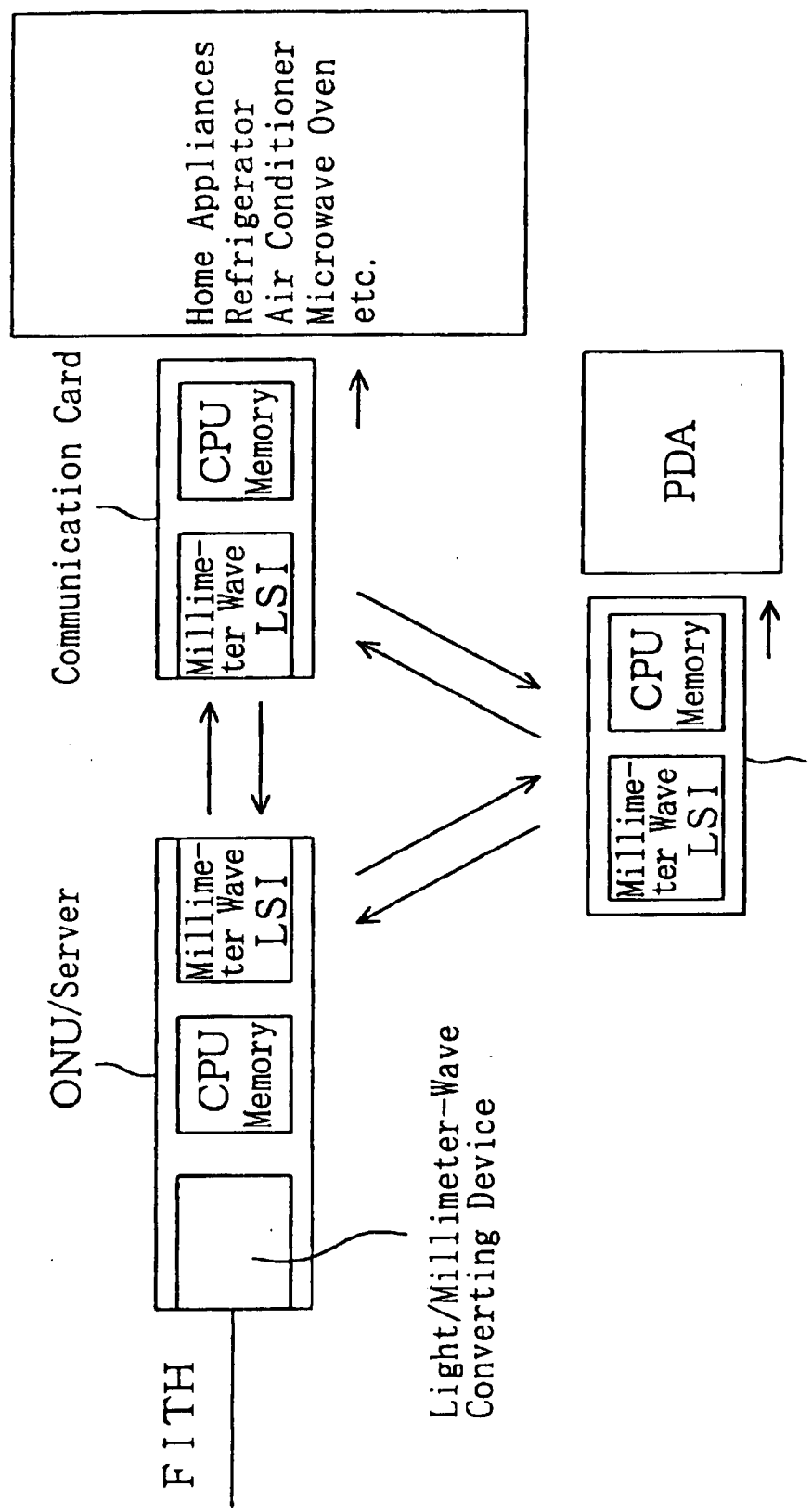
FIG. 6 is a block diagram for illustrating a method for conducting radio communications among an ONU/server, a home electrical appliance, and an in-home mobile data terminal by using communication cards.

FIG. 6 is a block diagram for illustrating a method for conducting radio communications among an ONU/server, a home electrical appliance, and an in-home mobile data terminal by using communication cards. As shown in the drawing, if the communication card is inserted in each of the appliances, the operation of the appliance is brought into a controllable state by a network computer. The control can also be effected by using software from Internet without using a personal computer. If the communication card is replaced with another, the home electrical appliance can also be controlled by using a new application. It is also possible to construct an in-home radio LAN between electric appliances by using software supplied from the network. Since close connection can be provided between the CPU and the memory in the communication card, a load on each of the home electrical appliances can be reduced.

Thus, the communication system allows control of the home electrical appliances and the like by using the communication cards having the characteristics of mobility, reduced size, large capacity, and flexibility. The system is also allowed to function as a home security system indicating a visitor, a fire, and the like or as an ITS (Intelligent Transport System) for a car. In that case, the transmitting/receiving module (communication card) is properly attached to the car or incorporated previously in the control device of the car.

It is to be noted that a circuit having the same function as a received-signal amplifier, an amplified-signal transmitter, and a control unit similar to those of the base station or the mobile data terminal shown in FIG. 2 is also disposed in the communication card (transmitting/receiving module). The specific structures thereof are basically the same as those shown in FIGS. 3 and 4.

The broadband millimeter-wave integrated circuit in the communication card (transmitting/receiving module) disposed in such an in-home broadband radio communication system need not necessarily comprise a multiple δ-doped layer. If a conventional broadband millimeter-wave integrated circuit having a GaAs-MESFET, a GaAs-HEMT, and the like disposed therein is incorporated into the communication card or the transmitting/receiving module and the home electrical appliances are controlled by using the communication card or the transmitting/receiving module, e.g., the effects of unprecedented simplicity and convenience (mobility, reduced size, and flexibility) can be achieved.

Instead of the communication card, a memory device having the same function may also be used.

Example of Semiconductor Integrated Circuit Device

A description will be given herein below to an example of a semiconductor integrated circuit device formed by integrating active elements such as a transistor and a diode disposed in equipment for a communication system such as a base station, a mobile data terminal (PDA), or a transmitting/receiving module (a module disposed in a home electrical appliance or a communication card) with passive elements such as a capacitor and an inductor, which characterizes the present invention. Although the semiconductor integrated circuit device described herein below has a structure of an MMIC, the semiconductor integrated circuit device according to the present invention is not limited to a modulized device such as the MMIC.

FIG. 7 is a cross-sectional view of a semiconductor integrated circuit device (MMIC) formed by integrating a Schottky diode, a HEMT, a MESFET, a capacitor, and an inductor in an InP substrate in the embodiment of the present invention.

A semi-insulating InP substrate 10 doped with iron (Fe) at a high concentration and having a thickness of about 100 μm is provided with: an undoped InAlAs layer 15 (in which ratios of components are, e.g., $In_{0.52}Al_{0.48}As$) serving as a first active region with a thickness of about 200 nm; a multiple δ-doped InGaAs layer 12 (in which ratios of components are, e.g., $In_{0.53}Ga_{0.47}As$) serving as a second active region with a thickness of about 70 nm; an undoped InAlAs layer 16 (in which ratios of components are, e.g., $In_{0.52}Al_{0.48}As$) with a thickness of about 10 nm; an undoped InGaAs layer 17 (in which ratios of components are, e.g., $In_{0.53}Ga_{0.47}As$) with a thickness of about 10 nm; a multiple δ-doped InAlAs layer 13 (in which ratios of components are, e.g., $In_{0.52}Al_{0.48}As$) with a thickness of about 65 nm; and an InP layer 18 serving as an etching stopping layer with a thickness of about 5 nm.

As shown in the lower part of FIG. 7 under magnification, the multiple δ-doped InGaAs layer 12 is composed of five n-type doped layers 12a each composed of an InGaAs single crystal (in which ratios of components are, e.g., $In_{0.53}Ga_{0.47}As$) containing Si (silicon) at a high concentration (e.g., $1\times10^{20}$ atoms $cm^{-3}$) and having a thickness of about 1 nm and six undoped layers 12b each composed of an InGaAs single crystal (in which ratios of components are, e.g., $In_{0.53}Ga_{0.47}As$) and having a thickness of about 10 nm, which are alternately stacked. On the other hand, the multiple δ-doped InAlAs layer 13 is composed of five n-type doped layers 13a each containing Si at a high concentration (e.g., $1\times10^{20}$ atoms $cm^{-3}$) and having a thickness of about 1 nm and six undoped layers 12b each composed of an undoped InAlAs single crystal (in which ratios of components are, e.g., $In_{0.52}Al_{0.48}As$) and having a thickness of about 10 nm, which are alternately stacked. Each of the n-type doped layers 12a and 13a is formed sufficiently thin to allow spreading movement of carriers to the undoped layers 12b and 13b under a quantum effect. As will be described later, an impurity concentration profile in each of the n-type doped layers has a generally δ-functional configuration relative to the underlying undoped layer. Therefore, the present specification refers to the n-type doped layers 12a and 13a as so-called δ-doped layers. The present specification will also refer to a structure consisting of a plurality of heavily doped layers (δ-doped layers) and a plurality of lightly doped layers (undoped layers), which are alternately stacked, as a multiple δ-doped layer.

A Schottky diode (rectifying element) 20 and a MESFET (power amplifier) 30 are provided on that portion of the InP substrate 10 at which the multiple δ-doped InGaAs layer 12 is exposed. An HEMT (power amplifier) 40, a capacitor (capacitor element) 50, and an inductor (inducing element) 60 are provided on that portion of the InP substrate 10 having the multiple δ-doped InAlAs layer 13 located in the uppermost position thereof. In short, the HEMT composing the main amplifier 138 of the amplified-signal transmitter 113 shown in FIG. 4, the diode (the portion indicated by the broken line), the capacitor, the inductor, and the MESFET disposed in a circuit for amplifying an RF signal in the frequency region lower than the millimeter-wave region are provided on the single InP substrate.

It is unnecessary for the MESFET and the HEMT to be provided simultaneously in the integrated circuit device. Either one of the MESFET and the HEMT may be provided appropriately. Normal MISFETs (particularly a PMISFET and an nMISFET) may also be provided.

The Schottky diode 20 comprises a Schottky electrode 21 composed of TiPtAu in Schottky contact with the multiple δ-doped InGaAs layer 12, a withdrawn electrode layer 22 formed by implanting Si at a high concentration (e.g., about $1 \times 10^{18}$ atoms cm$^{-3}$) into the multiple δ-doped InGaAs layer 12, and an ohmic electrode 23 composed of a TiPtAu film in ohmic contact with the withdrawn electrode layer 22.

The MESFET 30 comprises a Schottky gate electrode 32 composed of a TiPtAu film in Schottky contact with the undoped layer 12b serving as the uppermost layer of the multiple δ-doped InGaAs layer 12 and source/drain electrodes 34 and 35 which are provided on the regions of the multiple δ-doped InGaAs layer 12 located on both sides of the gate electrode 32 and in ohmic contact with the multiple δ-doped InGaAs layer portion 12. It is to be noted that Si at a high concentration has been introduced into the regions of the multiple δ-doped InGaAs layer 12 in contact with the source/drain electrodes 34 and 35.

The HEMT 40 comprises a Schottky gate electrode 42 composed of a TiPtAu film in Schottky contact with the InP layer 18 and source/drain electrodes 44 and 45 composed of a TiPtAu film in ohmic contact with the respective regions of the InP layer 18 located on both sides of the gate electrode 42.

The capacitor 50 comprises an underlying insulating film 51 composed of a SiN film provided on the InP layer 18, a lower electrode 52 composed of a platinum (Pt) film provided on the underlying insulating film 51, a capacitor insulating film 53 composed of a high dielectric film such as BST provided on the lower electrode 52, and an upper electrode 54 composed of a platinum (Pt) film opposed to the lower electrode 52 with the capacitor insulating film 53 interposed therebetween.

The inductor 60 comprises a dielectric film 61 composed of a SiN film provided on the InP layer 18 and a conductor film 62 composed of a spiral Cu film formed on the dielectric film 61. The conductor film 62 has a width of about 9 μm and a thickness of about 4 μm. The spacing between the conductor films 62 is about 4 μm. However, since the InP substrate 10 has a high heat resistance and a high heat conductivity, the conductor film 62 can be scaled down depending on an amount of current into a miniaturized pattern, e.g., a configuration with a width of about 1 to 2 μm and a spacing of about 1 to 2 μm.

An interlayer insulating film 70 composed of a silicon dioxide film is also formed on the substrate. Wires (not shown) composed of an aluminum alloy film, a Cu alloy film, or the like are provided on the interlayer insulating film 70. The elements 20, 30, 40, 50, and 60 have respective conductor portions connected to the wires via contacts 71 composed of an aluminum alloy film buried in contact holes formed in the interlayer insulating film 70, whereby circuits at individual base stations are constructed as shown in FIG. 3. However, it is unnecessary for all the circuits shown in FIG. 3 to be provided on a single InP substrate. Any of the elements may also be provided on another substrate (silicon substrate). For example, although the amplified-signal transmitter and the received-signal amplifier, each requiring a power element, are provided on the InP substrate, the baseband processor which does not require a power element may also be provided on a silicon substrate.

In the present embodiment, principal devices in the equipment for a communication system such as a base station, a mobile data terminal, or a transmitting/receiving module are mounted on a single InP substrate so that a required circuit is scaled down, as shown in FIG. 7. Accordingly, the equipment for a communication system (e.g., equipment including the whole circuit shown in FIG. 2) in the present embodiment can be scaled down and the total thickness thereof is only on the order of the sum of the thickness of the InP substrate and the respective thicknesses of the multilayer film and the interlayer insulating film so that the whole equipment for a communication system such as a base station, a mobile data terminal, or a transmitting/receiving module has an extremely thin structure. In other words, the size of the equipment for a communication system such as a base station, a mobile data terminal, or a transmitting/receiving module itself can be reduced. In particular, integration is facilitated since the HEMT, the MESFET, the Schottky diode, and the like can be provided on the single InP substrate by forming the Schottky diode into a lateral configuration, as shown in FIG. 7. A further size reduction is achievable by mounting even passive elements such as an inductor and a capacitor on the common InP substrate.

It has been known that the use of an InGaAs layer formed on an InP substrate as an electron flow region provides a particularly high electron mobility. By using the characteristic, a HEMT handling an RF signal in a frequency region on the order of the millimeter-wave region (30 GHz to 60 GHz) can be obtained. This allows the formation of an MMIC on which a power amplifier capable of amplifying a signal in the frequency region of 30 GHz to 60 GHz is mounted.

The significant size reduction of the circuit provides high flexibility with which individual members are placed at a base station, a mobile data terminal (mobile station), a transmitting/receiving module, or the like.

As a result, there is provided a semiconductor device having the characteristics of high power and a high breakdown voltage and suitable for use at a base station, a mobile data terminal (mobile station), a transmitting/receiving module, or the like in a communication system. Even if the semiconductor device is placed at a base station or in a home electrical appliance, the size reduction of the circuit obviates the necessity to provide a cooling device having a particularly high cooling ability. This reduces placement cost for cooling facilities and running cost for power and the like.

By integrating a majority of elements in the base station, the mobile data terminal (mobile station), or the transmitting/receiving module into a common InP substrate, the labor of assembling parts can be saved and the fabrication cost for the semiconductor device can be reduced. Because the element having the multiple δ-doped layer composed of the δ-doped layers and the undoped layers which are arranged in stacked relation increases the reliability of the device, a higher production yield can also be expected so that a cost reduction due to the higher production is achieved.

If the semiconductor device is applied to equipment handling an RF signal on the GHz order, in particular, the dielectric film 61 of the inductor 60 is preferably composed of a BCB (benzocyclobutene) film. The BCB film is a film containing BCB in the structure thereof, which is obtained by dissolving a BCB-DVS monomer in a solvent, applying the resulting solution, and baking the applied solution. The BCB film features a relative dielectric constant as low as about 2.7 and easy formation of a film as thick as about 30 μm by a single step of application. Since the tan δ of the BCB film is about 0.006 at 60 GHz, which is lower than that of $SiO_2$ by one order of magnitude, the BCB film has particularly excellent characteristics as the dielectric film composing the inductor and the microstrip line.

Multiple δ-doped Layer

As stated previously, the semiconductor device according to the present embodiment comprises the multiple δ-doped layer composed of the n-type doped layers 12a or 13a and the undoped layers 12b or 13b which are alternately stacked. Such a structure composed of heavily doped layers (δ-doped layers) and lightly doped layers (undoped layers) which are alternately stacked is obtainable by using the crystal growing apparatus and the crystal growing method disclosed in the specifications and drawings of Japanese Patent Applications 2000-58964, 2000-06210, and the like, which will be described later. Specifically, an epitaxial growing method using in-situ doping is used by simultaneously effecting the supply of a dopant gas using a pulse valve (termed pulse doping) and the supply of a source gas. A description will be given herein below to the significance of the multiple δ-doped layer according to the present invention.

Figure 8A:
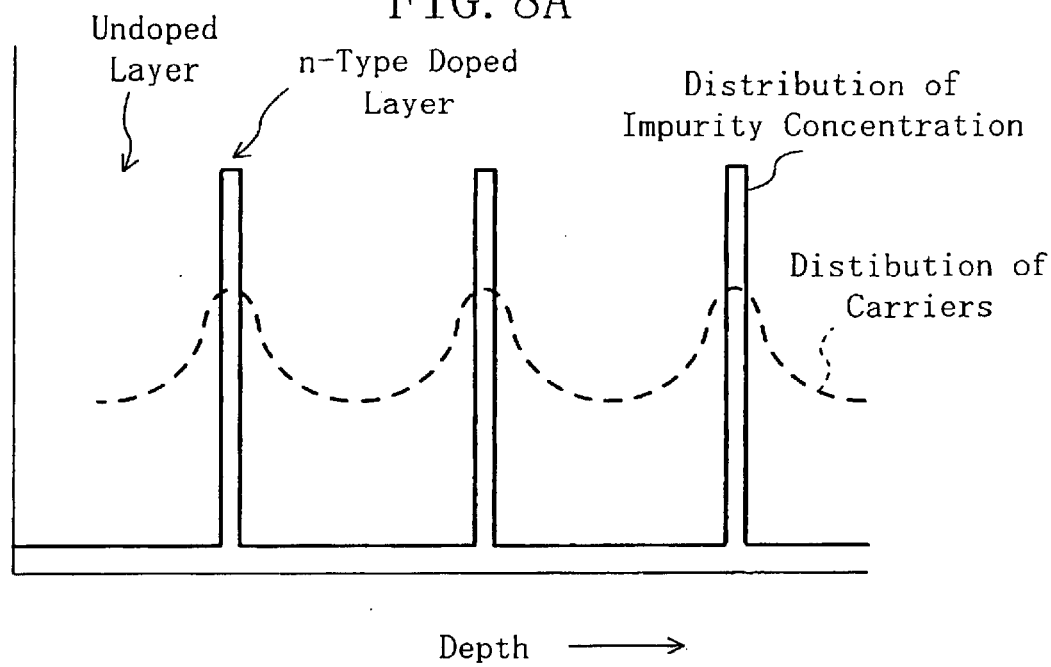
FIG. 8A diagrammatically shows the relationship between the concentration profile of nitrogen and the distribution of carriers along the depth of a multiple δ-doped InGaAs layer in the embodiment and FIG. 8B is a partial band diagram showing the configuration of a conduction band edge.
Figure 8B:
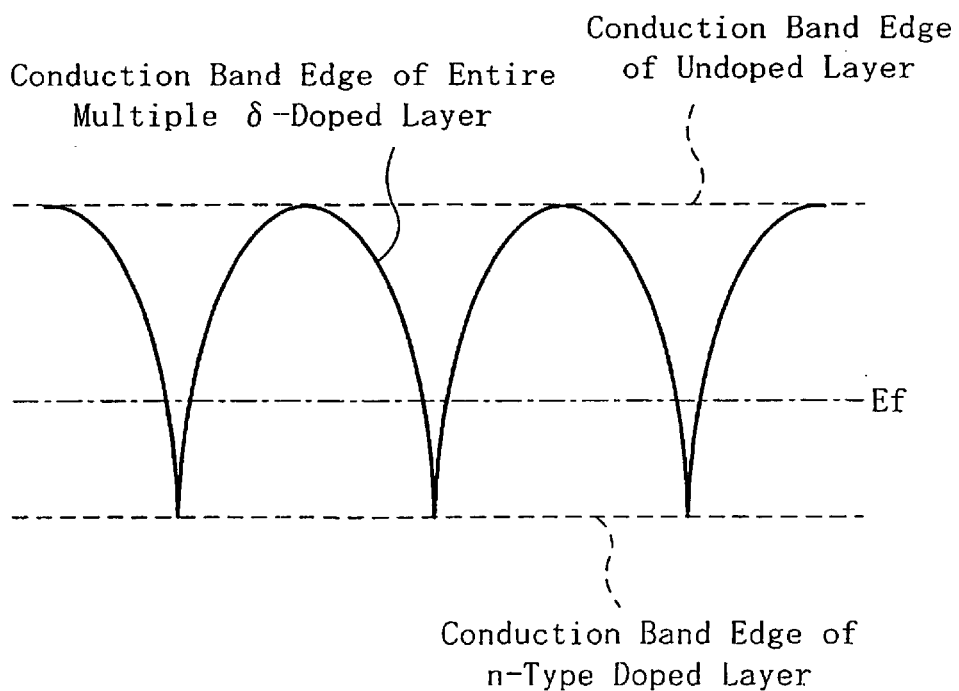

FIG. 8A diagrammatically shows the relationship between the concentration profile of nitrogen as an n-type impurity and the distribution of carriers along the depth of the multiple δ-doped layer according to the present embodiment (the multiple δ-doped InGaAs layer 12 or the multiple δ-doped InAlAs layer 13). FIG. 8B is a partial band diagram showing the configuration of a conduction band edge along the depth of the multiple δ-doped InGaAs layer.

Since the thickness of each of the n-type doped layers 12a and 13a is as thin as about 10 nm as shown in FIG. 8A and FIG. 8B, a quantum level resulting from a quantum effect occurs in each of the n-type doped layers 12a and 13a so that the wave function of an electron present locally in each of the n-type doped layers 12a and 13a expands to a certain degree. What results is a state of distribution in which carriers are present not only in the n-type doped layers 12a and 13a but also in each of the undoped layers 12b and 13b at a concentration higher than an original concentration, as indicated by the broken curve in the drawing. In the state in which the potential of the multiple δ-doped layer is increased and carriers flow, electrons are constantly supplied to the n-type doped layers 12a and 13a and to the undoped layers 12b and 13b. What results is the state of distribution in which electrons are present not only in the n-type doped layers 12a and 13a but also in each of the undoped layers 12b and 13b at a relatively high concentration. Since electrons flow not only in the n-type doped layers 12a and 13a but also in the undoped layers 12b and 13b, the resistance of the multiple δ-doped layer is reduced. This reduces scattering by impurity ions in the undoped layers 12b and 13b and thereby achieves a particularly high electron mobility in each of the undoped layers 12b and 13b.

In the state in which the entire multiple δ-doped layer is depleted, on the other hand, carriers no more exist in the undoped layers 12b or 13b and in the n-type doped layers 12a or 13a so that a breakdown voltage is defined by the undoped layers 12b and 13b each having a lower impurity concentration and the whole multiple δ-doped layer (the multiple δ-doped InGaAs layer 12 or the multiple δ-doped InAlAs layer 13) has a high breakdown voltage.

The foregoing fundamental effects are achievable not only when a plurality of δ-doped layers are present in the carrier flow region but also when a single δ-doped layer is present therein. If at least one δ-doped layer is present in the carrier flow region serving as a depletion layer when a voltage at which the device operates is applied, carriers spread out from the δ-doped layer to the adjacent undoped layer (lightly doped layer) so that the carriers flow in the region reached by the carriers from the undoped layer, so that a low resistance is obtainable under the foregoing effect. If the device is in the OFF state, on the other hand, the δ-doped layer is also depleted so that a high breakdown voltage is obtained. Thus, if at least one δ-doped layer is present in the carrier flow region when a voltage at which the device operates (set ON voltage) is applied, both the low resistance and the high breakdown voltage can be achieved at the same time.

Each of the foregoing effects are similarly achievable even if holes, not electrons, are used as carriers.

As shown in FIG. 8B, a conduction band edge in the whole multiple δ-doped layer presents a configuration which connects a conduction band edge in the n-type doped layer (δ-doped layer) 12a or 13a indicated by the broken line to a conduction band edge in the undoped layer 12b or 13b indicated by the broken line. Although it is normal to increase the impurity concentration in the n-type doped layer 12a or 13a to a value at which the conduction band edge therein is lower than the Fermi level $E_f$, the impurity concentration in the n-type doped layer 12a need not necessarily be increased to such a high value.

In the multiple δ-doped layer having p-type δ-doped layers also, the relationship between the Fermi level $E_f$ and a valence band edge in the δ-doped layer is represented by a configuration obtained by replacing the conduction band edge with a valence band edge in FIG. 8B and vertically inverting the whole diagram.

By using the multiple δ-doped layer (the multiple δ-doped InGaAs layer 12 or the multiple δ-doped InAlAs layer 13 in the present embodiment) having such structures as the carrier flow region, a high-performance device as will be shown in the following embodiment is obtainable. As for the function of the δ-doped layers and the undoped layers serving as the carrier flow region in the multilayer δ-doped layers, it will be described in the following embodiment.

Although the present embodiment has formed the δ-doped layer on the undoped layer, it is also possible to use an n-type lightly doped layer or a p-type lightly doped layer formed by opening the pulse valve instead of the undoped layer.

Although the present embodiment has described the CVD method using induced heating as a method for growing a thin film on a substrate material, it will easily be appreciated that the thin-film growing method according to the present invention is effective even when a thin film is grown on the base material under the effects achieved by any of plasma CVD, photo assisted CVD, and electron assisted CVD.

The present invention is also applicable to a multilayer structure composed of lightly doped layers (including undoped layers) and heavily doped layers thinner than the lightly doped layers to a degree which allows carriers to spread out to the lightly doped layers under a quantum effect by using not only CVD but also another technique such as sputtering, vapor deposition, or MBE.

Experimental Data

A description will be given herein below to the relationship between the thickness of the multiple δ-doped layer and the effects achieved thereby based on exemplary experiments disclosed in a PCT application (PCT/JP00/01855) by the present inventors, which are related to a multiple δ-doped layer in a SiC layer.

Figure 9:
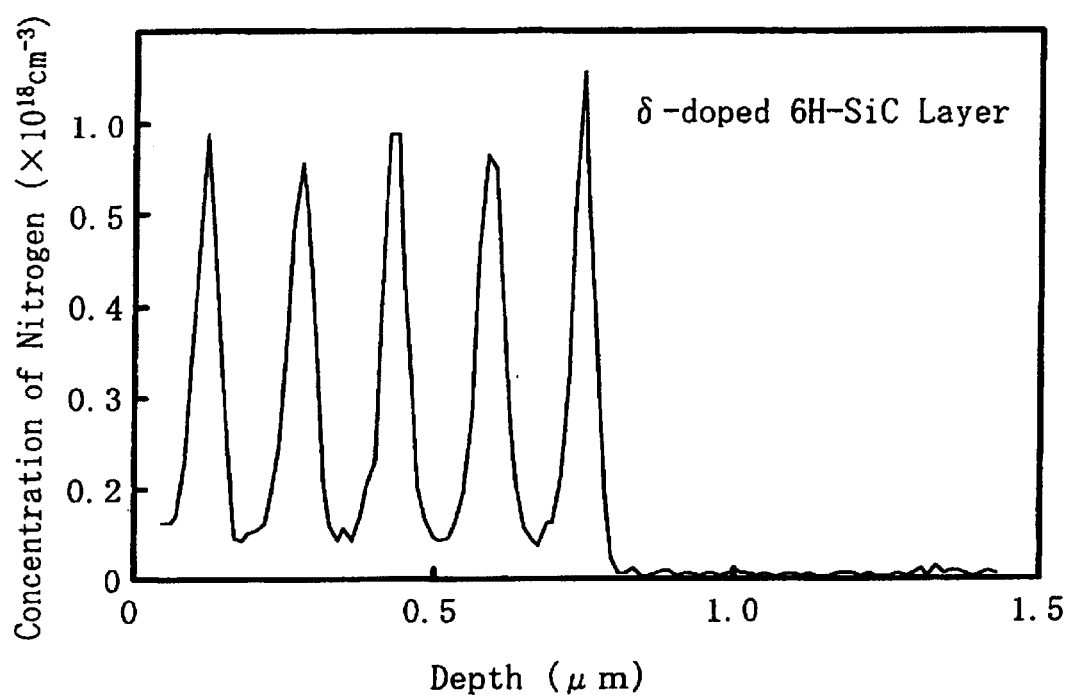
FIG. 9 shows the distribution of a dopant concentration along the depth of the multiple δ-doped layer in a SiC layer.

FIG. 9 shows the distribution of a dopant concentration along the depth of the multiple δ-doped layer in the SiC layer. As described above, the period (pulse width) during which a pulse valve is open during the formation of the n-type doped layer is adjusted to 102 μs and the period during which the pulse valve is closed (interval between pulses) is adjusted to 4 ms. The concentration profile of FIG. 9 was obtained as a result of measurement performed by using a secondary ion mass spectrometry (SIMS). In FIG. 9, the horizontal axis represents a depth (μm) from the uppermost surface of the substrate) and the vertical axis represents the concentration of nitrogen as the dopant. As shown in the drawing, the concentration of nitrogen (N) in each of the n-type doped layers formed in accordance with this method is nearly uniform (about $1 \times 10^{1018}$ atoms $cm^{-3}$) and the impurity concentration changes extremely sharply in each of the region in which the undoped layer shifts to the n-type doped layer and the region in which the n-type doped layer shifts to the undoped layer. In the present embodiment also, the multiple δ-doped layer having an impurity profile as shown in FIG. 8 can be formed easily by supplying a dopant gas containing Si as a dopant.

Although the data shown in FIG. 9 was obtained from the n-type doped layer, a similar impurity concentration profile is obtainable even from a p-type doped layer containing aluminum or the like as a dopant. As shown in FIG. 8, the impurity concentration profile in the heavily doped layer has a generally δ-functional configuration relative to the underlying undoped layer.

Figure 10A:
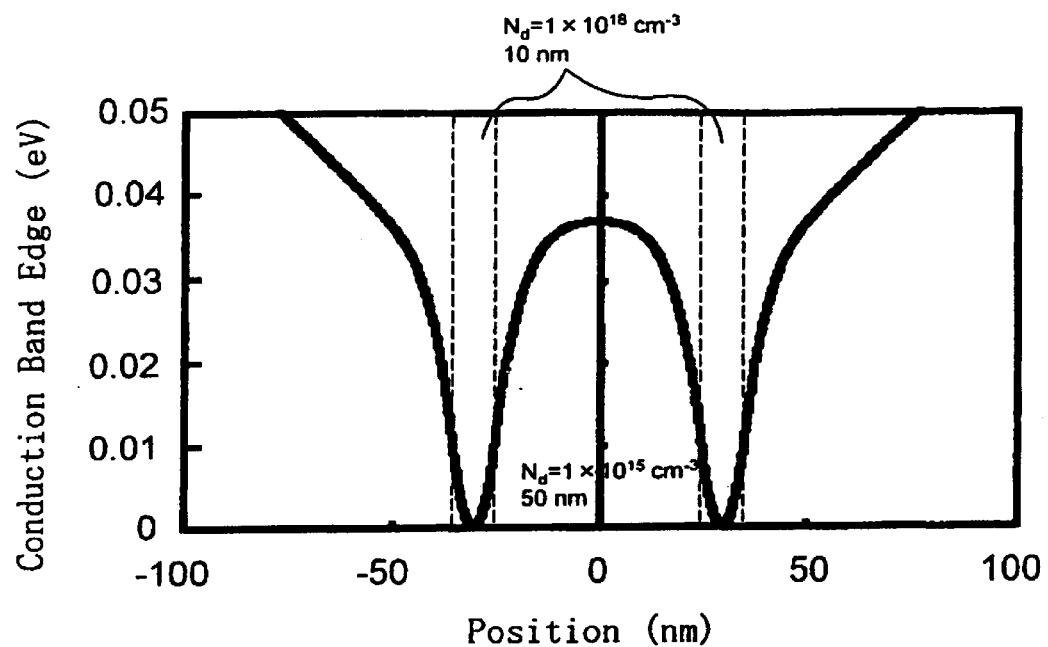
FIG. 10A shows the result of simulating a band structure at a conduction band edge in a sample A having a multilayer portion composed of δ-doped layers and undoped layers and FIG. 10B shows the result of simulating the distribution of carrier concentration.
Figure 10B:
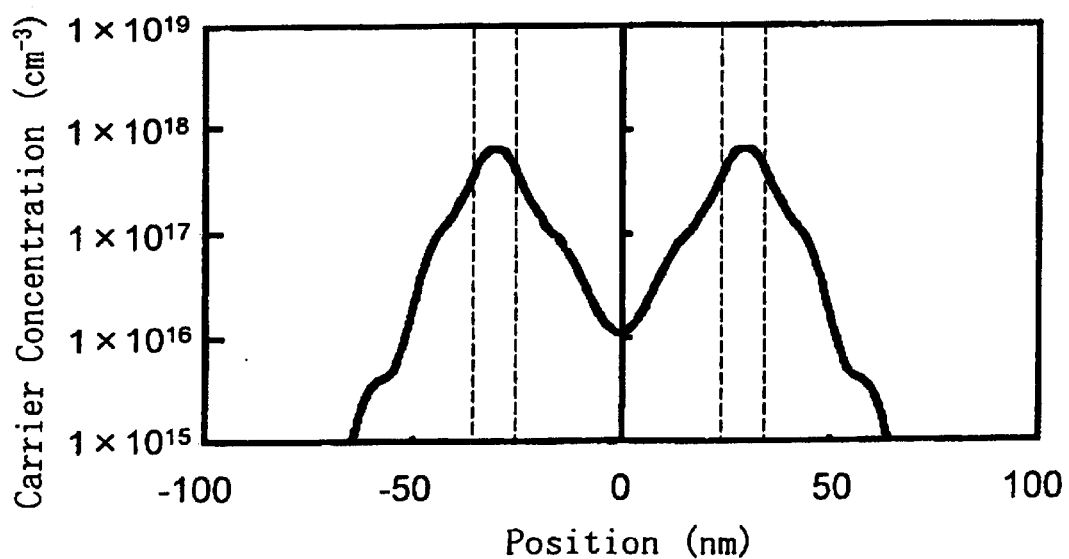
Figure 11A:
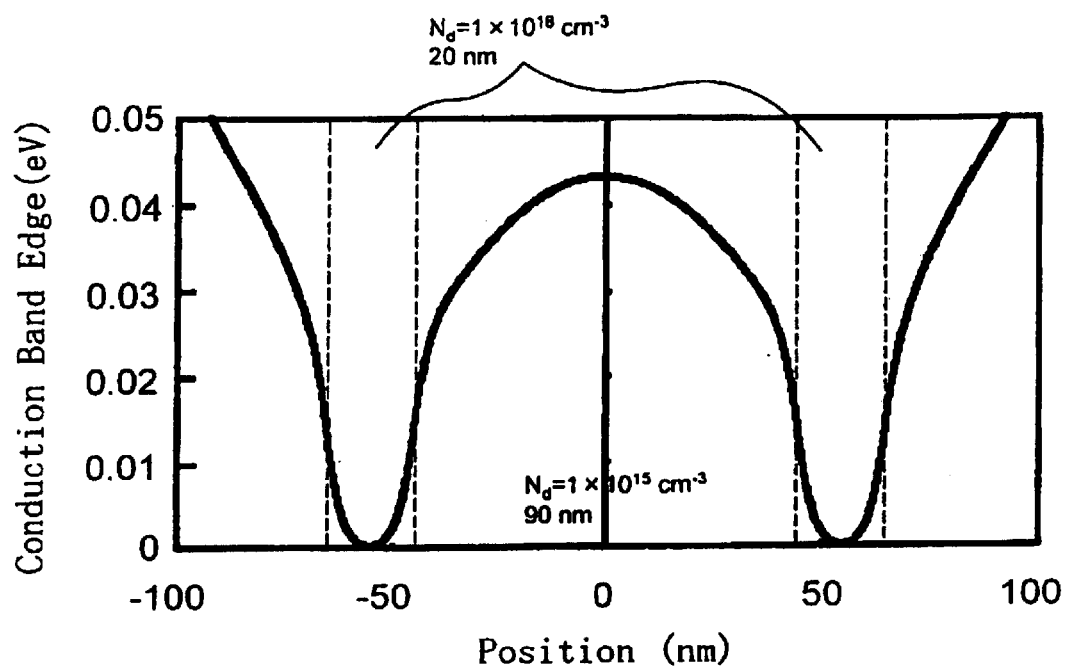
FIG. 11A shows the result of simulating a band structure at a conduction band edge in a sample B having a multilayer portion composed of δ-doped layers and undoped layers and FIG. 11B shows the result of simulating the distribution of carrier concentration.
Figure 11B:
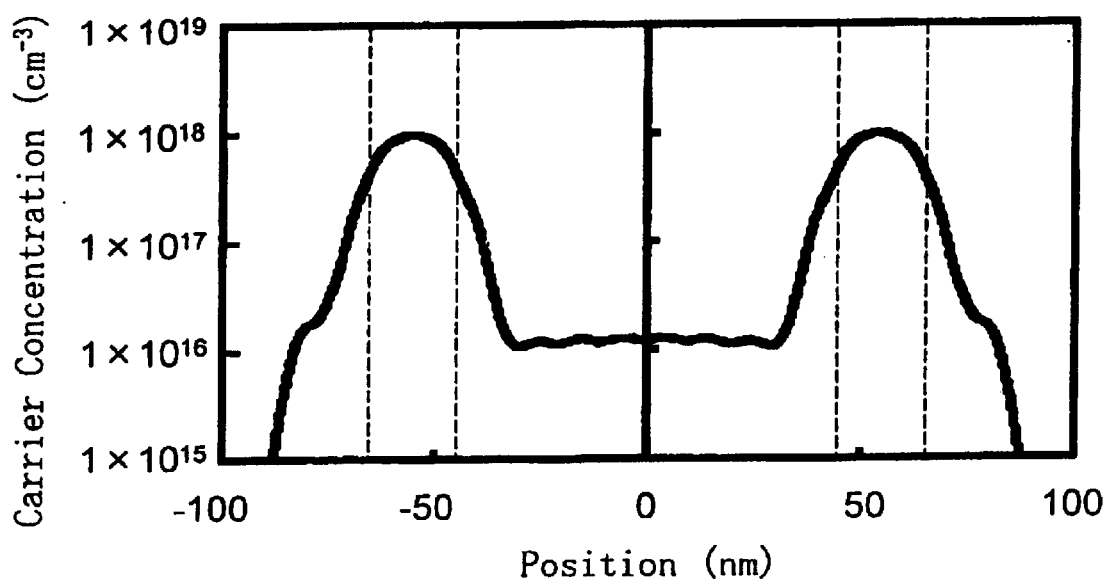

FIG. 10A shows the result of simulating a band structure at a conduction band edge in a sample A having a multilayer portion composed of five δ-doped layers each having a thickness of 10 nm and five undoped layers each having a thickness of 50 nm which are alternately stacked. FIG. 10B shows the result of simulating the distribution of carrier concentration. FIG. 11A shows the result of simulating a band structure at a conduction band edge in a sample B having a multilayer portion composed of five δ-doped layers each having a thickness of 20 nm and five undoped layers each having a thickness of 50 nm which are alternately stacked. FIG. 11B shows the result of simulating the distribution of carrier concentration. As shown in FIG. 10A and FIG. 11A, electrons are confined to a V-shaped Coulomb potential (quantum well) sandwiched between donor layers each positively charged in a cross section orthogonally intersecting the δ-doped layers and a quantum state is formed within the well. The effective mass of an electron is 1.1 and the relative dielectric constant of the 6H—SiC layer is 9.66. A background carrier concentration in the 6H—SiC layer used as the undoped layer is $1 \times 10^{15}$ $cm^{-3}$ and the density of carriers in the n-type δ-doped layer is $1 \times 10^{18}$ $cm^{-3}$.

As shown in FIG. 10B, two-dimensional electrons are distributed extensively even in the undoped layer sandwiched between the two δ-doped layers (sample A) each having a thickness of 10 nm and the region in which the concentration of electrons is $2 \times 10^{16}$ $cm^{-3}$ or more is observed in the range at 25 nm from the interface. This indicates that the distribution of carriers shown in FIG. 10B is coincident with the state of carrier distribution diagrammatically depicted in FIG. 8A and that carriers have spread out from the δ-doped layers to the undoped layer.

On the other hand, a large overlapping portion exists between a region in which the probability of presence of a carrier defined by the wave function of an electron is high and each of the δ-doped layers (sample B) having a large thickness of 20 nm and the center of ionized impurity scattering so that the region in which the electron concentration is $2 \times 10^{16}$ $cm^{-3}$ or more is at 11 nm from the interface, as shown in FIG. 11B. This indicates that a relatively small number of carriers have spread out from the δ-doped layers to the undoped layers. In this case also, however, the fundamental effects achieved by the multiple δ-doped layer according to the present invention are achievable if the minimum value of the carrier concentration in the region between the δ-doped layers is higher than the original carrier concentration in the undoped layer. The effects achieved by the spreading out of carriers can be adjusted appropriately by adjusting the impurity concentration and film thickness of each of the δ-doped layers and the undoped layers.

Since the present embodiment has provided, on the InP substrate 10, the multiple δ-doped InGaAs layer 12 and the multiple δ-doped InAlAs layer 13 having the structure shown in the lower part of FIG. 7, the following remarkable effects are achievable in each of the elements.

Schottky Diode

First, in the Schottky diode 20, carriers in the n-type doped layers 12a are so distributed as to spread out even to the undoped layers 12b under a quantum effect. If a forward bias is applied to the Schottky diode 20 in this state, the potential of the multiple δ-doped InGaAs layer 12 is increased and electrons are constantly supplied to the n-type doped layers 12a and to the undoped layers 12b, so that a current easily flows in the Schottky electrode 21 through the n-type doped layers 12a and undoped layers 12b of the multiple δ-doped InGaAs layer 12. In short, not only the n-type doped layers 12a of the multiple δ-doped InGaAs layer 12 but also the undoped layers 12b thereof function as the carrier flow region. Since the impurity concentration in each of the undoped layers 12b is low, impurity scattering is reduced in the undoped layers 12b. This retains a low resistance, while achieving low power consumption and a large electric current. If a reverse bias is applied to the Schottky diode 20, on the other hand, the depletion layer expands from the undoped layers 12b of the multiple δ-doped InGaAs layer 12 to the n-type doped layers 12a thereof so that the entire multiple δ-doped InGaAs layer 12 is depleted easily and a high breakdown voltage is obtained. Accordingly, a power diode with high power and a high breakdown voltage can be implemented.

A detailed description will be given herein below to the effects of the lateral Schottky diode according to the present embodiment in comparison with those of the conventional vertical Schottky diode.

FIG. 12A1 to FIG. 12C3 are energy band diagrams each showing changes in the configuration of a conduction band edge caused by changes in bias in the Schottky diode according to the present embodiment and in the conventional Schottky diode. FIG. 12A1, FIG. 12B1, and FIG. 12C1 show conduction band edges in the undoped layer 12b of the Schottky diode according to the present embodiment. FIG. 12A2, FIG. 12B2, and FIG. 12C2 show conduction band edges in the n-type doped layer 12a of the Schottky diode according to the present embodiment. FIGS. 12A3, 12B3, and 12C3 show conduction band edges in the InGaAs layer of the conventional Schottky diode. It is to be noted that the conventional Schottky diode is assumed to have a vertical configuration in which a uniformly doped layer doped with nitrogen at a uniform concentration is in contact with the Schottky electrode and an ohmic electrode is in ohmic contact with any portion of the uniformly doped layer. FIG. 12A1 to FIG. 12A3 show the configurations of the conduction band edges when no voltage is applied between the Schottky electrode and the ohmic electrode (zero bias). FIG. 12B1 to FIG. 12B3 show the configurations of the conduction band edges when a voltage is applied between the Schottky electrode and the ohmic electrode such that the Schottky electrode has a higher voltage (forward bias). FIG. 12C1 to FIG. 12C3 show the configurations of the conduction band edges when a voltage is applied between the Schottky electrode and the ohmic electrode such that the ohmic electrode has a higher voltage (reverse bias). Since the state of contact between the ohmic electrode and the multiple δ-doped InGaAs layer 12 does not essentially change in response to a change in bias, the depiction thereof is omitted. Since the present embodiment has described the case where the n-type semiconductor layer in which electrons flow as carriers is provided, the depiction of the configuration of a valence band edge is omitted.

As shown in FIG. 12A1 to FIG. 12A3, respective high Schottky barriers (about 1 to 2 eV) are formed between the undoped layer or the n-type doped layer in the active region and the Schottky electrode and between the uniformly doped" layer and the Schottky electrode in the state of zero bias in each of the Schottky diode of the present embodiment and the conventional Schottky diode.

When a forward bias is applied to the Schottky diode of the present embodiment, the potential of the multiple δ-doped InGaAs layer 12 is increased, as shown in FIG. 12B1 and FIG. 12B2. In other words, the energy level at a conduction band edge in each of the undoped layer 12b of the multiple δ-doped InGaAs layer 12 and in the n-type doped layer 12a thereof is increased. Since a distribution of carriers as shown in FIG. 8A is formed also in the undoped layer 12b, a current easily flows in the Schottky electrode 21 through the n-type doped layers 12a and the undoped layers 12b in the multiple δ-doped InGaAs layer 12. In short, not only the n-type doped layers 12a of the multiple δ-doped InGaAs layer 12 but also the undoped layers 12b thereof function as the carrier flow region. Although a distribution of carriers as shown in FIG. 8A is formed in the undoped layer 12b, the impurity concentration therein is low so that impurity scattering is reduced in the undoped layer 12b. This maintains the resistance of the whole multiple δ-doped InGaAs layer 12 at a high value and achieves lower power consumption and a large electric current.

On the other hand, if a forward bias is applied to the conventional Schottky diode as shown in FIG. 12B3, a current flows from the uniformly doped layer to the Schottky electrode.

If a reverse bias is applied to the Schottky diode according to the present embodiment as shown in FIG. 12C1 and FIG. 12C2, the overall energy level at the conduction band edge in the undoped layers 12b of the multiple δ-doped InGaAs layer 12 and in the n-type doped layers 12a thereof lowers. Thus, the breakdown voltage is defined by an electric field applied to the depletion layer in the reverse bias state. In that case, the slope of the conduction band edge is gentler as the impurity concentration is lower so that the width of the depletion layer is naturally wider as the impurity concentration is lower. Accordingly, a high breakdown voltage is obtained in the undoped layer 12b as shown in FIG. 12C1. If the heavily doped layer and the Schottky electrode are in mere contact, the conduction band edge in the heavily doped layer in the reverse bias state is as indicated by the broken curve in FIG. 12C2 and the width of the depletion layer in the heavily doped layer is reduced significantly. However, since the thickness of the n-type doped layer 12a is as small as 10 nm in the present embodiment, the depletion layer expands from the undoped layer 12b into the n-type doped layer 12a as indicated by the solid curve in FIG. 12C2.

If the whole multiple δ-doped InGaAs layer 12 is depleted, carriers are not distributed in the undoped layer 12b so that the entire multiple δ-doped InGaAs layer 12 is increased in resistance. If depletion is incomplete, an electric current flowing from the Schottky electrode 21 toward the withdrawn doped layer 22 experiences a high resistance in the n-type doped layer 12a because of the thickness of the n-type doped layer 12a which is as small as 10 nm, so that it does not flow actually. In short, substantially no ohmic contact is provided between the n-type doped layer 12a and the Schottky electrode 21 so that Schottky contact is retained. By adjusting the thicknesses, impurity concentrations, and the like of the undoped layers 12b and the n-type doped layers 12a, the breakdown voltage can be defined by the width of the depletion layer between the thicker undoped layer 12b and the Schottky electrode 21. Thus, a high breakdown voltage is obtained.

Since the width of the depletion layer in the uniformly doped layer varies with the impurity concentration of the uniformly doped layer in the conventional Schottky diode as shown in FIG. 12C3, it is possible to control the resistance and the breakdown voltage by adjusting the impurity concentration of the uniformly doped layer. However, a trade-off exists between a low resistance and a high breakdown voltage such that, if the impurity concentration of the uniformly doped layer is increased to lower the resistance, the width of the depletion layer is reduced and the breakdown voltage lowers, while the resistance increases if the impurity concentration of the uniformly doped layer is lowered. In the conventional Schottky diode, therefore, it is difficult to simultaneously achieve a low resistance (low power consumption) and a high breakdown voltage which are desired for a power device. If a lateral configuration is used for the conventional Schottky diode, on the other hand, it is difficult to achieve a high breakdown voltage, while providing a large current. So far, the conventional Schottky diode has been implemented only in a vertical configuration.

In the Schottky device according to the present embodiment, by contrast, carriers are distributed extensively over the n-type doped layers (heavily doped layers) 12a and the undoped layers (lightly doped layers) 12b in the forward bias state and impurity scattering is reduced in the undoped layers 12b. This allows easy movement of carriers (electrons) from the withdrawn doped layer 22 to the Schottky electrode 21. Conversely, carriers are not present in the undoped layers 12b in the reverse bias state as a result of depletion so that the entire active region is increased in resistance and electrons do not substantially flow from the Schottky electrode 21 to the withdrawn doped layer 22. By thus focusing attention on the state of carrier distribution which is different in the forward bias state and in the reverse bias state, the trade-off between a low resistance and a high breakdown voltage observed in the conventional Schottky diode can be eliminated with the MESFET according to the present embodiment.

The power diode thus formed in the lateral configuration facilitates the integration of the power diode in conjunction with a power MESFET and the like in a common InP substrate. Since it is difficult to achieve a high breakdown voltage, while providing a large current in the conventional Schottky diode formed in a lateral configuration, a high-power Schottky diode should inevitably be formed in a vertical configuration. By contrast, the Schottky diode according to the present embodiment can be used also as a power device by eliminating the trade-off between a low resistance and a high breakdown voltage and providing a large amount of current. If an integrated circuit device is constructed by integrating the Schottky diode according to the present embodiment in conjunction with a HEMT, a MESFET, and the like in a common InP substrate, the integrated circuit device can be used for equipment for a communication system. In that case, prominent effects are achieved such that impedance matching in equipment for a communication system handling an RF signal is performed more easily than in the vertical Schottky diode of discrete type and the operating frequency is increased.

The vertical Schottky diode having a capacitor structure is disadvantageous in that the operating frequency is lowered by a parasitic capacitance. By contrast, the lateral Schottky diode according to the present embodiment has no capacitor structure so that it offers the advantage of a further increase in operating frequency.

In conventional equipment for a communication system such as a base station, a diode is provided on a silicon substrate. In that case, not a Schottky diode but a pin diode or a pn diode is formed normally in terms of the characteristics of silicon. By using an InP substrate, however, a Schottky diode can be formed easily as in the present embodiment. Since the Schottky diode is characterized in that a carrier requires a shorter time to recover than in the pin diode or pn diode, a structure suitable for higher-speed operation is obtainable.

MESFET

In the MESFET 30, carriers in the n-type doped layers 12a are so distributed as to spread out to the undoped layers 12b under a quantum effect, similarly to the Schottky diode 20. If a forward bias is applied to the MESFET 30 in this state, the potential of the multiple δ-doped InGaAs layer 12 is increased and electrons are supplied constantly to the n-type doped layers 12a and to the undoped layers 12b. Consequently, a current easily flows between the source and drain electrodes through both of the n-type doped layers 12a and the undoped layers 12b in the multiple δ-doped InGaAs layer 12. Since the impurity concentration in each of the undoped layers 12b is low, impurity scattering in the undoped layers 12b is reduced so that a low resistance is retained and low power consumption and a large current are achieved.

When the MESFET is in the OFF state, a depletion layer expands from the undoped layers 12b to the n-type doped layers 12a in the multiple δ-doped InGaAs layer 12 so that the whole multiple δ-doped InGaAs layer 12 is easily depleted and a high breakdown voltage is obtained. Consequently, a device for a power amplifier having a low ON-state resistance, high power, and a high breakdown voltage is obtainable.

A description will be given herein below to the result of evaluating the performance of the MESFET according to the present embodiment and to a comparison made between the performance of the MESFET according to the present embodiment and the performance of a conventional MESFET based on items disclosed in the PCT application (PCT/JP00/01855) by the present inventors, which are related to the SiC layer.

First, the MESFET according to the present embodiment and the conventional MESFET were compared for a gate-to-source breakdown voltage. The MESFET having the multiple δ-doped layer using, as the channel layer, the active region formed by alternately stacking the five undoped SiC layers and the five n-type doped SiC layers in the SiC layer had a dielectric breakdown voltage of 120 V, which is four times the breakdown voltage of the conventional MESFET.

Next, the dependence of the relationship between drain current and drain voltage on gate voltage (I–V characteristic) was examined for the SIC-MESFET having the multiple δ-doped layer. By applying a voltage to the gate electrode with the application of a constant voltage between the source electrode and the drain electrode, a source-to-drain current was modulated in accordance with the voltage applied to the gate electrode so that a switching operation was performed. At that time, a stable drain current was obtained without a breakdown even when the drain voltage was 140 V or higher.

Figure 13:
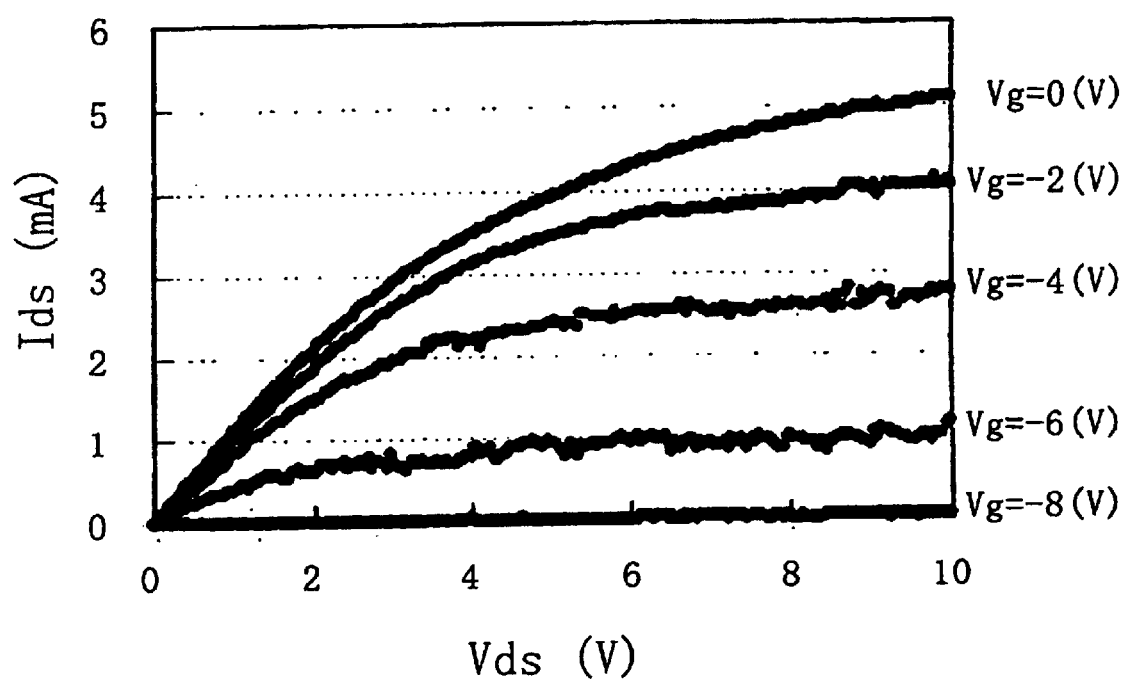
FIG. 13 shows the result of measuring the dependence of the relationship between drain current and drain voltage on gate voltage (I–V characteristic) in a MESFET having a multiple δ-doped layer.

FIG. 13 shows the result of measuring the dependence of the relationship between drain current and drain voltage on gate voltage (I–V characteristic) for the MESFEAT having the multiple δ-doped layer. In the drawing, the horizontal axis represents the drain voltage Vds (V) and the vertical axis represents the drain current Ids (A), while the gate voltage Vg is used as a parameter.

Further, a transconductance in the vicinity of the threshold voltage was measured for each of the MESFET having the multiple δ-doped layer and the conventional MESFET. As a result, it was found that the transconductance of the MESFET using the foregoing multiple δ-doped layer as the channel layer was about double the transconductance of the conventional MESFET using the uniformly doped layer as the channel layer. This is because the mobility of an electron in the MESFET having the multiple δ-doped layer was increased as described above.

In accordance with the same principle, the foregoing results are also obtainable from the MESFET according to the present embodiment having the multiple δ-doped InGaAs layer 12 provided on the InP substrate. Therefore, the MESFET according to the present embodiment can achieve the effects of low power consumption, a high breakdown voltage, and a high gain.

If a comparison is made between the power amplifier according to the present embodiment and a conventional power amplifier the following differences are observed therebetween in correspondence with the foregoing functional differences between the MESFET according to the present embodiment and the conventional MESFET.

Figure 27:
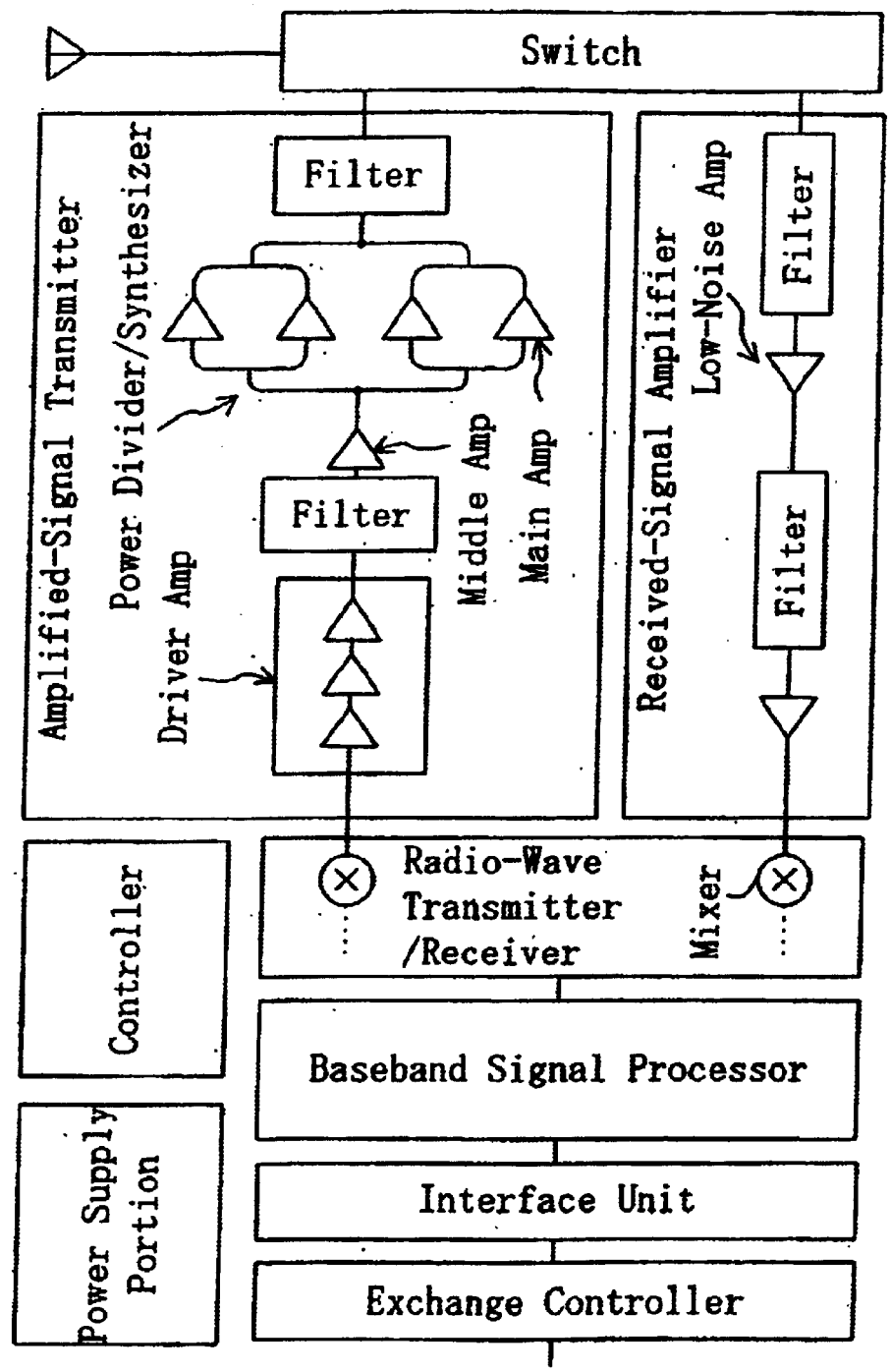
FIG. 27 is a block circuit diagram showing an internal structure of a conventional base station (base station in a communication system)
Figure 28:
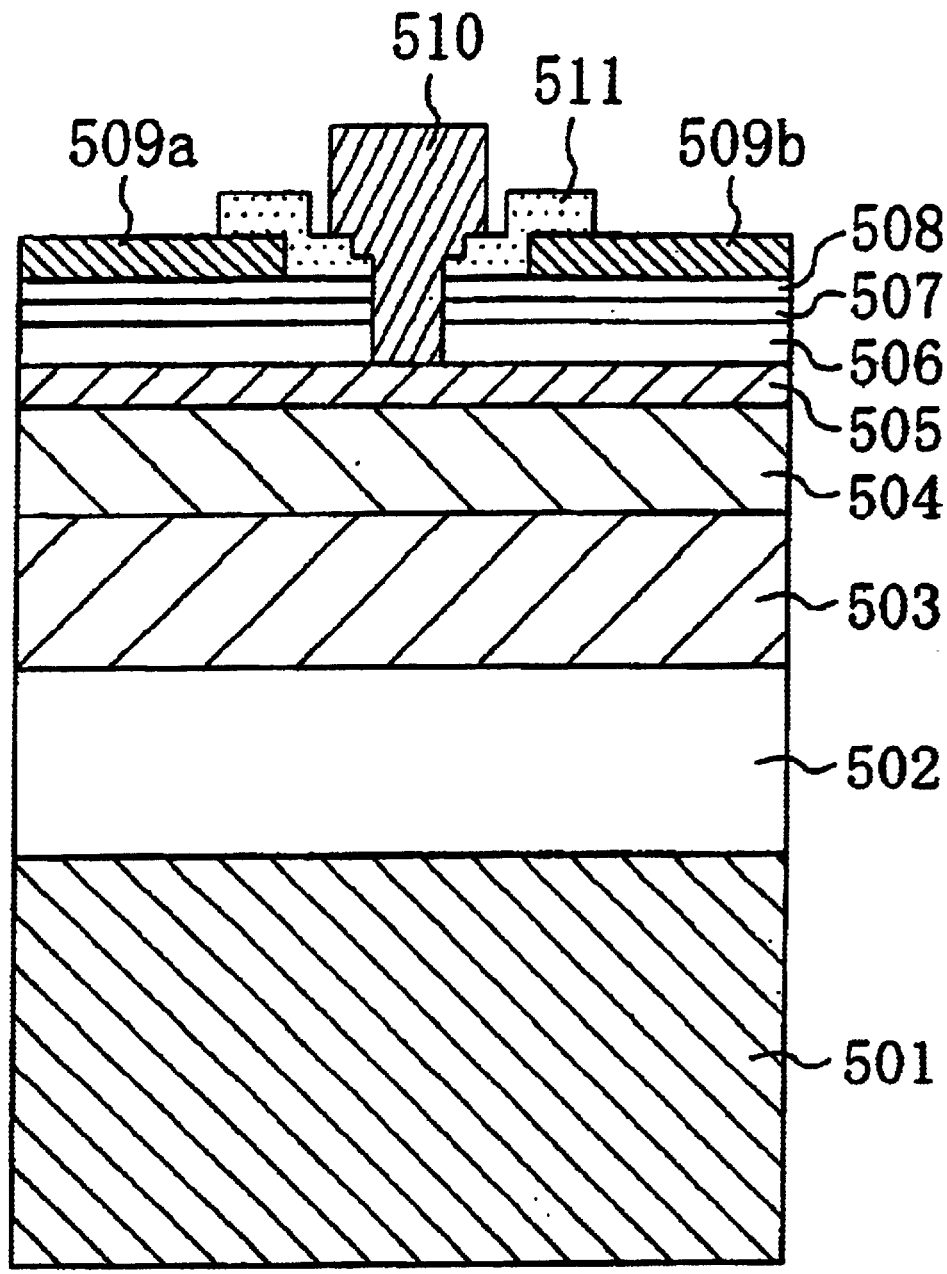
FIG. 28 schematically shows a structure of a conventional HEMT using an InP substrate.

At the conventional base station, the amplified-signal transmitter which requires amplification of high power has four main amplifiers each comprising a MESFET placed therein, as shown in FIG. 27. However, it becomes more difficult to achieve impedance matching between the individual MESFETs as a larger number of MESFETs are provided and the difficulty of impedance matching increases as the frequency of an RF signal is higher.

By contrast, the present embodiment can obtain a desired power by merely disposing one main amplifier 138 comprising a MESFET in the amplified-signal transmitting circuit. By thus reducing the number of MESFETs, the structure of an impedance matching circuit can be simplified in a circuit handling an RF signal in a high frequency range compared with a circuit in the conventional base station. In addition, the Schottky diodes are integrated in conjunction with the MESFETs in the single InP substrate, as described above, and the number thereof is reduced. This further simplifies the structure of the impedance matching circuit and allows a semiconductor integrated circuit device in which MESFETs according to the present embodiment are mounted to be incorporated into a communication system handling an RF signal on, e.g., the GHz order.

Figure 29:
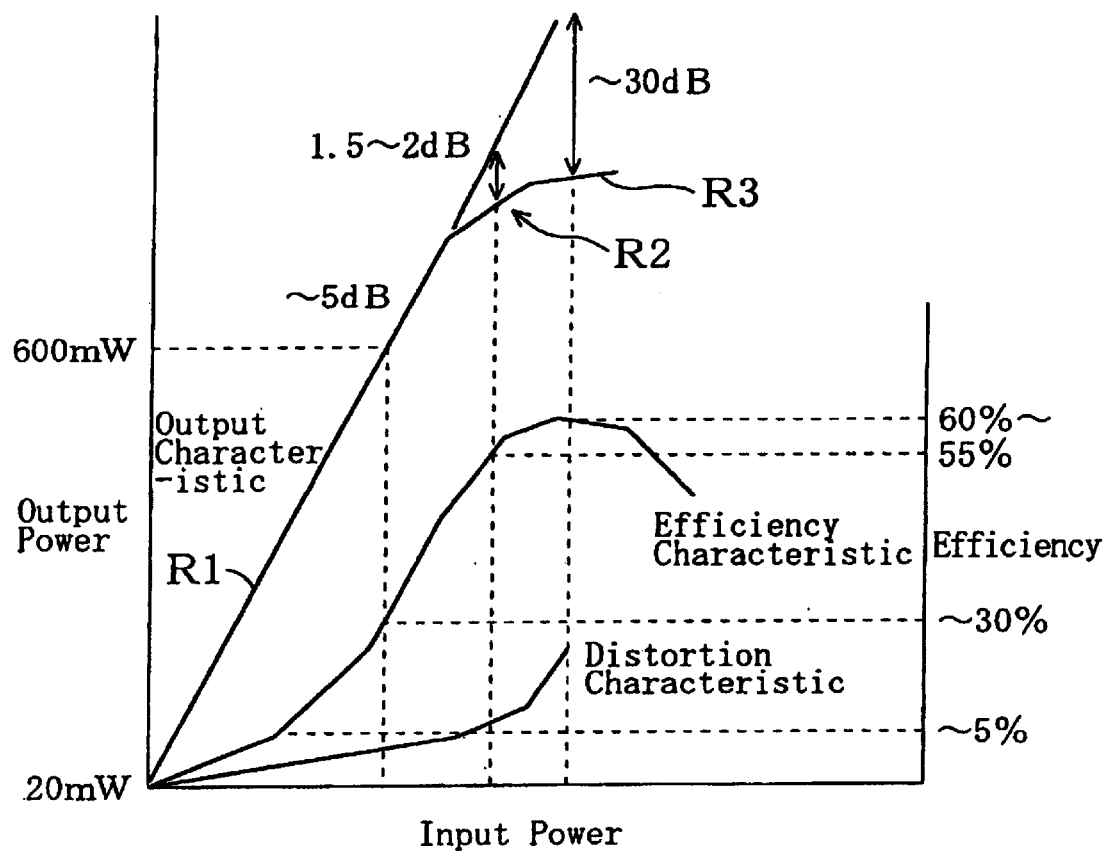
FIG. 29 shows the characteristics of a power amplifier determined as speculations for a mobile data terminal.

FIG. 29 shows the characteristics of a power amplifier determined as speculations for a mobile data terminal. The characteristics shown in FIG. 29 are an input-power/output-power characteristic, an efficiency characteristic, and a distortion characteristics for a GaAs-MESFET. As shown in the drawing, an output power can be divided into a linear region R1 where the efficiency is low but linearity is retained, a quasi-linear region R2 where the efficiency is relatively high, and a saturation region R3 where the output power is substantially saturated. In a PDC system using a narrow band of frequencies also, the power amplifier is used in the quasi-linear region R2 where the efficiency is relative high. In a W-CDMA system using a wide band of frequencies, the power amplifier is used in the linear region R1 where the efficiency is low. In general, the average power of a radio wave to be transmitted and a peak power has a large difference therebetween. To reduce distortion, therefore, the linear region R1 should be large.

As shown in FIG. 13, the SiC-MESFET having the multiple δ-doped layer has the drain current Ids which is high in saturation value and the drain voltage Vd which is high in breakdown value. Since the power P can be calculated by dividing the product of the drain current Ids and the drain voltage Vd by 8, the SiC-MESFET shown in FIG. 13 has the large linear region RI due to the high saturation value of the drain current and the high breakdown voltage. This allows the retention of linearity up to an output power as high as about 1 W. Accordingly, the linear region can be used in the PDC system, while the high efficiency is retained. In addition, the region where the efficiency lowers and the region where the distortion is increased shift to higher output powers. Since the function obtained by providing the multiple δ-doped layer in the MESFET according to the present embodiment is nearly the same as the function obtained in the SiC-MESFET, the same effects achieved by the SiC-MESFET can be expected.

HEMT

In the HEMT 40, the band gap of $In_{0.52}Al_{0.48}As$ as the second active region is larger than that of $In_{0.53}Ga_{0.47}As$ as the first active region, as shown in FIG. 18. Consequently, a discontinuity occurs between the respective conduction band edges in the multiple δ-doped InAlAs layer 13 and the InGaAs layer 17 so that a so-called heterobarrier is formed. When a voltage Vg is applied to the Schottky gate electrode 42, a depressed portion to which a two-dimensional electron gas is confined is formed in the region of the InGaAs layer 17 adjacent the interface between the InGaAs layer 17 and the multiple δ-doped InAlAs layer 13 due to a bend in the band as indicated by the broken line in the drawing. As a result, electrons are allowed to move at a high speed in the depressed portion. Since the present embodiment has provided the InAlAs layer 16 (in which ratios of components are $In_{0.52}Al_{0.48}As$) under the InGaAs layer 17, a discontinuity (heterobarrier) also occurs between the respective conduction band edges in the InGaAs layer 17 and the InAlAs layer 16. This allows more positive confinement of electrons to the InGaAs layer 17. The underlying InAlAs layer 16 need not necessarily be provided.

In the HEMT 40, a current from the drain electrode 45 passes through the InP layer 18 and the multiple δ-doped InAlAs layer 13 to flow in the region (channel region) of the InGaAs layer 17 adjacent the interface between the InGaAs layer 17 and the multiple δ-doped InAlAs layer 13. Thereafter, the current flows to the source electrode 44 after passing through the multiple δ-doped InAlAs layer 13 and the InP layer 18.

In the multiple δ-doped InAlAs layer 13 according to the present embodiment, carriers in the n-type doped layers 13a are so distributed as to spread out extensively to the undoped layers 13b under a quantum effect. If a bias is applied to the HEMT 40 in this state, carriers (electrons) are supplied to the channel layer of the InGaAs layer 17 through both of the n-type doped layers 13a and undoped layers 13b of the multiple δ-doped InAlAs layer 13, so that a large current flows in the channel region. Since the impurity concentration in each of the undoped layers 13b is low, impurity scattering is reduced in the undoped layer 13b. Accordingly, the resistance when carriers are supplied from the multiple δ-doped InAlAs layer 13 to the channel region is held low and the efficiency with which carriers are supplied is enhanced. This implements a HEMT with low power consumption and a large current.

When the HEMT 40 is in the OFF state, depletion layers expand from the undoped layers 13b to the n-type doped layers 13a in the multiple δ-doped InAlAs layer 13 so that the whole multiple δ-doped InAlAs layer 13 is depleted easily. This achieves a high breakdown voltage.

In the I–V characteristic (Drain Current Id–Drain voltage Vd Characteristic), therefore, the respective threshold values of the drain current Id and the drain voltage Vd (current and voltage values at a breakdown point) can be increased. Since the power P of the HEMT is represented by the following expression:

$$P = Iv \times Vd/8,$$

a HEMT with a particularly high power is obtainable. In short, a device for a power amplifier having a low ON-state resistance, a high power, and a high breakdown voltage can be obtained.

If a comparison is made between the power amplifier according to the present embodiment in which the HEMT is disposed and the conventional power amplifier they have the following differences therebetween. At the conventional base station, the amplified-signal transmitter which requires amplification of high power has four main amplifiers each comprising a HEMT or a MESFET disposed therein, as shown in FIG. 27. As a larger number of HEMTs or MESFETs are provided, however, it becomes more difficult to achieve impedance matching between the individual HEMTs or between the individual MESFETs and the difficulty of impedance matching increases as the frequency of an RF signal is higher.

By contrast, the present embodiment can provide a desired power by merely disposing one main amplifier 138 comprising a HEMT in the amplified-signal transmitting circuit. By thus reducing the number of HEMTs, the structure of an impedance matching circuit can be simplified in a circuit handling an RF signal in a high frequency range compared with a circuit in the conventional base station.

If each of the HEMT 40 and the MESFET 30 is provided, either of the devices can be used selectively depending on a frequency region. Specifically, the HEMT can be used selectively to amplify an RF signal in a frequency region on the millimeter-wave level. To amplify an RF signal in the lower frequency region, the MESFET can be used selectively.

If the BST film is formed to occupy an area which is, e.g., 5 mm square, the capacitor 50 provides a capacitance of about 22 μF since the BST film has a relative dielectric constant of about 1000 and the thickness thereof can be reduced to about 10 nm. In short, a capacitor occupying a small area and having a large capacitance can be formed.

If a conductor film having a spiral configuration with a line width of 9 μm is provided with a 4-μm spacing in an area which is about 5 mm square, the inductor 60 has about 160 turns and an inductance of 780 μH. In short, an inductor occupying a small area and satisfying desired specifications can be provided.

Each of the multilayer portions in the Schottky diode, the MESFET, and the HEMT may have only one heavily doped layer and only one lightly doped layer. Either one of the heavily doped layer and the lightly doped layer may be formed previously to the formation of the other. It is also possible to place two lightly doped layers (undoped layers) above and below one heavily doped layer. That is, the number of heavily doped layers may be different from the number of lightly doped layers.

Figure 14:
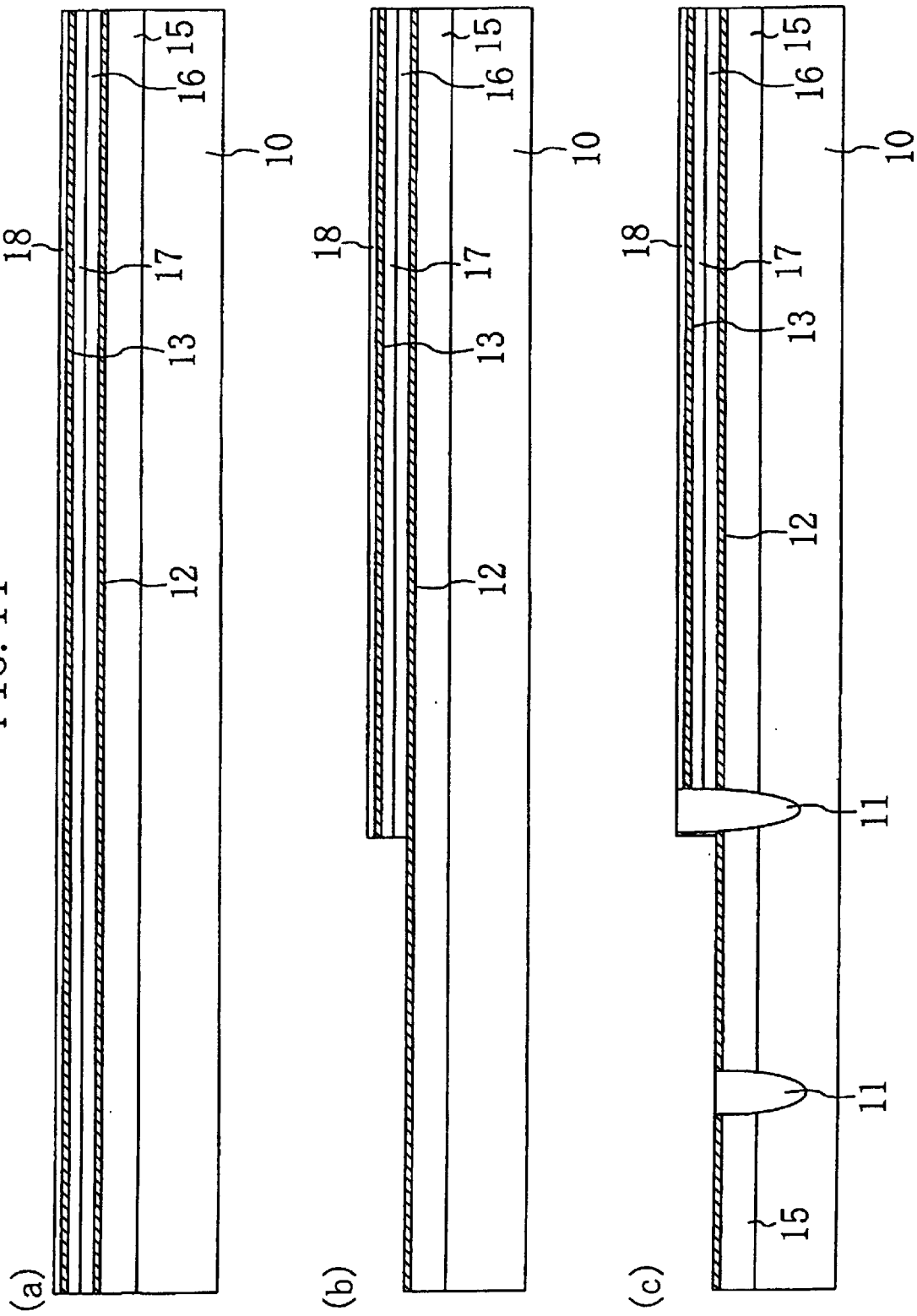
FIG. 14A to FIG. 14C are cross-sectional views illustrating process steps of fabricating the semiconductor device according to the embodiment from the formation of a multiple δ-doped InGaAs layer, a multiple δ-doped InAlAs layer, and the like to the formation of an isolation regions.
Figure 15:
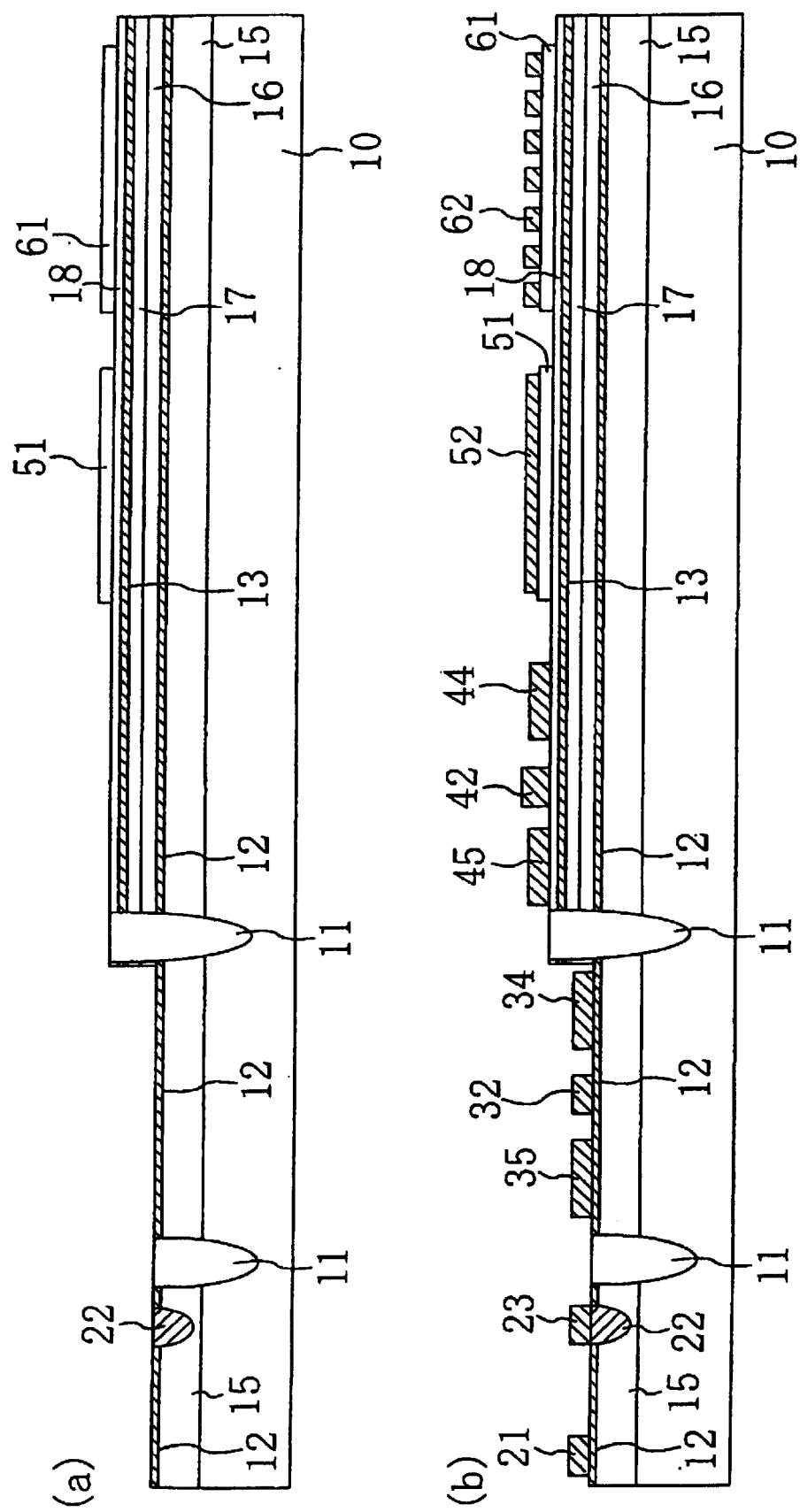
FIG. 15A and FIG. 15B are cross-sectional views illustrating the process steps of fabricating the semiconductor device according to the present embodiment from the formation of the respective electrodes of individual elements to the formation of a conductor film.
Figure 16:
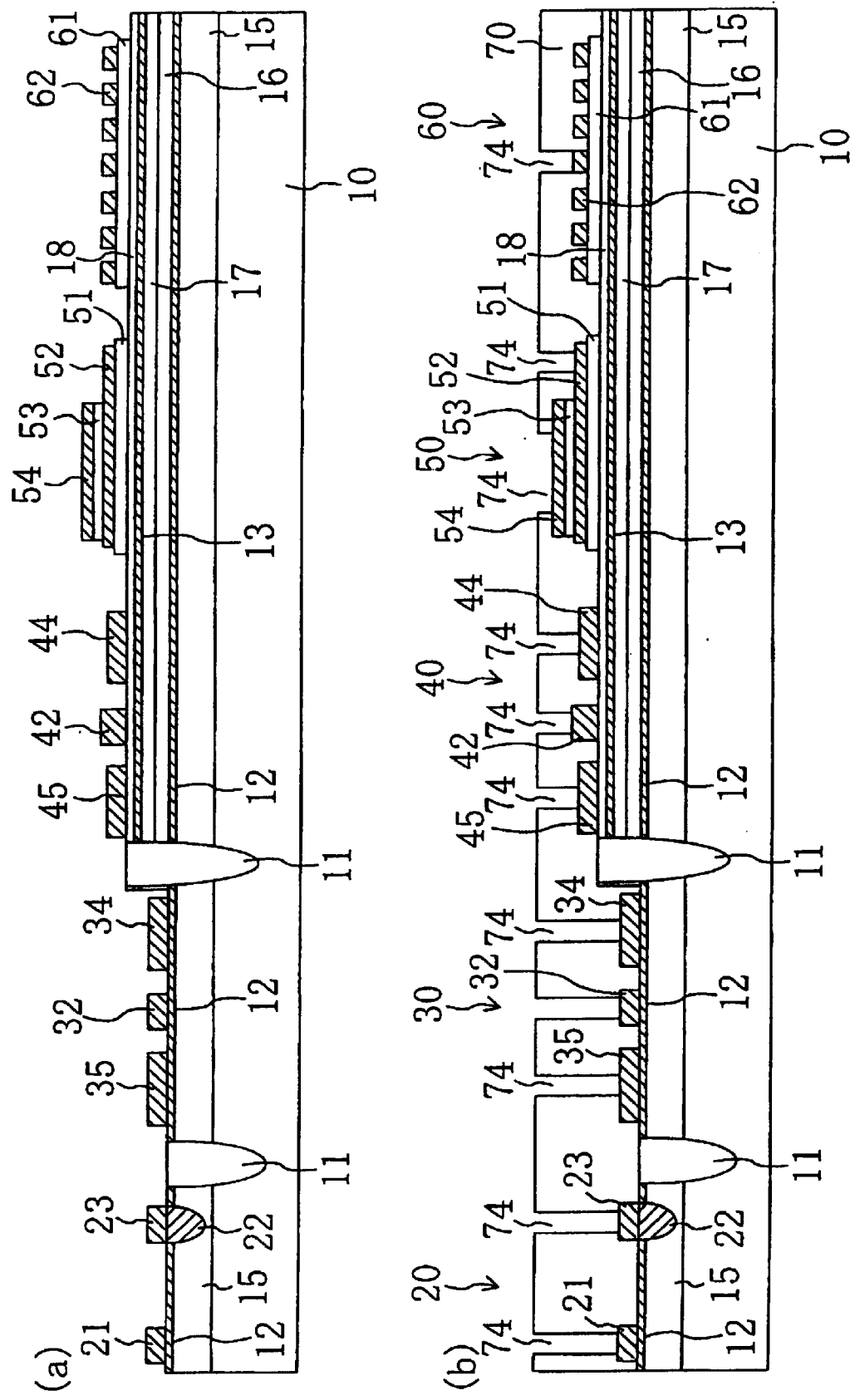
FIG. 16A and FIG. 16B are cross-sectional views illustrating the process steps of fabricating the semiconductor device according to the embodiment from the formation of the upper electrodes of capacitors to the formation of contact holes connecting to the respective conductor portions of the elements.

Referring to FIG. 14A to FIG. 16B, the process for fabricating the semiconductor device according to the present embodiment will be described. FIG. 14A to FIG. 14C are cross-sectional views illustrating the process steps of fabricating the semiconductor device according to the present embodiment from the formation of the multiple δ-doped InGaAs layer, the multiple δ-doped InAlAs layer, and the like to the formation of an isolation region. FIG. 15A and FIG. 15B are cross-sectional views illustrating the process steps of fabricating the semiconductor device according to the present embodiment from the formation of the respective electrodes of individual elements to the formation of a conductor film. FIG. 16A and FIG. 16B are cross-sectional views illustrating the process steps of fabricating the semiconductor device according to the present embodiment from the formation of the upper electrodes of capacitors to the formation of contact holes connecting to the respective conductor portions of the elements.

First, in the step shown in FIG. 14A, the semi-insulating InP substrate 10 doped with iron (Fe) at a high concentration and having a thickness of about 100 μm is prepared. After a surface of the InP substrate 10 is cleaned, the InP substrate 10 is placed in the chamber of an MBE system (molecular-beam epitaxial growth system). Then, source material beams of In, Al, and As for forming the InAlAs layer are supplied into the chamber to form the undoped InAlAs layer 15 (in which ratios of components are, e.g., $In_{0.52}Al_{0.48}As$).

Next, the supply of Si is controlled through the opening and closing of the shutter of a dopant supply unit, while source material beams for forming the InGaAs layer are supplied, whereby the multiple δ-doped InGaAs layer 12 ($In_{0.53}Ga_{0.47}As$ layer) with a thickness of about 70 nm is formed by the following procedure.

First, the supply of the dopant is halted, while the source material beams are supplied to the chamber. Specifically, the source material beams are supplied to a space above the InP substrate 10 with the shutter closed completely, whereby the undoped layer (lightly doped layer) 12b composed of an undoped InGaAs single crystal and having a thickness of about 10 nm is grown epitaxially on a principal surface of the InP substrate 10 in the chamber.

Next, Si (dopant) as an n-type impurity is supplied to the chamber, while the source material beams are supplied thereto, whereby the n-type doped layer (heavily doped layer) 12a composed of an InGaAs single crystal and having a thickness of about 1 nm is grown epitaxially on the undoped layer 12b in the chamber.

When the epitaxial growth of the n-type doped layer 12a is completed, the source material beams are supplied to the space above the InP substrate 10 by halting the supply of the dopant, i.e., with the shutter closed completed, whereby the undoped layer (lightly doped layer) 12b composed of an undoped InGaAs single crystal and having a thickness of about 10 nm is grown epitaxially on the principal surface of the InP substrate 10.

Each of the step of forming the n-type doped layer 12a by thus introducing the dopant through the opening and closing of the shutter, while simultaneously supplying the source material beams, and the step of forming the undoped layer 12b by thus supplying only the source material beams without supplying the dopant, while keeping the shutter closed, is repeated five times. As the uppermost layer, the undoped layer 12b is formed again to have a thickness larger by about 5 nm than that of each of the other undoped layers 12b. By the foregoing process, the multiple δ-doped InGaAs layer 12 composed of the n-type doped layers 12a and the undoped layers 12b which are stacked alternately is formed.

After the undoped layer 12b composed of InGaAs with a thickness of about 10 nm is formed as the uppermost layer of the multiple δ-doped InGaAs layer 12, an InP layer with a thickness of about 5 nm may also be grown epitaxially as an etching stopping layer.

Next, the undoped InAlAs layer 16 (in which ratios of components are $In_{0.52}Al_{0.48}As$) with a thickness of about 10 nm is formed on the multiple δ-doped InGaAs layer 12 by switching the source material beams. Then, the undoped InGaAs layer 17 (in which ratios of components are $In_{0.53}Ga_{0.47}As$) with a thickness of about 10 nm is formed on the InAlAs layer 17 by switching the source material beams.

Thereafter, the five n-type doped layers (heavily doped layers) 13a each having a thickness of about 1 nm and the six undoped layers 13b each having a thickness of about 10 nm are stacked by supplying the source material beams for forming the InAlAs layer and controlling the opening and closing of the shutter, similarly to the foregoing procedure of forming the multiple δ-doped InGaAs layer 12, whereby the multiple δ-doped InAlAs layer 13 with a thickness of about 65 nm is formed. At this time, the undoped layers 13b are formed as the uppermost and lowermost layers.

Then, the InP layer 18 composed of an InP single crystal and having a thickness of about 5 nm is grown epitaxially as the etching stopping layer on the multiple δ-doped InAlAs layer 13 by switching the source material beams.

Next, in the step shown in FIG. 14B, the regions of the InP layer 18, the multiple δ-doped InAlAs layer 13, the InGaAs layer 17, and the InAlAs layer 16 in which the Schottky diode 20 and the MESFET 30 are to be formed are removed by selective etching so that the multiple δ-doped InGaAs layer 12 is exposed in each of the regions in which the Schottky diode 20 and the MESFET 30 are to be formed.

Next, in the step shown in FIG. 14C, trenches for forming the isolation regions are formed in the substrate and a silicon oxide film is buried in each of the trenches to form the isolation regions 11.

Next, in the step shown in FIG. 15A, the electrode withdrawn layer 22 for the Schottky diode 20 is formed by implanting an n-type impurity (e.g., silicon ions $Si^+$). At this time, an implant mask composed of a silicon dioxide film or the like which covers the region other than the region in which the n-type impurity ions are to be implanted and has an opening corresponding to the region in which the n-type impurity ions are to be implanted is formed on the substrate. Then, silicon ions (Si+) or the like are implanted from above the implant mask. Further, annealing for activating the impurity is performed at 800° C. for 10 minutes, whereby the electrode withdrawn layer 22 containing the n-type impurity at a concentration of about $1\times10^{18}$ atoms $cm^{-3}$ is formed. At this time, silicon ions ($Si^+$) are implanted into the substrate in, e.g., six steps of ion implantation using different implant energies. For example, the first ion implantation is performed with an acceleration voltage of 180 keV and at a dose of $1.5\times10^{14}$ atoms $cm^{-2}$, the second ion implantation is performed with an acceleration voltage of 130 keV and at a dose of $1\times10^{14}$ atoms $cm^{-2}$, the third ion implantation is performed with an acceleration voltage of 110 keV and at a dose of $5\times10^{13}$ atoms $cm^{-2}$, the fourth ion implantation is performed with an acceleration voltage of 100 keV and at a dose of $8\times10^{13}$ atoms $cm^{-2}$, the fifth ion implantation is performed with an acceleration voltage of 60 kev and at a dose of $6\times10^{13}$ atoms $cm^{-2}$, and the sixth ion implantation is performed with an acceleration voltage of 30 kev and at a dose of $5\times10^{13}$ atoms $cm^{-2}$. In any of the six ion implantations, the direction in which ions are implanted is 7. tilted from a normal to the InP substrate 10 and the implant depth is about 0.3 μm.

After the implanted mask is removed, a SiN film with a thickness of about 0.4 μm is formed by plasma CVD on the substrate and patterned to form the underlying insulating film 51 and the dielectric film 61 on the respective regions of the multiple δ-doped InAlAs layer 13 on which the capacitor 50 and the inductor 60 are to be formed.

Next, in the step shown in FIG. 15B, a TiPtAu film is vapor-deposited on each of the respective regions of the multiple δ-doped InGaAs layer 12 on which the Schottky diode and the MESFET are to be formed and the region of the InP layer 18 on which the HEMT is to be formed. Then, annealing is performed at 300° C. for 3 minutes, whereby the Schottky electrode 21 composed of the TiPtAu film and the Schottky gate electrodes 32 and 42 each composed of the TiPtAu film and having a gate length of about 1 μm are formed. Then, a TiPtAu film is formed by vacuum vapor deposition on each of the MESFET formation region and the HEMT formation region, whereby the source electrodes 34 and 44 and the drain electrodes 35 and 45 are formed. At this time, the TiPtAu film is also vapor-deposited simultaneously on the withdrawn electrode layer 22 of the Schottky diode 20 so that the ohmic electrode 23 composed of the TiPtAu film is formed. On the other hand, platinum (Pt) is vapor-deposited on the underlying insulating film 51 of the capacitor 50 so that the lower electrode 52 composed of platinum is formed.

Next, a resist film having a spiral opening is formed on the region on which the inductor 60 is to be formed. A Cu film with a thickness of about 4 μm is deposited on the resist film and lifted off, whereby the spiral conductor film 62 is left on the dielectric film 61. It is also possible to compose the conductor film of an aluminum alloy film instead of the Cu film. In that case, the aluminum alloy film is deposited and patterned by RIE dry etching using a $Cl_2$ gas and a $BCl_3$ gas, thereby forming the spiral conductor film 62.

Next, in the step shown in FIG. 16A, a BST film is formed by sputtering on the lower electrode of the capacitor 50. Then, a platinum (Pt) film is formed by vapor deposition on the BST film. The platinum film and the BST film are patterned into a specified configuration to form the upper electrode 54 and the capacitance insulating film 53.

Next, in the step shown in FIG. 16B, the interlayer insulating film 70 composed of a silicon dioxide film is deposited on the substrate. The interlayer insulating film 70 is formed with contact holes 74 reaching the Schottky electrode 21 and ohmic electrode 23 of the Schottky diode 20, the Schottky gate electrode 32 and source and drain electrodes 34 and 35 of the MESFET 30, the gate, source, and drain electrodes 42, 44, and 45 of the HEMT 40, the upper and lower electrodes 54 and 52 of the capacitor 50, and the center and outer circumferential end portions of the spiral conductor film 62 of the inductor 60.

Thereafter, an aluminum alloy film is formed in each of the contact holes 72 and on the interlayer insulating film 70 and patterned to provide the structure of the semiconductor device shown in FIG. 7.

Although the InGaAs layer and the InAlAs layer have been grown epitaxially by using an MBE technique in the foregoing description of the fabrication process, the InGaAs layer and the InAlAs layer may also be grown epitaxially by using a MOCVD technique.

Thus, the fabrication method according to the present embodiment allows easy formation of the Schottky diode, the MESFET, the HEMT, the resistor element, the inductor, and the like on the single InP substrate. Since the HEMT, the MESFET, and the Schottky diode are allowed to be provided on the common InP substrate by forming the Schottky diode in the lateral configuration, as described above, integration is particularly facilitated. Since the passive element such as the inductor is also allowed to be mounted on the common SiC substrate, further scaling down is achievable.

Although the present embodiment has used the InP substrate, the present embodiment is applicable not only to a semiconductor device provided on the InP substrate but also to all semiconductor devices provided on a substrate composed of GaAs, GaN, AlGaAs, AlGaN, SiGe, SiGeC, or the like. In that case also, the provision of the multilayer portion composed of the δ-doped layers and the lightly doped layers (including undoped layers) allows improvements in channel mobility and breakdown voltage by using reduced scattering by impurity ions and depletion of the whole channel region in the OFF state.

Example 1 of Specific Structure of HEMT

Figure 17:
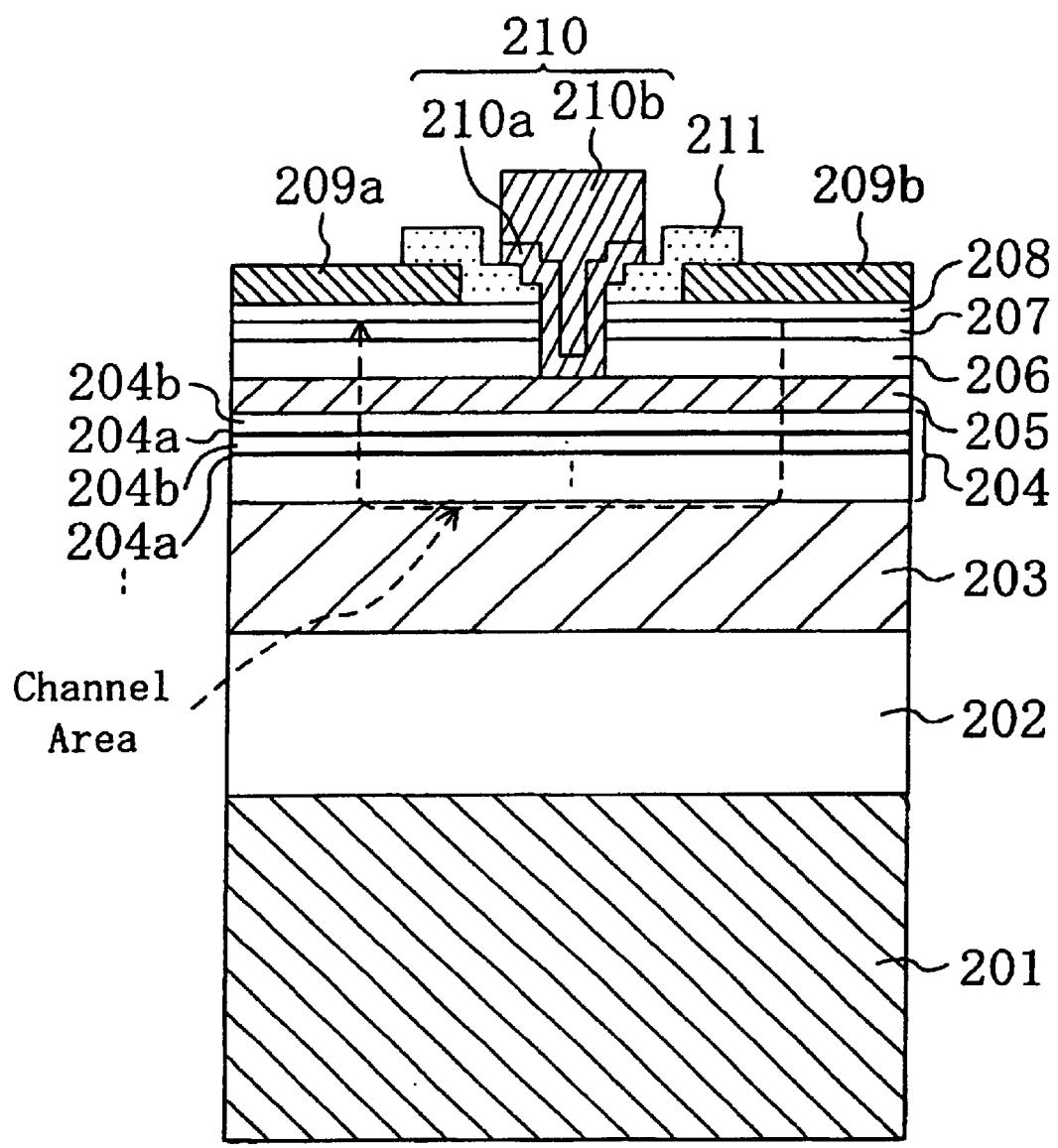
FIG. 17 is a cross-sectional view of a HEMT in a first example of the embodiment of the present invention.

FIG. 17 is a schematic cross-sectional view showing a specific structure of the HEMT in a first example of the embodiment of the present invention. As shown in the drawing, an undoped InAlAs layer 202 (in which ratios of components are $In_{0.52}Al_{0.48}As$) with a thickness of about 200 nm, an undoped InGaAs layer 203 (in which ratios of components are $In_{0.53}Ga_{0.47}As$) with a thickness of about 15 nm, a multiple δ-doped InAlAs layer 204 (in which ratios of components are $In_{0.52}Al_{0.48}As$) composed of five n-type doped layers 204a (containing Si as an impurity) each having a thickness of about 1 nm and six undoped layers 204b each having a thickness of about 10 nm which are alternately stacked (of which the uppermost and lowermost layers are undoped) to serve as a carrier supplying layer with a thickness of about 65 nm, an InP layer 205 serving as an etching stopping layer with a thickness of about 5 nm, an n-InAlAs layer 206 (in which ratios of components are $In_{0.52}Al_{0.48}As$) doped with silicon (Si) and having a thickness of about 3 nm, an $n^+$-InAlAs layer 207 (in which ratios of components are $In_{0.52}Al_{0.48}As$) doped with silicon (Si) as an n-type impurity at a high concentration and having a thickness of about 200 nm, and an $n^+$-InGaAs layer 508 (in which ratios of components are $In_{0.53}Ga_{0.47}As$) doped with silicon (Si) as an n-type impurity at a high concentration and having a thickness of about 15 nm are stacked successively on a semi-insulating InP substrate 201 doped with iron (Fe) at a high concentration and having a thickness of about 100 μm. There are also provided ohmic source/drain electrodes 209a and 209b which are composed of a Ti/Pt/Au film and provided in mutually spaced relation on the $n^+$-InGaAs layer 208, a Schottky gate electrode 210 composed of a WSiN film 210a which penetrates respective parts of the n-InAlAs layer 206, the $n^+$-InAlAs layer 207, and the $n^+$-InGaAs layer 208 to be in contact with the InP layer 205 and of an overlying Ti/Pt/Au film 210b, and an insulating layer 211 composed of a $SiO_2$/SiNi film for providing a dielectric isolation between the Schottky electrode 210 and the source/drain electrodes 209a and 209b.

In the HEMT, if a voltage is applied between the source and drain electrodes 209a and 209b, a current flows between the source and the drain. If a voltage is applied between the Schottky gate electrode 210 and the source electrode 209a such that the Schottky gate electrode 210 has a higher voltage (reverse voltage), the source-to-drain current is modulated in accordance with the voltage applied to the Schottky gate electrode 210 so that a switching operation is performed.

Figure 18A:
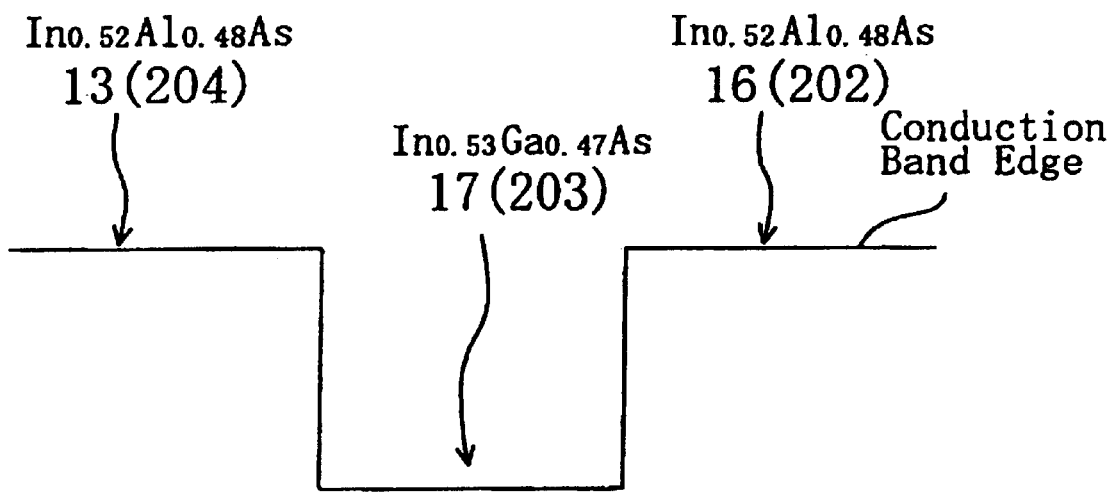
FIG. 18A and FIG. 18B are energy band diagrams schematically showing the respective states of a band during no application of a bias to a heterojunction portion in the HEMT of the first example and during the application thereof.
Figure 18B:
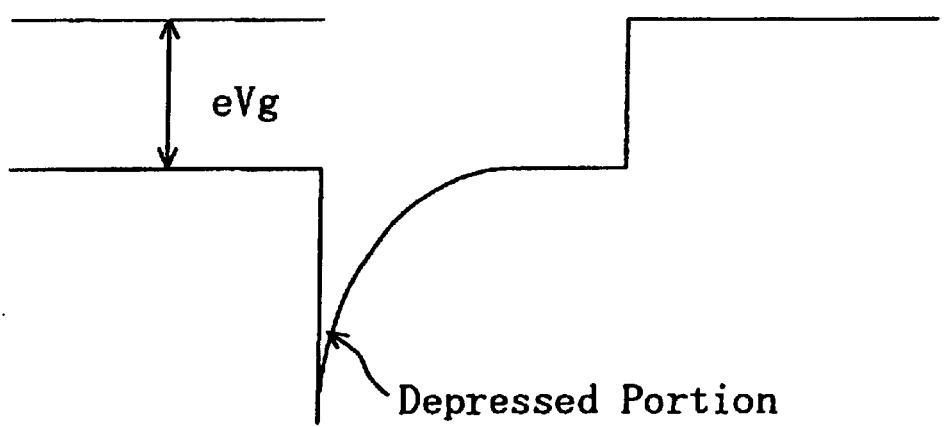

FIG. 18A and FIG. 18B are energy band diagrams schematically showing the respective states of a band during no application of a bias to a heterojunction portion in the HEMT of the present example and during the application thereof.

As shown in FIG. 18A, since the band gap of $In_{0.52}Al_{0.48}As$ is larger than that of $In_{0.53}Ga_{0.47}As$ during no application of a bias, a discontinuity occurs between the respective conduction band edges of the multiple δ-doped InAlAs layer 204 and the InGaAs layer 203 so that a so-called heterobarrier is formed. When a voltage Vg is applied to the Schottky gate electrode 210 (during the application of a bias), a depressed portion to which a two-dimensional electron gas is confined is formed in the region of the InGaAs layer 203 adjacent the interface between the InGaAs layer 203 and the multiple δ-doped InAlAs layer 204 due to a bend in the band as shown in FIG. 18B. As a result, electrons are allowed to move at a high speed in the depressed portion. Since the present embodiment has provided the InAlAs layer 202 (in which ratios of components are $In_{0.52}Al_{0.48}As$) under the InGaAs layer 203, a discontinuity (heterobarrier) also occurs between the respective conduction band edges of the InAlAs layer 202 and the InGaAs layer 203. This allows more positive confinement of electrons to the InGaAs layer 203. The underlying InAlAs layer 202 need not necessarily be provided.

In the HEMT, a current from the drain electrode 209b passes through the individual layers 208, 207, 206, and 205 and the multiple δ-doped InAlAs layer 204 in this order to flow in the region (channel region) of the InGaAs layer 203 adjacent the interface between the InGaAs layer 203 and the multiple δ-doped InAlAs layer 204. Thereafter, the current flows to the source electrode 209a after passing through the multiple δ-doped InAlAs layer 204 and the individual layers 205, 206, 207, and 208 in this order (see the broken arrow in FIG. 17).

In the multiple δ-doped InAlAs layer 204 according to the present embodiment, carriers in the n-type doped layers 204a are so distributed as to spread out extensively to the undoped layers 204b under a quantum effect. If a bias is applied to the HEMT in this state, carriers (electrons) are supplied to the channel layer of the InGaAs layer 203 through both of the n-type doped layers 204a and undoped layers 204b of the multiple δ-doped InAlAs layer 204, so that a large current flows in the channel region. Since the impurity concentration in each of the undoped layers 204b is low, impurity scattering is reduced in the undoped layer 204b. Accordingly, the resistance when carriers are supplied from the multiple δ-doped layer 204 to the channel region is held low and the efficiency with which carriers are supplied is enhanced. This implements a HEMT with low power consumption and a large current.

When the HEMT is in the OFF state, depletion layers expand from the undoped layers 204b to the n-type doped layers 204a in the multiple δ-doped InAlAs layer 204 so that the whole multiple δ-doped InAlAs layer 204 is depleted easily. This achieves a high breakdown voltage.

In the I–V characteristic (Drain Current Id–Drain Voltage Vd Characteristic), therefore, the saturation value of the drain current Id and the threshold value of the drain voltage Vd (voltage value at a breakdown point) can be increased. Since the power P of the HEMT is represented by the following expression:

$P = Iv \times Vd/8,$ a HEMT with a particularly high power is obtainable. In short, a device for a power amplifier with a low ON-state resistance, a high power, and a high breakdown voltage can be obtained.

Since a gate capacitance can be reduced particularly in this example of the structure due to a T-shaped structure in which the gate length can be minimized, the structure is suitable for a HEMT handling an RF signal in a high frequency region such as the millimeter-wave region. It is also possible to adopt the structure of the HEMT shown in FIG. 17 to the HEMT 40 shown in FIG. 7.

In the structure of each of the HEMTs shown in FIGS. 7 and 17, the impurity concentration in each of the five n-type doped layers 13a (204a) of the multiple δ-doped InAlAs layer can be adjusted properly depending on a frequency region in which it is used, an amplification factor, and the like such that, e.g., a profile in which the concentration gradually decreases exponentially in the upward direction is provided.

Example 2 of Specific Structure of HEMT

Figure 19:
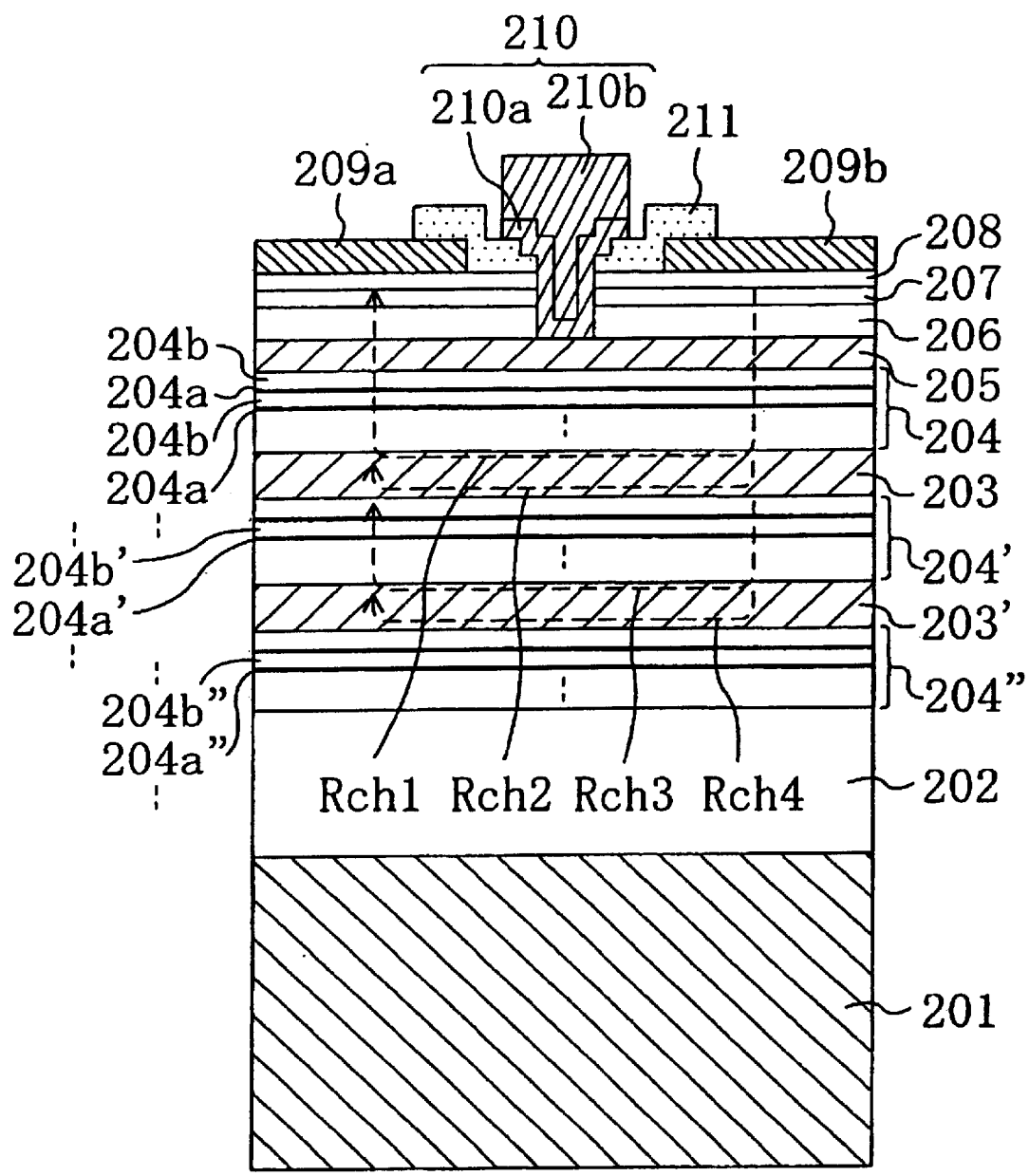
FIG. 19 is a cross-sectional view of a HEMT in a second example of the embodiment of the present invention.

FIG. 19 is a schematic cross-sectional view showing a specific structure of the HEMT in a second example of the embodiment of the present invention. In the present example, as shown in the drawing, an undoped InAlAs layer 202 (in which ratios of components are $In_{0.52}Al_{0.48}As$) with a thickness of about 200 nm, a multiple δ-doped InAlAs layer 204" (in which ratios of components are $In_{0.52}Al_{0.48}As$) composed of five n-type doped layers 204a (containing Si as an impurity) each having a thickness of about 1 nm and six undoped layers 204b each having a thickness of about 10 nm which are alternately stacked (of which the uppermost and lowermost layers are undoped) to serve as a carrier supplying layer with a thickness of about 65 nm, an undoped InGaAs layer 203' (in which ratios of components are $In_{0.53}Ga_{0.47}As$) with a thickness of about 15 nm, a multiple δ-doped InAlAs layer 204' (in which ratios of components are $In_{0.52}Al_{0.48}As$) composed of five n-type doped layers 204a (containing Si as an impurity) each having a thickness of about 1 nm and six undoped layers 204b each having a thickness of about 10 nm which are alternately stacked (of which the uppermost and lowermost layers are undoped) to serve as a carrier supplying layer with a thickness of about 65 nm, an undoped InGaAs layer 203 (in which ratios of components are $In_{0.53}Ga_{0.47}As$) with a thickness of about 15 nm, a multiple δ-doped InAlAs layer 204 (in which ratios of components are $In_{0.52}Al_{0.48}As$) composed of five n-type doped layers 204a (containing Si as an impurity) each having a thickness of about 1 nm and six undoped layers 204b each having a thickness of about 10 nm which are alternately stacked (of which the uppermost and lowermost layers are undoped) to serve as a carrier supplying layer with a thickness of about 65 nm, an InP layer 205 serving as an etching stopping layer with a thickness of about 5 nm, an n-InAlAs layer 206 (in which ratios of components are $In_{0.52}Al_{0.48}As$) doped with silicon (Si) and having a thickness of about 3 nm, an n$^+$-InAlAs layer 207 (in which ratios of components are $In_{0.52}Al_{0.48}As$) doped with silicon (Si) as an n-type impurity at a high concentration and having a thickness of about 200 nm, and an n$^+$-InGaAs layer 208 (in which ratios of components are $In_{0.53}Ga_{0.47}As$) doped with silicon (Si) as an n-type impurity at a high concentration and having a thickness of about 15 nm are stacked successively on a semi-insulating InP substrate 201 doped with iron (Fe) at a high concentration and having a thickness of about 100 μm. In short, the structure of the second example is obtained by providing the structure of the first example with two more multiple δ-doped layers.

The structures of the other components of the HEMT in the present example are the same as in the first example. In the HEMT of the present example, if a voltage is applied between the source and drain electrodes 209a and 209b, a current flows between the source and the drain. If a voltage is applied between the Schottky gate electrode 210 and the source electrode 209a such that the Schottky gate electrode 210 has a higher voltage (reverse voltage), the source-to-drain current is modulated in accordance with the voltage applied to the Schottky gate electrode 210 so that a switching operation is performed.

FIG. 20A and FIG. 20B are energy band diagrams schematically showing the respective states of a band during no application of a bias to a heterojunction portion in the HEMT of the present example and during the application thereof.

As shown in FIG. 20A, since the band gap of $In_{0.52}Al_{0.48}As$ is larger than that of $In_{0.53}Ga_{0.47}As$ during no application of a bias, a discontinuity occurs between the respective conduction band edges of the multiple δ-doped InAlAs layer 204 and the InGaAs layer 203, of the InGaAs layer 203 and the multiple δ-doped InAlAs layer 204', of the multiple δ-doped InAlAs layer 204' and the InGaAs layer 203', and of the InGaAs layer 203' and the multiple δ-doped InAlAs layer 204" so that a so-called heterobarrier is formed.

When a voltage Vg is applied to the Schottky gate electrode 210 (during the application of a bias), a depressed portion to which a two-dimensional electron gas is confined is formed in each of the region of the InGaAs layer 203 adjacent the interface between the InGaAs layer 203 and the multiple δ-doped InAlAs layer 204, the region of the InGaAs layer 203 adjacent the interface between the InGaAs layer 203 and the multiple δ-doped InAlAs layer 204', the region of the InGaAs layer 203' adjacent the interface between the InGaAs layer 203' and the multiple δ-doped InAlAs layer 204', and the region of the InGaAs layer 203' adjacent the interface between the InGaAs layer 203' and the multiple δ-doped InAlAs layer 204" due to a bend in the band, as shown in FIG. 20B. In short, a total of four depressed portions are formed in the respective regions of the InGaAs layers 203 adjacent the upper and lower surfaces thereof and in the respective regions of the InGaAs layers 203' adjacent the upper and lower surfaces thereof. Each of the depressed portions functions as a channel region in which electrons move at a high speed. Thus, in the HEMT of the present example, the first to fourth channel regions Rch1 to Rch4 are formed as shown in FIG. 19 and hence the HEMT of the present embodiment may be referred to as a multi-channel HEMT.

Since the total of four channel regions are formed in the multi-channel HEMT of the present example, the concentration of the two-dimensional electron gas is further increased (e.g., nearly fourfold) compared with the first example having only one channel region.

In the multi-channel HEMT, a current from the drain electrode 209b passes through the InP layer 205 and the multiple δ-doped InAlAs layer 204 and then part of the current flows in the two regions (the first channel region Rch1 and the second channel region Rch2) of the InGaAs layer 203 adjacent the respective interfaces between the InGaAs layer 203 and the multiple δ-doped InAlAs layer 204 and between the InGaAs layer 203 and the multiple δ-doped InAlAs layer 204'. Thereafter, the current flows to the source electrode 209a after passing through the multiple δ-doped InAlAs layer 204 and the InP layer 205. The remaining current passes through the multiple δ-doped InAlAs layer 204' to flow in the two regions (the third channel region Rch3 and the fourth channel region Rch4) of the InGaAs layer 203' adjacent the respective interfaces between the InGaAs layer 203' and the multiple δ-doped InAlAs layer 204' and between the InGaAs layer 203' and the multiple δ-doped InAlAs layer 204". Thereafter, the current flows to the source electrode 209a through the multiple δ-doped InAlAs layer 204', the InGaAs layer 203, the multiple δ-doped InAlAs layer 204, and the InP layer 205.

In the multiple δ-doped InAlAs layers 204, 204', and 204" according to the present embodiment, carriers in the n-type doped layers 204a, 204a' and 204" are so distributed as to spread out extensively to the undoped layers 204b, 204b', and 204". If a bias is applied to the HEMT in this state, carriers (electrons) are supplied from the multiple δ-doped InAlAs layer 204 to the first channel region Rch1, from the multiple δ-doped InAlAs layer 204' to the second and third channel regions Rch2 and Rch3, and from the multiple δ-doped InAlAs layer 204" to the fourth channel region Rch4. In other words, carriers (electrons) are supplied to each of the channel regions through both of the n-type doped layers and undoped layers of any of the multiple δ-doped InAlAs layers, so that a large current flows in each of the channel regions. Since the impurity concentration in each of the undoped layers is low as described in the first example, impurity scattering is reduced in the undoped layer. Accordingly, the resistance when carriers are supplied from any of the multiple δ-doped layers to each of the channel regions is held low and the efficiency with which carriers are supplied is enhanced. This implements a HEMT with low power consumption and a large current.

In the multi-channel HEMT of the present example, in particular, the total of four channel regions are formed so that a HEMT with lower power consumption and a larger current (e.g., nearly fourfold) is implemented than in the first example having only one channel region.

When the HEMT is in the OFF state, depletion layers expand from the undoped layers 204b, 204b', and 204b" to the n-type doped layers 204a, 204a', and 204" in the multiple δ-doped InAlAs layers 204, 204', and 204" so that the whole multiple δ-doped InAlAs layers 204, 204', and 204" are depleted easily. This achieves a high breakdown voltage.

In the I–V characteristic (Drain Current Id–Drain Voltage Vd Characteristic), therefore, the saturation value of the drain current Id and the threshold value of the drain voltage Vd (voltage value at a breakdown point) can further be increased than in the first example. As described above, since the power P of the HEMT is represented by the following expression:

$$P = Iv \times Vd/8,$$

a multi-channel HEMT with a particularly high power is obtainable. In short, a device for a power amplifier having a lower ON-state resistance and a higher power than the HEMT of the first example and a breakdown voltage equal to that of the HEMT of the first example can be obtained.

For example, a structure of a so-called double-channel HEMT in which two high-breakdown-voltage doped layers are provided above and below an intrinsic semiconductor layer and two channel regions are formed in the upper and lower portions of the intrinsic semiconductor layer is disclosed in a document (HOS based algorithm for autofocusing of spotlight SAR images F. Berizzi, G. Corsini and Gini "ELECTRONICS LETTERS 27, Mar. 1997 Vol. 33 No.7"). The double-channel HEMT is so configured as to supply carriers from each of the high-breakdown-voltage doped layers to each of the channel regions. If the impurity concentration is increased in each of the high-breakdown-voltage doped layers of the conventional double-channel HEMT, however, an amount of current in the channel region can be increased, while the breakdown voltage is reduced. If the impurity concentration is reduced for a higher breakdown voltage, on the other hand, an amount of current in the channel region is reduced. Thus, it has been difficult to provide a sufficiently high power P represented by the expression:

$$P=Iv \times Vd/8.$$

By contrast, the multi-channel HEMT of the present example achieves an increased amount of current and a higher breakdown voltage at the same time so that the power is increased.

Since a gate capacitance can be reduced particularly in this example of the structure due to a T-shaped structure in which the gate length can be minimized, the structure is suitable for a HEMT handling an RF signal in a high frequency region such as a millimeter-wave region. It is also possible to adopt the structure of the HEMT shown in FIG. 19 to the HEMT 40 shown in FIG. 7.

In the HEMT shown in FIG. 19, the amounts of current in the respective channel regions Rch1, Rch2, Rch3, and Rch4 need not necessarily be uniform. The ratio among the amounts of current in the respective channel regions Rch1, Rch2, Rch3, and Rch4 can be changed variously by adjusting the respective impurity concentrations and film thicknesses of the undoped layers 204$b$, 204$b'$, and 204$b''$ and the n-type doped layers 204$a$, 204$a'$, and 204$a''$ in the multiple δ-doped InGaAs layers 204, 204', and 204'', the numbers of stacked layers in the respective multiple δ-doped InGaAs layers 204, 204', and 204'', the respective impurity concentrations and film thicknesses in the InGaAs layers 203 and 203', the impurity concentration and film thickness of the InP layer 205, and the like. The ratios among the amounts of current in the respective channel regions can be determined selectively depending on the type of a semiconductor device in which the HEMT is used.

It has been difficult for the conventional double-channel HEMT to provide a large linear region in an input-power/output-power characteristic as shown in FIG. 29, since the ratios among the amounts of current in the respective channel regions vary as the input power is increased. By contrast, the multi-channel HEMT of the present example provides a large linear region since the ON-state resistance in each of the multiple δ-doped layers is low and therefore the ratios among the amounts of current flowing in the respective channel regions can be held at a nearly constant value. Thus, a HEMT with reduced distortion and a high power can be implemented.

In the structure of the HEMT shown in FIG. 19, the impurity concentration in each of the five n-type doped layers of each of the multiple δ-doped InAlAs layers can be adjusted properly depending on a frequency region in which it is used, an amplification factor, and the like such that, e.g., a profile in which the concentration gradually decreases exponentially in the upward direction is provided.

Although the four channel regions are provided in the HEMT of the second example shown in FIG. 19, it is also possible to implement a structure in which two or three channel regions or five or more channel regions are provided. If the multiple δ-doped InAlAs layer 204'' and the multiple δ-doped InGaAs layer 203' are removed from the HEMT of the present example, a structure having only two channel regions, which are the first and second channel regions Rch1 and Rch2 formed in the InGaAs layer 203, is obtainable. If the multiple δ-doped InAlAs layer 204'' is removed from the HEMT of the present example, a structure having only three channel regions, which are the first and second channel regions Rch1 and Rch2 formed in the InGaAs layer 203 and the third channel region Rch3 formed in the InGaAs layer 203', is obtainable. If an InGaAs layer having substantially the same structure as each of the InGaAs layers 203 and 203' is provided below the multiple δ-doped InAlAs layer 204'' of the HEMT according to the present example, five channel regions are formed. If an InGaAs layer having substantially the same structure as each of the InGaAs layers 203 and 203' and a multiple δ-doped InAlAs layer having basically the same structure as each of the multiple δ-doped InAlAs layers 204, 204', and 204'' are provided below the multiple δ-doped InAlAs layer 204'' of the HEMT according to the present example, sixth channel regions are formed. By alternately increasing the number of such InGaAs layers or the number of such multiple δ-doped InAlAs layers by one, therefore, the number of channel regions is increased by one.

Structures of Components of Communication System

Figure 21:
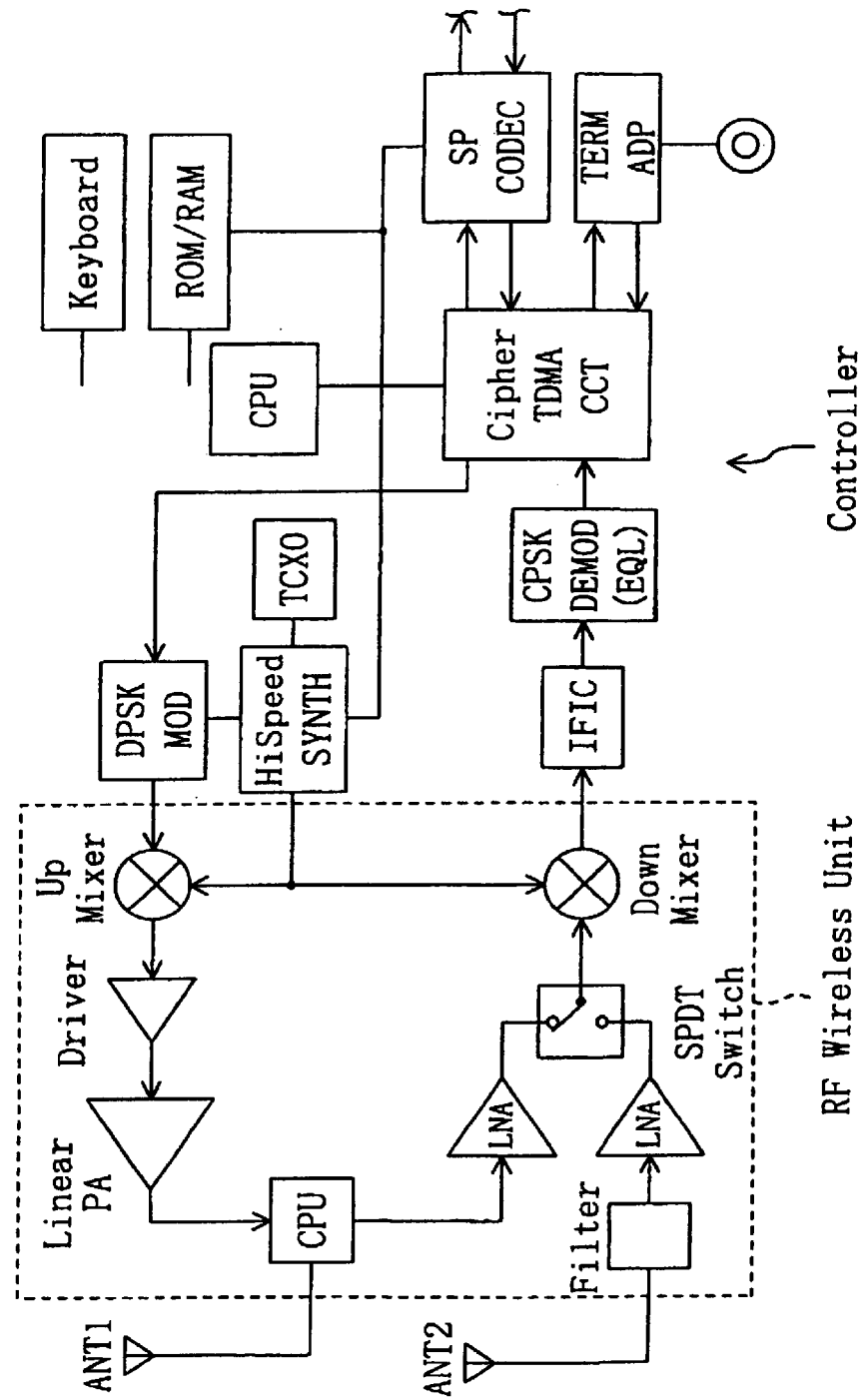
FIG. 21 schematically shows an example of a mobile phone terminal (mobile station) in the communication system shown in FIG. 2.

FIG. 21 schematically shows an example of the radio-wave terminal (mobile station) 102 in the communication system shown in FIG. 2. A PDC system is adopted here. The RF wireless unit shown in FIG. 21 includes a received-signal amplifier 122 and the amplified-signal transmitter 123 shown in FIG. 2. The controller of the radio-wave terminal 102 as the mobile station shown in FIG. 2 is composed of the CPU, the cipher TDMA-CCT, the SP-CODEC, the ROM/RAM, the TERM-ADP, the DPSK-MOD, the HiSpeedSYNTH, the IF-IC, and the CPSK-DEMOD (EQL) shown in FIG. 21.

The linear PA (power amplifier) in the RF wireless unit shown in FIG. 21 can be composed of, e.g., the circuit having the HEMT shown in FIG. 19 disposed therein. In that case, the HEMT in each of circuits for the controller can be composed of the HEMT shown in FIG. 19

Figure 22:
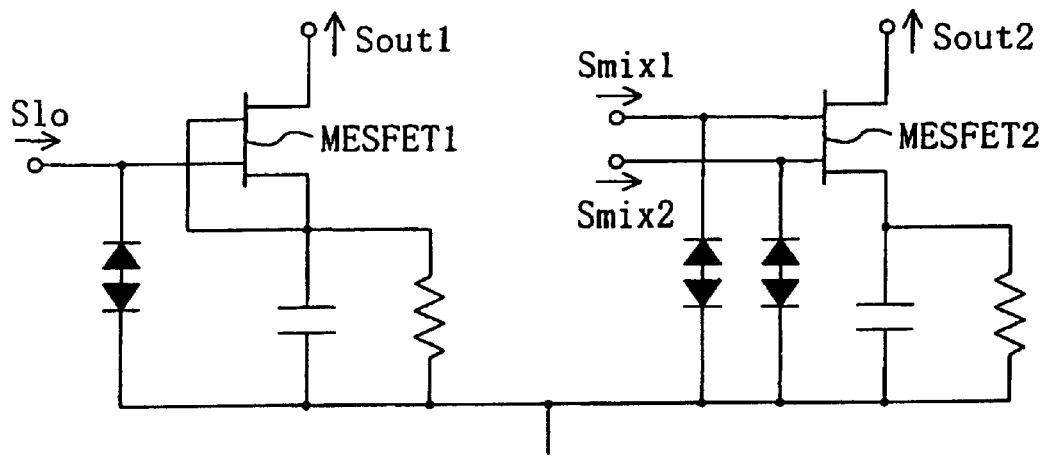
FIG. 22 is an electric circuit diagram showing an exemplary circuit configuration of a mixer shown in FIG. 3 or 21.

FIG. 22 is an electric circuit diagram showing an exemplary circuit structure of the mixer 134 shown in FIG. 3 or the mixer shown in FIG. 21. The example shown here has a local amplifier Specifically, a HEMT 1 for amplifying a local signal which receives a local signal Sl$_0$ at the gate and outputs a signal Sout1 obtained by amplifying the local signal Sl$_0$ and a HEMT 2 for amplifying a mixer signal which receives two signals Smix1 and Smix2 at the gate and outputs a signal Sout2 obtained by mixing and amplifying the signals Smix1 and Smix2 are disposed. It is possible to form the HEMT, the diode, and the capacitor in the circuit on a single InP substrate as shown in, e.g., FIG. 7 and thereby compose a single MMIC. Since a resistor element can be regarded as a part of the conductor film of the inductor, the resistor element can be formed extremely easily on the InP substrate, though it is not depicted in FIG. 7.

Figure 23:
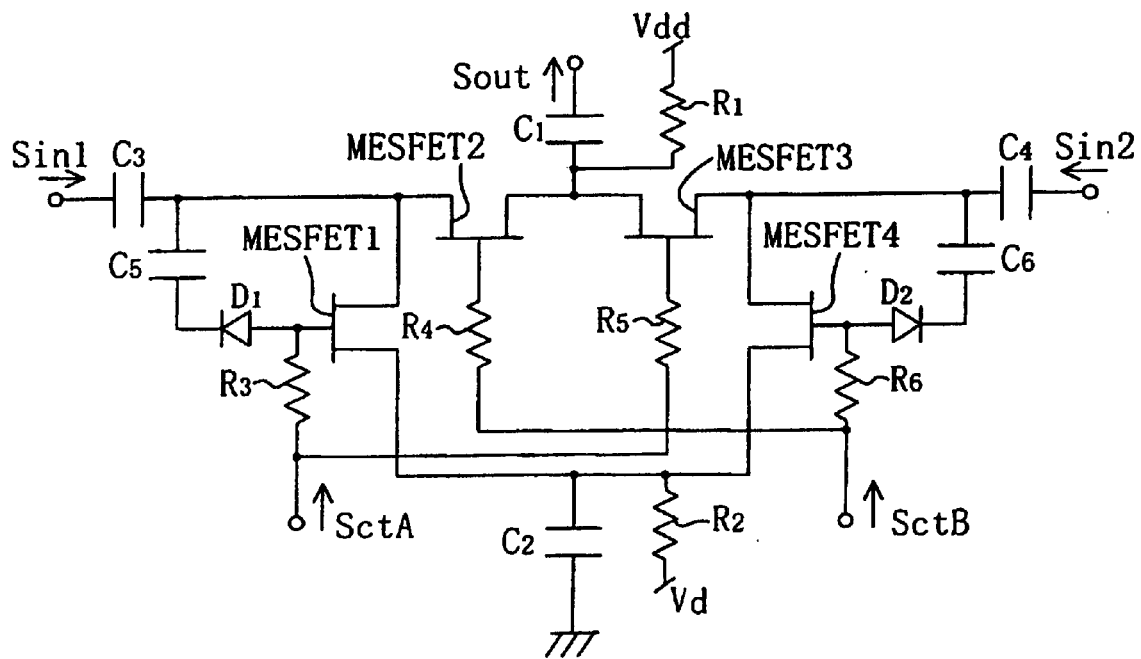
FIG. 23 is an electric circuit diagram showing an example of a high-output switch circuit containing an SPDT switch shown in FIG. 21 or a high-output switch circuit disposed in the switch shown in FIG. 3.

FIG. 23 is an electric circuit diagram showing an example of a high-output switch circuit containing a SPDT switch shown in FIG. 21 or a high-output switch circuit disposed in the switch shown in FIG. 3. In this example, the high-output switch circuit is so configured as to receive input signals Sin1 and Sin2 and output a signal Sout obtained by amplifying either of the input signals Sin1 and Sin2. It is possible to form output signal HEMTs 1 to 4, capacitors C1 to C6, diodes D1 and D2, and resistor elements R1 to R6 on a single SiC substrate and thereby compose an MMIC.

Variations

Figure 24:
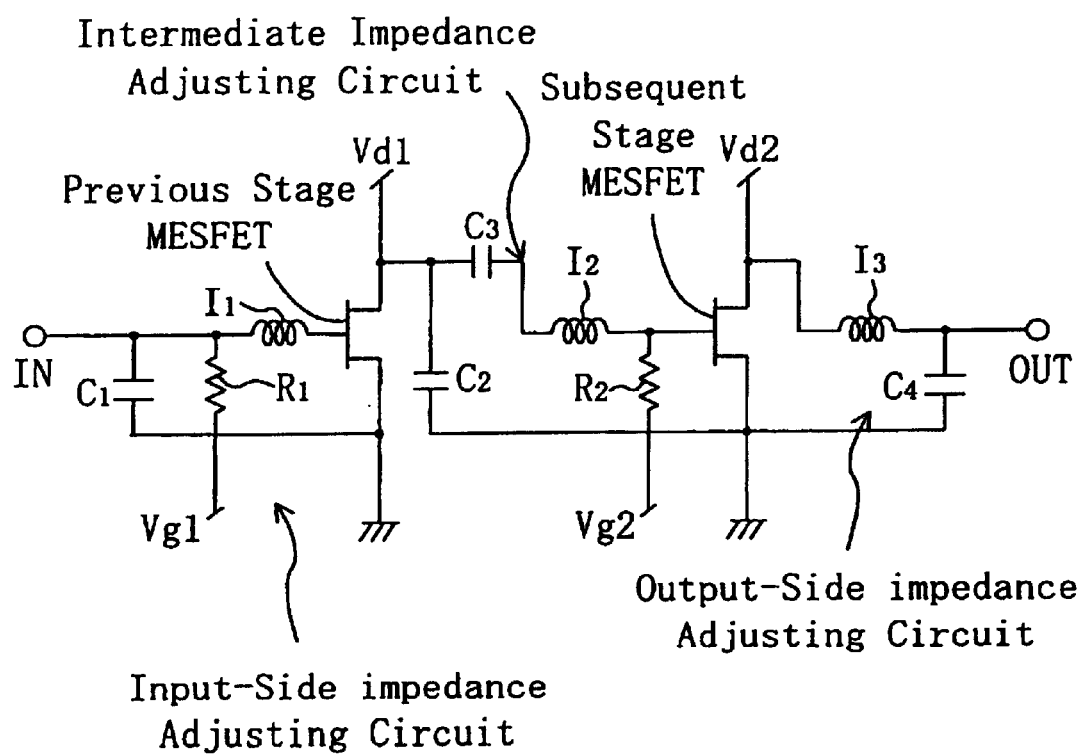
FIG. 24 shows another exemplary structure (first variation) of the main amplifier shown in FIG. 4 according to the embodiment.

FIG. 24 shows another exemplary structure (first variation) of the main amplifier shown in FIG. 4 according to the foregoing embodiment. The first variation comprises a previous-stage HEMT and a subsequent-stage HEMT which are amplifying transistors in two stages. On the input side of the previous-stage HEMT, there is provided an input-side impedance adjusting circuit having a capacitor C1, a resistor element R1, and an inductor I1. Between the previous-stage HEMT and the subsequent-stage HEMT, there is provided an intermediate impedance adjusting circuit having capacitors C2 and C3, a resistor element R2, and an inductor 12. On the output side of the subsequent-stage MESFET, there is provided an output-side impedance adjusting circuit containing a capacitor C4 and an inductor 13.

Each of the elements in the first variation can be composed of a HEMT 40, a capacitor 50, and an inductor 60 as shown in FIG. 7. Accordingly, an MMIC composed of the circuit shown in FIG. 24 which is provided on a single InP substrate can be obtained.

Figure 25:
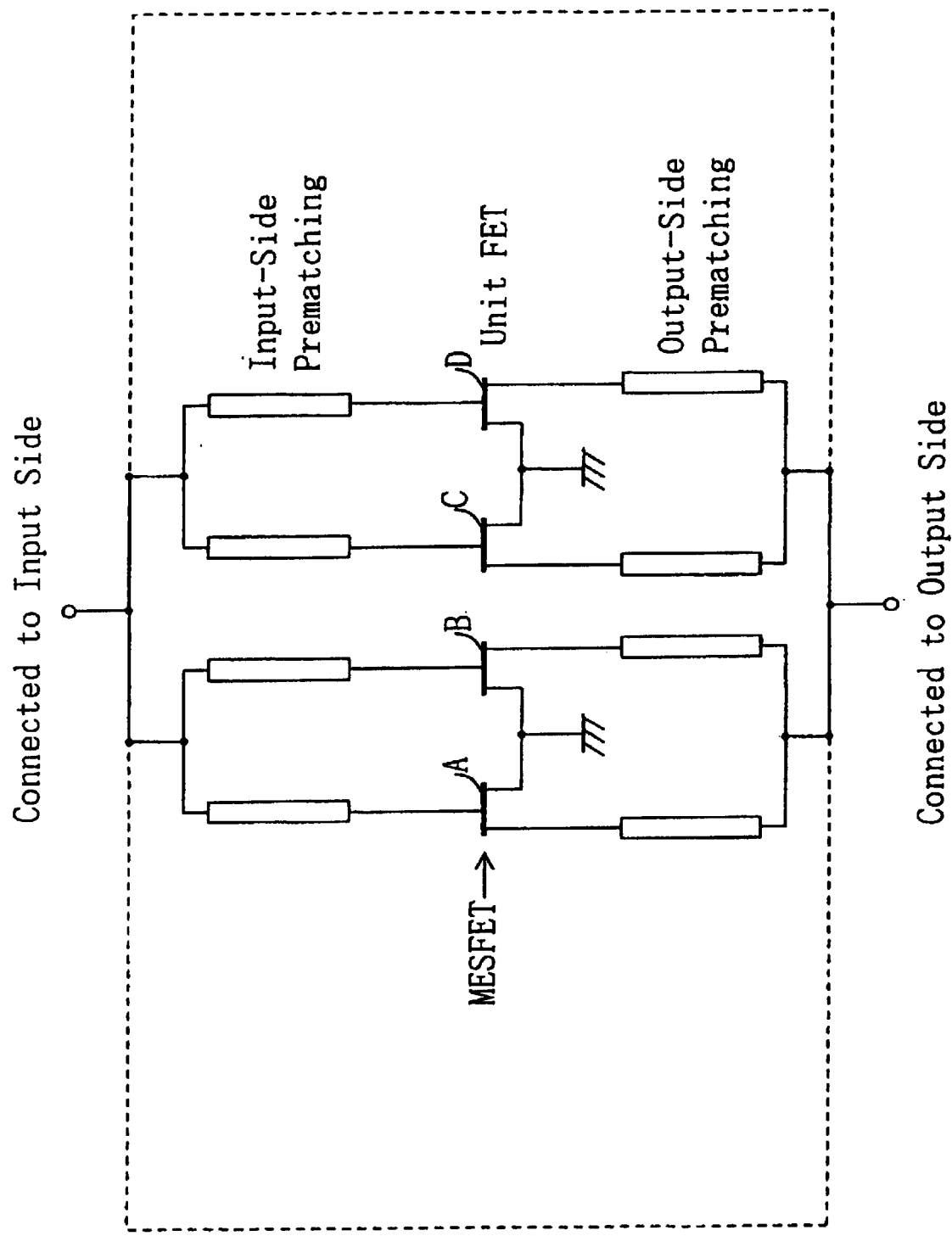
FIG. 25 shows still another exemplary structure (second variation) of the main amplifier shown in FIG. 4 according to the embodiment.

FIG. 25 shows still another exemplary structure (second variation) of the main amplifier shown in FIG. 4 according to the foregoing embodiment. The second variation has a structure in which four HEMTs A to D composing a differential amplifier are disposed in parallel. On the input side of each of the HEMTs A to D, there are provided an input-side prematching having a capacitor, a resistor element (not shown), and the like. On the output side of each of the HEMTs A to D, there are provided an output-side prematching having a capacitor, a resistor (not shown), and the like.

Each of the elements in the second variation can be composed of a HEMT 40, a capacitor 50, and an inductor 60 as shown in FIG. 7. Accordingly, an MMIC composed of the circuit shown in FIG. 25 which is provided on a single InP substrate can be obtained.

Figure 26:
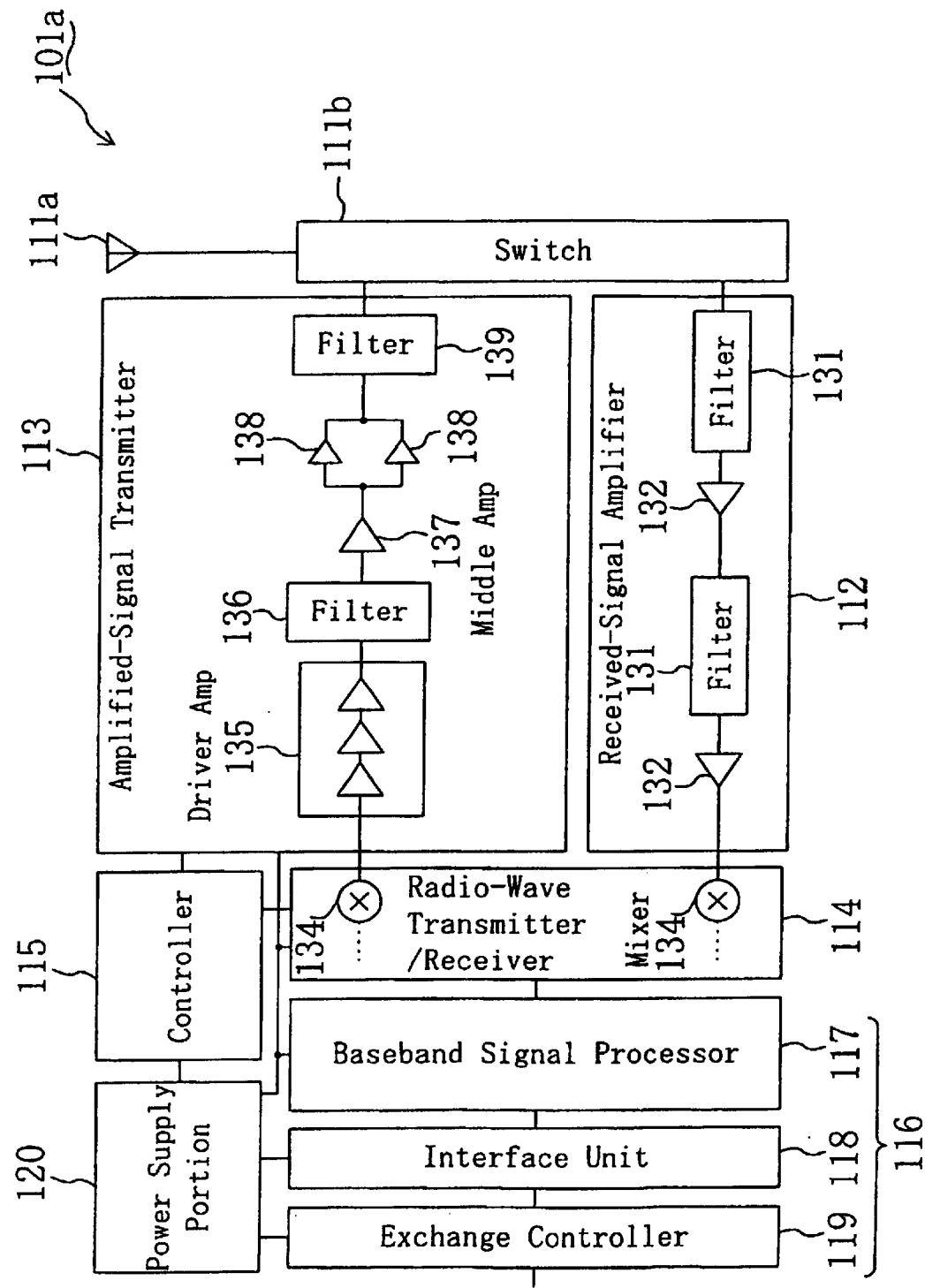
FIG. 26 is a block circuit diagram schematically showing a structure of a base station in a third variation in which two main amplifiers are disposed in parallel.

FIG. 26 is a block circuit diagram schematically showing the structure of the base station 101a in the third variation in which the two main amplifiers 138 are disposed in parallel. In this case also, the two main amplifiers can be composed of the circuit shown in FIG. 4.

If FIG. 4, FIG. 25, and FIG. 26 are compared, the amplifier circuits shown in FIG. 25 and FIG. 26 are preferably provided to achieve a highest amplification factor. However, the structure of the impedance matching circuit is more complicated as a larger number of HEMTs are provided. In the case of handling a signal in the RF range, particularly a signal on the GHz order, the process for achieving impedance matching (such as trimming) is complicated as a larger number of HEMTs are provided. Accordingly, the structure of the base station can be determined selectively depending on the use and scale thereof.

Other Embodiments

Although the foregoing embodiment has described the example in which the equipment for a communication system according to the present invention is applied to the base station, the terminal (mobile station), the home electrical appliance, and the like in a millimeter-wave communication system, the present invention is not limited to such an embodiment. Examples of the communication system include a mobile phone system, a car phone system, a PHS, and a PDA. By providing the equipment disposed in such a system with the HEMT, the diode, the MESFET, the capacitor, the inductor, and the like shown in FIG. 7, the same effects as achieved by the foregoing embodiment are achievable.

A large-current characteristic and a high breakdown voltage are attainable even if the HEMT shown in FIG. 17 is provided by using a semi-insulating substrate other than the InP substrate, e.g., a GaAs substrate, a GaN substrate, a Si substrate (a Si/SiGe (or SiGeC) hetero structure), or the like.

Each of the first and second active regions according to the present invention can be composed of any one material selected from the group consisting of InP, InGaAs, InAlAs, GaN, InGaP, and InGaSb. By providing an InGaSb layer in place of the InGaAs layer (17, 203, or 203'), in particular, a larger amount $\Delta Vg$ of band offset between the InGaSb layer and the multiple $\delta$-doped InAlAs layer (13, 204, 204', or 204") than in the foregoing embodiment is ensured so that the efficiency with which carriers are confined is further increased and a current driving ability is further increased.

If the multiple $\delta$-doped layer shown in FIG. 7 composed of the n-type doped layers (heavily doped layers) and the undoped layers (lightly doped layers) which are alternately stacked is provided in a device other then HEMT such as a heterojunction bipolar transistor, a semiconductor layer, or the like, a large current characteristic and a high breakdown voltage characteristic are achievable. In the heterojunction bipolar transistor, a base layer is normally composed of a material having a band gap smaller than those of an emitter layer and a collector layer. If the emitter layer or the collector layer in the structure is composed of the multiple $\delta$-doped layer, a bipolar transistor with a high breakdown voltage can be obtained.

Alternatively, if a gate insulating film and a gate electrode are stacked successively in layers on the InP layer 18 of FIG. 7, e.g., a MISFET comprising a multiple $\delta$-doped layer can be obtained, similarly to the SiC-MESFET disclosed in a PCT application (PCT/JP00/08156). The MISFET can achieve a high channel mobility and a high breakdown voltage, similarly to the SiC-MISFET disclosed in the foregoing PCT application. By the effects of the increased channel mobility and the increased breakdown voltage, a low ON-state resistance with a high breakdown voltage, a large current capacitance, and a high transconductance are achieved so that a MISFET having the advantages of low power consumption and a high gain is formed successfully. An RF characteristic is naturally improved by the increased channel mobility.

Although the foregoing embodiment has used the same material ($In_{0.52}Al_{0.48}As$ or $In_{0.53}Ga_{0.47}As$) to compose the $\delta$-doped layers (heavily doped layers) and the undoped layers (lightly doped layers) in the multiple $\delta$-doped layer, a hetero junction portion may also be formed therebetween by using different materials to compose the $\delta$-doped layers and the undoped layers.

Even if the InAlAs layer or the InGaAs layer is used, the composition ratio therebetween need not be $In_{0.52}Al_{0.48}As$ or $In_{0.53}Ga_{0.47}As$.

INDUSTRIAL APPLICABILITY

A semiconductor device according to the present invention is used for a device such as a Schottky diode, MESFET, FEMT, or the like mounted on electric equipment, particularly a device handling an RF signal, a power device, or equipment for a communication system.

What is claimed is:

1. A semiconductor device comprising:
   at least one active region stacked unit comprising a first active region disposed on a substrate and a second active region disposed on the first active region, at least a portion of the first active region functioning as a channel region, and the second active region including a material having a band gap different from a band gap of the first active region such that a band discontinuity occurs between the first and second active regions;
   a gate electrode disposed above the second active region located at the uppermost of said at least one active region stacked unit; and
   a pair of diffusion regions of high concentration impurities provided above the second active region located at the uppermost of said at least one active region stacked unit, and opposing each other with the gate electrode being interposed therebetween,
   wherein the second active region includes multiple $\delta$-doped layers made by alternately stacking a plurality of first semiconductor layers and a plurality of second semiconductor layers, each of the plurality of first semiconductor layers allows passage of carriers therethrough, each of the plurality of second semiconductor layers contains an impurity for carriers having concentration higher than that of each of the plurality of first semiconductor layers, and is smaller in film thickness than each of said plurality of first semiconductor layers, the plurality of first semiconductor layers and the plurality of second semiconductor layers have a same composition, and no channel region is provided above the second active region located at the uppermost of said at least one active region stacked unit.

2. The semiconductor device of claim 1, wherein the substrate is composed of InP and each of the first and second active regions is composed of any one material selected from the group consisting of InP, InGaAs, InAlAs, GaN, InGaP, and InGaSb.

3. The semiconductor device of claim 1, which functions as a HEMT, wherein:

the second semiconductor is composed of a material having a band gap larger than a band gap of a material composing the first semiconductor, a portion of the first active region adjacent an interface between the first and second active regions serves as a channel layer, and the second active region functions as a carrier supplying layer.

4. Equipment for a communication system handling an RF signal, the equipment being disposed in the communication system and having an active element formed by using a semiconductor, the active element comprising:

at least one active region stacked unite comprising a first active region and a second active region disposed on the first active region, at least a portion of the first active region functioning as a channel region, and the second active region includes a material having a band gap different from a band gap of the first active region such that a band discontinuity occurs between the first and second active regions;

a gate electrode provided above the second active region located at the uppermost of said at least one active region stacked unit; and a pair of diffusion regions of high concentration impurities provided above the second active region located at the uppermost of said at least one active region stacked unit, and opposing each other with the gate electrode being interposed therebetween, wherein the second active region comprises multiple δ-doped layers made by alternately stacking a plurality of first semiconductor layers and a plurality of second semiconductor layers;

each of the plurality of first semiconductor layers allows passage of carriers therethrough and each of the plurality of second semiconductor layers contains an impurity for carriers having concentration higher than that of each of the plurality of first semiconductor layers, and is smaller in film thickness than each of said plurality of first semiconductor layers, the plurality of first semiconductor layers and the plurality of second semiconductor layers have a same composition, and no channel region is provided above the second active region located at the uppermost of said at least one active region stacked unit.

5. The equipment for a communication system of claim 4, wherein a plurality of active region stacked bodies are stacked above the substrate.

6. The equipment for a communication system of claim 4, wherein the substrate is composed of InP and each of the first and second active regions is composed of any one material selected from the group consisting of InP, InGaAs, InAlAs, GaN, AlGaN, InGaP, and InGaSb.

7. The equipment for a communication system of claim 4, wherein a portion of the first active region of the active element adjacent an interface between the first and second active regions serves as a channel layer, the second active region functions as a carrier supplying layer, and the active element functions as a HEMT.

8. The equipment for a communication system of claim 5, further comprising another second active region provided directly below the first active region located at the bottom of said at least one active region stacked unit, wherein the another second active region comprises multiple δ-doped layers made by alternately stacking the plurality of first semiconductor layers and the plurality of second semiconductor layers, each of the plurality of first semiconductors layers allows passage of carriers therethrough, each of the plurality of second semiconductor layers contains an impurity for carriers having concentration higher than that of each of the plurality of first semiconductor layers, and is smaller in film thickness than each of said plurality of first semiconductor layers, and the plurality of first semiconductor layers and the plurality of second semiconductor layers have a same composition.

9. The equipment for a communication system of claim 4, wherein the active element is disposed in a transmitter.

10. The equipment for a communication system of claim 4, wherein the active element is disposed in a receiver.

11. The equipment for a communication system of claim 4, wherein the active element is disposed in a mobile data terminal.

12. The equipment for a communication system of claim 4, wherein the active element is disposed in a base station.

13. The equipment for a communication system of claim 4, which is a transmitting or receiving module constructed removably from an object under control.

14. The semiconductor device of claim 1, wherein a plurality of active region stacked bodies are stacked above the substrate.

15. The semiconductor device of claim 14, further comprising another second active region provided directly below the first active region located at the bottom of said at least one active region stacked unit, wherein the another second active region comprises multiple δ-doped layers made by alternately stacking the plurality of first semiconductor layers and the plurality of second semiconductor layers, each of the plurality of first semiconductor layers allows passage of carriers therethrough, each of the plurality of second semiconductor layers contains an impurity for carriers having concentration higher than that of each of the plurality of first semiconductor layers, and is smaller in film thickness than each of said plurality of first semiconductor layers, and the plurality of first semiconductor layers and the plurality of second semiconductor layers have a same composition.

* * * * *

UNITED STATES PATENT AND TRADEMARK OFFICE
CERTIFICATE OF CORRECTION

PATENT NO. : 6,903,383 B2
DATED : June 7, 2005
INVENTOR(S) : Toshiya Yokogawa et al.

It is certified that error appears in the above-identified patent and that said Letters Patent is hereby corrected as shown below:

<u>Title page,</u>
Insert Item:
-- [30]   Foreign Application Priority Data
     Nov. 21, 2000      (JP)............2000-354038 --.
Item [56], References Cited, U.S. PATENT DOCUMENTS, add the following:
-- 3,626,328          *        12/1971     Esaki et al.              331/107G
   5,633,516          *        5/1997      Mishima et al.            257190
   5,635,735          *        6/1997      Miyamoto et al.           257/192
   5,751,029          *        5/1998      Matsushita et al.         257/194
   6,100,542          *        8/2000      Kohara et al.             257/20
   6,194,747 B1       *        2/2001      Onda                      257/192
   6,242,766 B1                6/2001      Tateno
   6,576,505 B2       *        6/2003      Borghs et al.             438/167
   2003/0006415 A1    *        1/2003      Yokogawa et al.           257/77 --;
OTHER PUBLICATIONS,
"Xu D. et al." reference, change "IEEE Transations…" to -- IEEE Transactions… --.

Signed and Sealed this

Twenty-first Day of February, 2006

JON W. DUDAS
*Director of the United States Patent and Trademark Office*